United States Patent
Betsui et al.

(10) Patent No.: US 10,446,531 B2
(45) Date of Patent: Oct. 15, 2019

(54) ELECTRONIC DEVICE AND SEMICONDUCTOR DEVICE

(71) Applicant: Renesas Electronics Corporation, Tokyo (JP)

(72) Inventors: Takafumi Betsui, Tokyo (JP); Motoo Suwa, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 129 days.

(21) Appl. No.: 15/514,110

(22) PCT Filed: Sep. 26, 2014

(86) PCT No.: PCT/JP2014/075743
§ 371 (c)(1),
(2) Date: Mar. 24, 2017

(87) PCT Pub. No.: WO2016/046987
PCT Pub. Date: Mar. 31, 2016

(65) Prior Publication Data
US 2018/0204827 A1 Jul. 19, 2018

(51) Int. Cl.
*H01L 25/18* (2006.01)
*H01L 21/66* (2006.01)
(Continued)

(52) U.S. Cl.
CPC .............. *H01L 25/18* (2013.01); *G11C 5/025* (2013.01); *H01L 22/14* (2013.01); *H01L 24/16* (2013.01);
(Continued)

(58) Field of Classification Search
CPC ....... H01L 25/18; H01L 25/112; H01L 25/16; H01L 25/162; H01L 25/0655;
(Continued)

(56) References Cited

U.S. PATENT DOCUMENTS 7,745,915 B2 * 6/2010 Suwa .................. H01L 23/50
257/678
2003/0081389 A1 * 5/2003 Nair .................... H01L 25/16
361/764
(Continued)

FOREIGN PATENT DOCUMENTS

JP 06-151639 A 5/1994
JP 2006-237385 A 9/2006
(Continued)

OTHER PUBLICATIONS

Communication dated Oct. 31, 2017 from the Japanese Patent Office in counterpart application No. 2016-549886.
(Continued)

*Primary Examiner* — Tuan A Hoang
(74) *Attorney, Agent, or Firm* — Sughrue Mion, PLLC

(57) ABSTRACT

An electronic device includes a first wiring substrate and a semiconductor device mounted on the first wiring substrate. A plurality of first semiconductor chips and a second semiconductor chip which controls each of the plurality of first semiconductor chips are mounted side by side on a second wiring substrate of the semiconductor device. Further, the plurality of first semiconductor chips are mounted between a first substrate side of the wiring substrate and an extension line of a first chip side of the second semiconductor chip. Furthermore, the first wiring substrate includes a first power line which supplies a first power potential to each of the plurality of first semiconductor chips and a second power line which supplies a second power potential to the second semiconductor chip and has a width larger than that of the first power line. Also, the second power line intersects the first substrate side of the second wiring substrate and extends from a side of the first substrate side of the second (Continued)

wiring substrate toward the second semiconductor chip when seen in a plan view.

18 Claims, 25 Drawing Sheets

(51) Int. Cl.
| | | |
|---|---|---|
| *H01L 23/00* | (2006.01) | |
| *H01L 25/16* | (2006.01) | |
| *H01L 25/00* | (2006.01) | |
| *G11C 5/02* | (2006.01) | |
| *H01L 23/498* | (2006.01) | |
| *H01L 23/538* | (2006.01) | |
| *H01L 25/065* | (2006.01) | |
| *H01L 23/50* | (2006.01) | |

(52) U.S. Cl.
CPC ............. *H01L 24/17* (2013.01); *H01L 24/81* (2013.01); *H01L 25/16* (2013.01); *H01L 25/50* (2013.01); *H01L 23/49816* (2013.01); *H01L 23/50* (2013.01); *H01L 23/5383* (2013.01); *H01L 23/5384* (2013.01); *H01L 23/5385* (2013.01); *H01L 23/5386* (2013.01); *H01L 25/0655* (2013.01); *H01L 2224/13007* (2013.01); *H01L 2224/16014* (2013.01); *H01L 2224/16225* (2013.01); *H01L 2224/16227* (2013.01); *H01L 2224/1713* (2013.01); *H01L 2924/1431* (2013.01); *H01L 2924/1436* (2013.01); *H01L 2924/15174* (2013.01); *H01L 2924/15311* (2013.01); *H01L 2924/19041* (2013.01); *H01L 2924/19102* (2013.01)

(58) Field of Classification Search
CPC . H01L 23/5385; H01L 23/5386; H01L 25/10; H01L 25/105; H01L 23/5286
See application file for complete search history.

(56) References Cited

U.S. PATENT DOCUMENTS

| | | | |
|---|---|---|---|
| 2006/0192282 A1 | 8/2006 | Suwa et al. | |
| 2007/0192559 A1 | 8/2007 | Betsui et al. | |
| 2007/0194433 A1* | 8/2007 | Suwa | H01L 23/49838 257/700 |
| 2008/0083937 A1* | 4/2008 | Nomiyama | H01L 23/5286 257/211 |
| 2010/0091537 A1* | 4/2010 | Best | G11C 5/02 365/51 |
| 2010/0264906 A1* | 10/2010 | Shamir | G01R 15/186 324/127 |
| 2011/0042795 A1* | 2/2011 | Knickerbocker | H01L 21/486 257/686 |

FOREIGN PATENT DOCUMENTS

| | | |
|---|---|---|
| JP | 2007-213375 A | 8/2007 |
| JP | 2009-260195 A | 11/2009 |
| WO | 2005/091367 A1 | 9/2005 |

OTHER PUBLICATIONS

International Search Report of PCT/JP2014/075743 filed Jan. 13, 2015.
Communication dated Dec. 19, 2018, from Taiwanese Intellectual Property Office in counterpart application No. 104130342.

* cited by examiner

ELECTRONIC DEVICE AND SEMICONDUCTOR DEVICE

TECHNICAL FIELD

The present invention relates to, for example, a semiconductor device in which a plurality of semiconductor chips are mounted side by side on a wiring substrate and an electronic device in which the semiconductor device is mounted.

BACKGROUND ART

Japanese Patent Application Laid-Open Publication No. H6-151639 (Patent Document 1) discloses a semiconductor device in which a ground pin and a power pin among a plurality of pins (terminals) of a wiring substrate are continuously disposed in series from an inside to an outside.

Further, Japanese Patent Application Laid-Open Publication No. 2006-237385 (Patent Document 2) and Japanese Patent Application Laid-Open Publication No. 2007-213375 (Patent Document 3) disclose semiconductor devices in which a plurality of memory chips and a data processing chip which controls the plurality of memory chips are mounted side by side on a wiring substrate.

RELATED ART DOCUMENTS

Patent Documents

Patent Document 1: Japanese Patent Application Laid-Open Publication No. H6-151639

Patent Document 2: Japanese Patent Application Laid-Open Publication No. 2006-237385

Patent Document 3: Japanese Patent Application Laid-Open Publication No. 2007-213375

SUMMARY OF THE INVENTION

Problems to be Solved by the Invention

There is a semiconductor device in which a plurality of semiconductor chips are disposed side by side on a wiring substrate and the plurality of semiconductor chips are electrically connected with each other through the wiring substrate. In order to improve the performance of such a semiconductor device, a technique of increasing the amount of data that the semiconductor device can process has been demanded.

A technique of improving a signal transmission rate is necessary for increasing the amount of data that the semiconductor device processes. Further, since a current value to be supplied to an arithmetic processing circuit is increased for increasing the amount of data that the semiconductor device processes, a technique of efficiently supplying a large current to the arithmetic processing circuit is necessary.

Other problems and novel features will become apparent from the descriptions of the present specification and the accompanying drawings.

Means for Solving the Problems

An electronic device according to one embodiment includes a first wiring substrate and a semiconductor device which is mounted on the first wiring substrate. A plurality of first semiconductor chips and a second semiconductor chip which controls each of the plurality of first semiconductor chips are mounted side by side on a second wiring substrate of the semiconductor device. Further, the plurality of first semiconductor chips are mounted between a first substrate side of the second wiring substrate and an extension line of a first chip side of the second semiconductor chip. Furthermore, the first wiring substrate includes a first power line which supplies a first power potential to each of the plurality of first semiconductor chips and a second power line which supplies a second power potential to the second semiconductor chip. Still further, the second power line intersects the first substrate side of the second wiring substrate and extends from a side of the first substrate side of the second wiring substrate toward a region which overlaps the second semiconductor chip when seen in a plan view.

Effects of the Invention

According to the above embodiment, it is possible to improve performance of an electronic device in which a semiconductor device in which a plurality of semiconductor chips are electrically connected with each other through a wiring substrate is mounted.

BRIEF DESCRIPTIONS OF THE DRAWINGS

Figure 1:
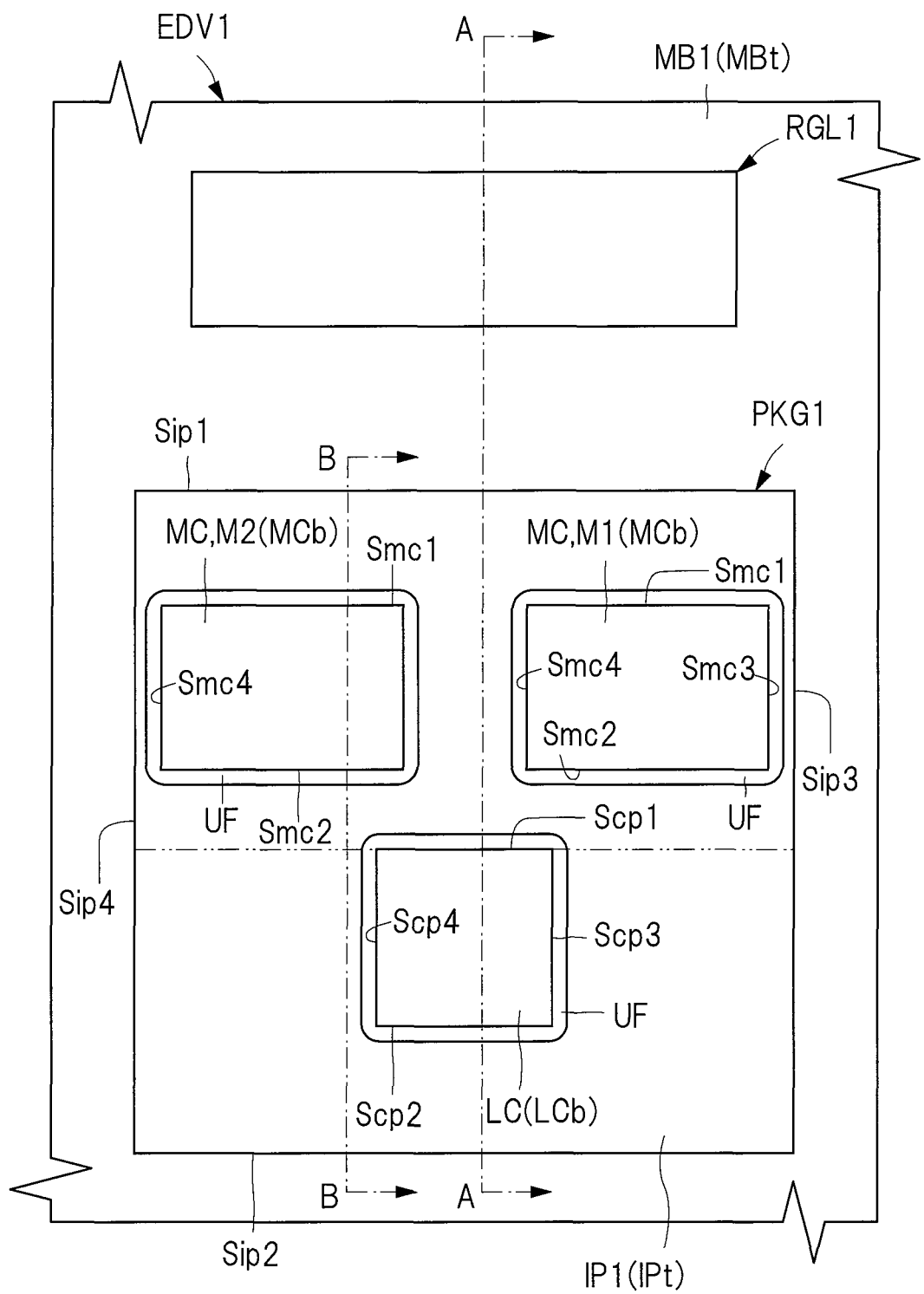
FIG. 1 is an enlarged plan view illustrating a configuration example of an electronic device including a semiconductor device according to one embodiment.

DETAILED DESCRIPTION OF PREFERRED EMBODIMENTS (Description of Format, Basic Terms, and Usage in the Present Application)

In this application, embodiments will be described in a plurality of sections or the like when required as a matter of convenience. However, these sections are not independent and irrelevant to each other unless otherwise stated, and the one relates to the entire or a part of the other as a detail, a modified example or the like regardless of the order of descriptions. In addition, the description of the same or similar portions is not repeated in principle. Further, the components in the embodiments are not always indispensable unless otherwise stated or except for the case where the components are logically limited to that number and the components are apparently indispensable from the context.

Similarly, in the description of the embodiments, the phrase "X made of A" for a material, a composition or the like is not intended to exclude those containing elements other than A unless otherwise specified or except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise specified clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar components are denoted by the same or similar reference character or reference number, and the descriptions thereof are not repeated in principle.

In addition, in the attached drawings, hatching may be omitted even in cross sections in the case where the hatching makes the drawings complicated on the contrary or discrimination from void is clear. In relation to this, when it is clear from the description or the like, an outline of a background may be omitted even in a planarly closed hole. Furthermore, even in the cases other than the cross section, hatching or dot patterns may be applied so as to clarify non-voids or clarify a boundary of regions.

Embodiment

In the present embodiment, a semiconductor device which is mounted inside a car navigation device and a module (electronic device) which includes the semiconductor device will be described as examples of a semiconductor device in which a plurality of semiconductor chips are electrically connected through a wiring substrate and an electronic device in which the semiconductor device is mounted.

The car navigation device which is described as an example in the present embodiment is an electronic equipment which is mounted in a car. In recent years, various functions (systems) have been added in one device to make car navigation devices highly functional. For example, some car navigation devices have various functions (systems) such as a music playback system and a movie playback system in addition to a car navigation system which displays a current position of a car and navigates a route to a destination. Further, from a viewpoint of improvement of performance of each of the various systems, it is preferable to increase the amount of data that each system can process in a unit time.

In the configuration of the electronic device provided with a plurality of systems described above, a plurality of semiconductor devices of different functions (e.g. control semiconductor device and storage semiconductor device) are mounted on a mother board, and the plurality of semiconductor devices are electrically connected through wirings of the mother board in many cases. However, taking into account an increase in the amount of data to be processed in a unit time or improvement in a data transfer rate, it is difficult to improve electrical characteristics in the case of the configuration in which a plurality of semiconductor devices are connected through wirings of a mother board.

Hence, the inventors of the present invention have studied a configuration where a plurality of semiconductor chips are mounted in one semiconductor device and the plurality of semiconductor chips are electrically connected through a wiring substrate serving as an interposer. Namely, a semiconductor device PKG1 (see FIG. 1) described below is a multi-chip module (MCM) which includes a plurality of semiconductor chips. Further, the semiconductor device PKG1 is a SiP (System in Package) in which systems are formed in one semiconductor package. A wiring substrate IP1 (see FIG. 2) of the semiconductor device PKG1 has a smaller planar area and makes it possible to form wirings at a high degree of processing precision compared to a wiring substrate MB1 serving as a mother board. Therefore, when a plurality of semiconductor chips are electrically connected, it is possible to acquire high electrical characteristics.

However, it has been found that, when a plurality of systems are fabricated in one semiconductor package and electrical characteristics are improved like in the semiconductor device PKG1, it is necessary to efficiently dispose paths for supplying power for driving the plurality of systems or paths for receiving an input of signal currents and outputting signal currents from and to the semiconductor device PKG1.

For example, a large current exceeding 5 A (ampere) is necessary to drive a circuit which forms graphics and moving images in some cases. When a cross-sectional area of a power supply path becomes small due to increase of wiring density, impedance becomes high. Then, when a large current flows in the power supply path of high impedance, the voltage drop amount increases. Further, there is a concern that, when a margin of a power potential for operating a circuit is small, the circuit does not operate due to the voltage drop.

Furthermore, there is a concern that, when a resistance value of a drive voltage supply path is high, a temperature of the semiconductor device PKG1 rises and a circuit operation becomes unstable. Still further, when power supply paths in which a large current flows as described above and high speed signal transmission paths of 1.6 Gbps (Giga bit per second) or more are both disposed closely, it is necessary to take into account a noise countermeasure for the high speed signal transmission path. In particular, when a signal is transmitted by using a differential pair or when a bus width is increased to increase the signal transmission amount per unit time, the number of signal transmission paths increases. Hence, a technique of efficiently forming wiring paths in a wiring substrate of an imposer having a smaller planar area than that of a mother board is necessary.

Hereinafter, a configuration example of the electronic device according to the present embodiment will be described in order of a configuration of the electronic device and the semiconductor device of the electronic device.

<Electronic Device>

Figure 2:
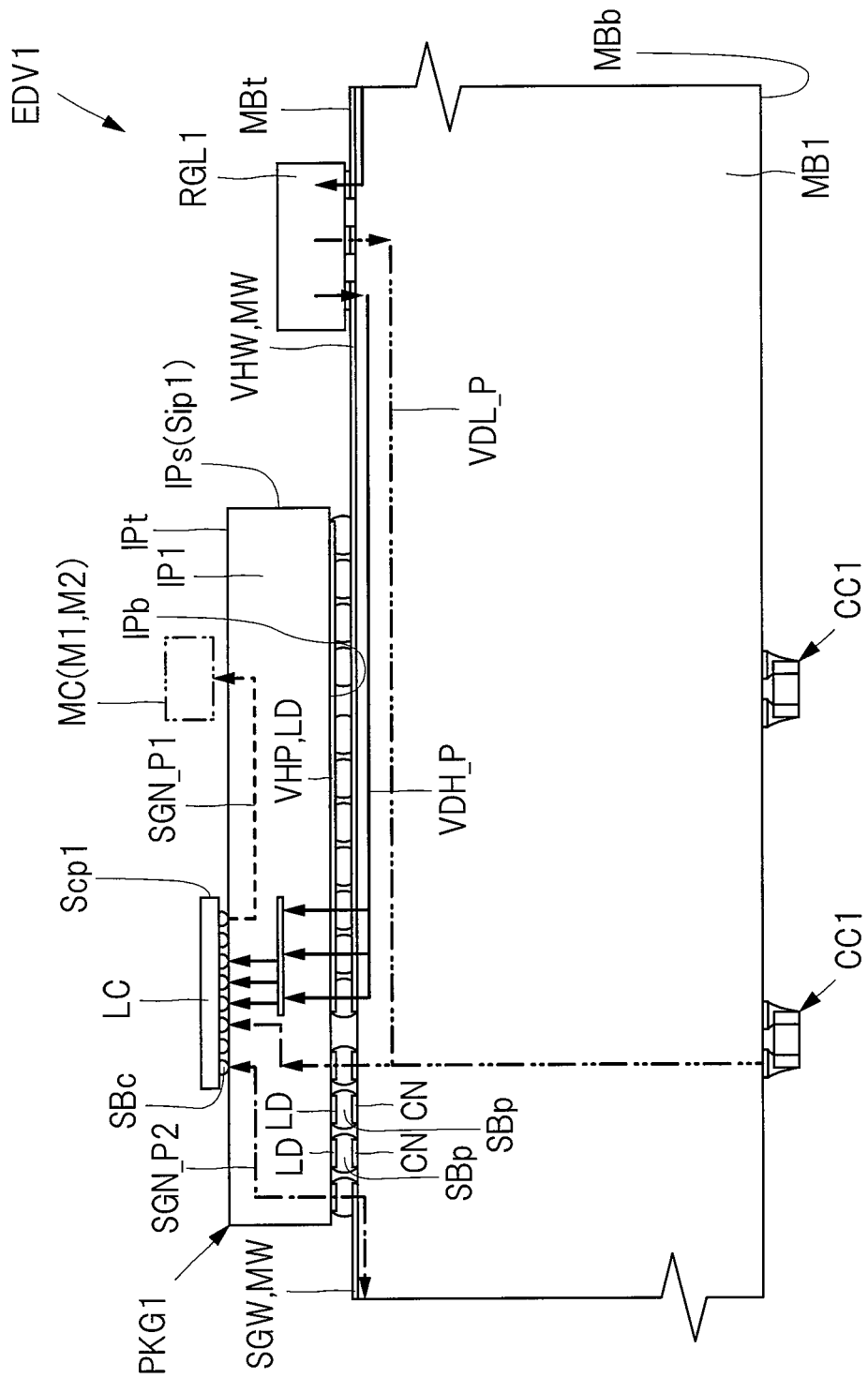
FIG. 2 is an enlarged sectional view along a line A-A in FIG. 1.
Figure 3:
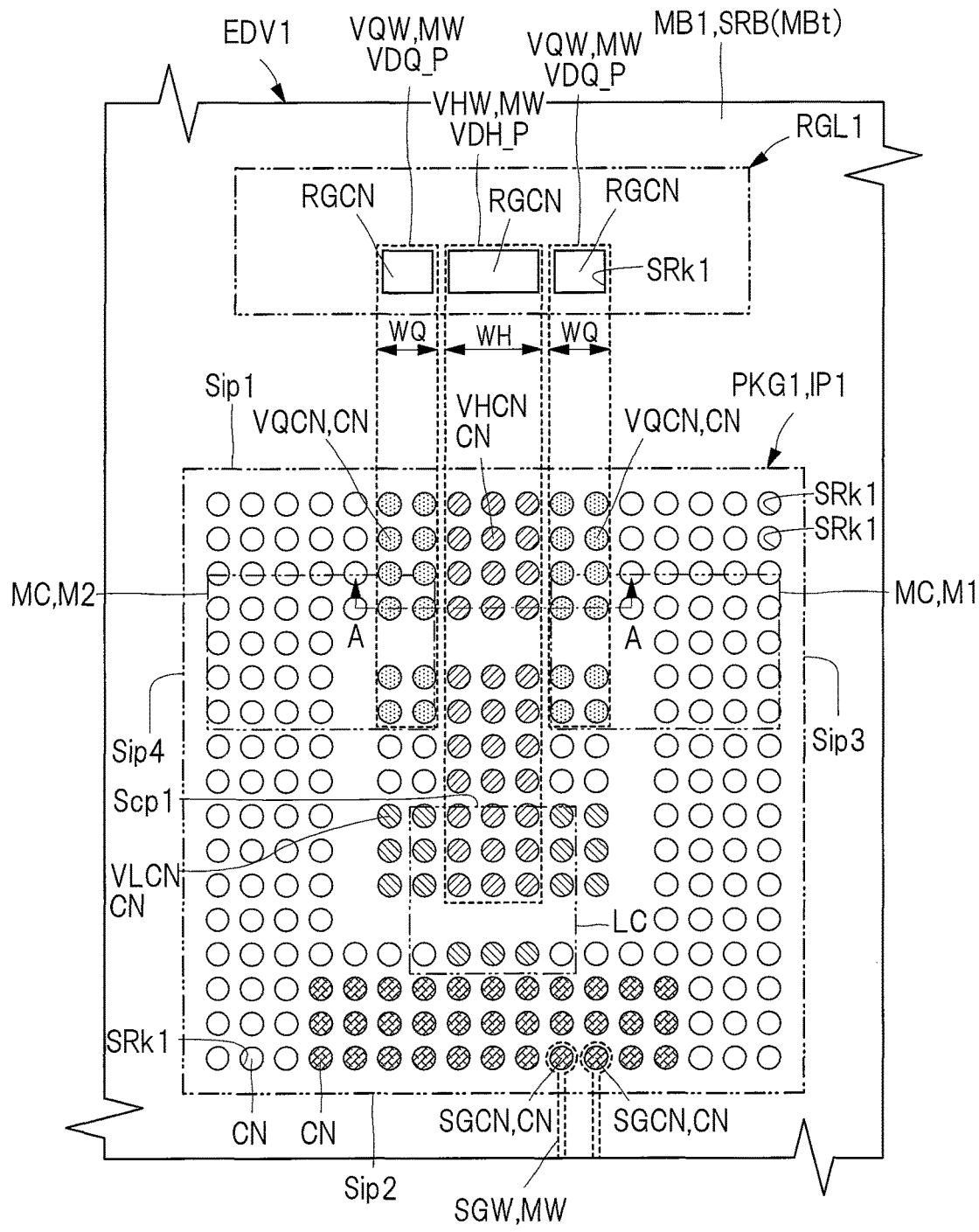
FIG. 3 is an enlarged plan view illustrating an upper surface of a mother board illustrated in FIG. 1.
Figure 4:
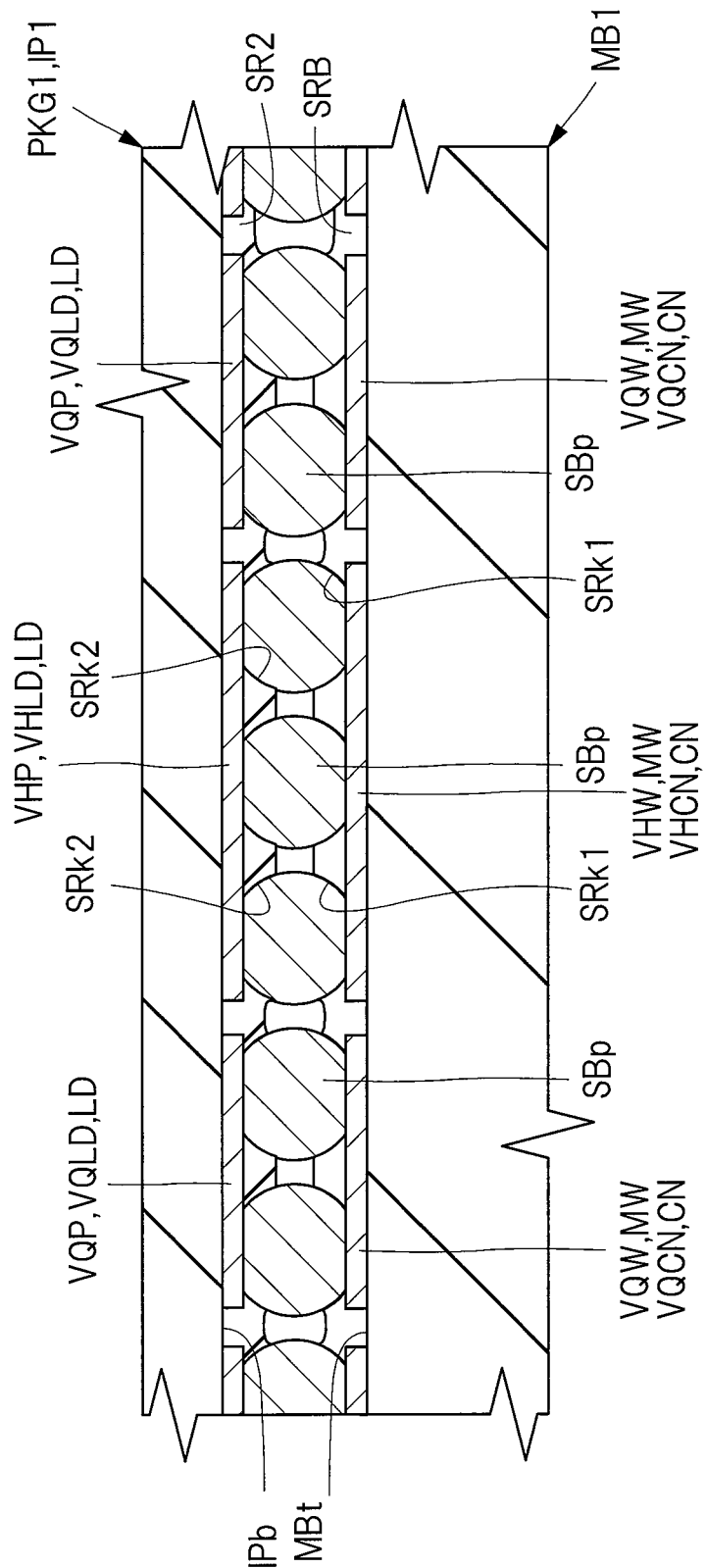
FIG. 4 is an enlarged sectional view along a line A-A in FIG. 3.

First, the configuration example of the electronic device according to the present embodiment will be described. FIG. 1 is an enlarged plan view illustrating the configuration example of the electronic device according to the present embodiment. Also, FIG. 2 is an enlarged sectional view along a line A-A in FIG. 1. Further, FIG. 3 is an enlarged plan view illustrating an upper surface of a mother board illustrated in FIG. 1. Furthermore, FIG. 4 is an enlarged sectional view along a line A-A in FIG. 3, and illustrates periphery of power supply solder balls in an enlarged manner.

Note that FIG. 2 is a sectional view, but does not illustrate hatchings so as to make an example of an electrical connection relationship between components of an electronic device EDV1 easy to see. Also, FIG. 3 illustrates part of a plurality of wirings MW and terminals (packaging substrate terminals) CN covered by an insulation film SRB which covers an upper surface of the wiring substrate MB1. Further, FIG. 3 is a plan view, but different patterns are applied to the plurality of terminals CN in accordance with types of flowing currents, and meaning of each pattern is indicated by a symbol next to an explanatory note.

The electronic device (electronic equipment) EDV1 illustrated in FIG. 1 includes the wiring substrate (a mother board, a packaging substrate) MB1, the semiconductor device PKG1 mounted on the wiring substrate MB1, and a power supply device (regulator) RGL1 mounted on the wiring substrate MB1. Further, in the example illustrated in FIG. 2, a plurality of electronic parts such as capacitors CC1 are mounted on the wiring substrate MB1 in addition to the semiconductor device PKG1 and the power supply device RGL1.

The power supply device RGL1 mounted on the wiring substrate MB1 is a power supply part which supplies power to each of a plurality of electronic parts of the electronic device EDV1. The power supply device RGL1 includes, for example, a power conversion circuit, and converts power input from an external power supply provided outside the electronic device EDV1 into a voltage value and a current value corresponding to an operating voltage and an operating current of various circuits of the electronic device EDV1. The power converted by the power supply device RGL1 is supplied to each of a plurality of circuits (circuits of the electronic parts) of the electronic device EDV1 through the wirings MW of the wiring substrate MB1.

In addition, the wiring substrate MB1 of the electronic device EDV1 includes an upper surface (a surface and a semiconductor device mounting surface) MBt which is a mounting surface of the semiconductor device PKG1 and a lower surface (a surface and a back surface) MBb on an opposite side of the upper surface MBt. The wiring substrate MB1 is a substrate on which a plurality of electronic parts including the semiconductor device PKG1 are mounted and are electrically connected to form a module, and is required to have the strength capable of supporting the plurality of electronic parts. Hence, the thickness of the wiring substrate MB1 is larger (thicker) than the thickness of the wiring substrate IP1 of the semiconductor device PKG1.

For example, in the example in FIG. 2, the thickness of the wiring substrate MB1 is 1.6 mm. Meanwhile, the thickness of the wiring substrate IP1 is smaller than the thickness of the wiring substrate MB1, and is 1.2 mm. Note that the thickness of each substrate is not limited to the above value, and the wiring substrate MB1 having the thickness of, for example, approximately 1.0 mm to 2.0 mm and the wiring substrate IP1 having the thickness of, for example, approximately 0.2 mm to 1.5 mm may be used. Further, the thickness of the wiring substrate MB1 corresponds to a distance from one surface to the other surface of the upper surface MBt and the lower surface MBb. Furthermore, the thickness of the wiring substrate IP1 corresponds to a distance from one surface to the other surface of an upper surface IPt and a lower surface IPb.

Also, the wiring substrate MB1 includes a base material made of an insulation material such as a prepreg material obtained by, for example, impregnating glass cloth with epoxy resin. In the example illustrated in FIG. 2, the wiring substrate MB1 is a multilayer substrate (laminated substrate) formed by alternately laminating a plurality of insulation layers made of a prepreg and a plurality of wiring layers made of conductor films such as copper foils. Note that the wiring substrate IP1 may also include a base material (core material) made of a prepreg material, but the wiring substrate MB1 needs a prepreg material which is relatively thicker than the base material of the wiring substrate IP1. As described above, in the present embodiment, the prepreg material is used as the insulation layers constituting each of the wiring substrates MB1 and IP1, and it is thus possible to improve the strength of the wiring substrates. Note that, when the thickness of the wiring substrate is large, i.e., when the thickness of each insulation layer is large, the insulation layers are not limited to those made of the prepreg material, and may be made of an insulation material made of epoxy resin only.

Further, as illustrated in FIG. 2, the wiring substrate MB1 includes a plurality of wirings (packaging substrate wirings, mother board wirings) MW. The wiring substrate MB1 is a multilayer wiring substrate including a plurality of wiring layers, and the plurality of wirings MW are formed in each of the plurality of wiring layers. As illustrated in FIG. 3, the plurality of wirings MW include a power line VHW which supplies a power potential to a logic chip (semiconductor chip) LC among a plurality of semiconductor chips of the semiconductor device PKG1 and a power line VQW which supplies a power potential to a memory chip (semiconductor chip) MC among the plurality of semiconductor chips. The plurality of wirings MW further include a signal line SGW which transmits or receives an electrical signal to and from the logic chip LC. Note that a large number of signal lines SGW are formed in the wiring substrate MB1, but two of the signal lines SGW are illustrated in FIG. 3 for ease of viewing.

Further, the wiring substrate MB1 includes a plurality of terminals CN formed on a side of the upper surface MBt. The plurality of terminals CN are packaging terminals which electrically connect the semiconductor device PKG1 and the wiring substrate MB1. As illustrated in FIG. 3, the plurality of terminals CN include a terminal VHCN which supplies a power potential to the logic chip (semiconductor chip) LC among the plurality of semiconductor chips of the semiconductor device PKG1 and a terminal VQCN which supplies a power potential to the memory chip (semiconductor chip) MC among the plurality of semiconductor chips. The plurality of terminals CN further include a terminal SGCN which transmits or receives an electrical signal to and from the logic chip LC.

Also, the plurality of terminals CN are conductor patterns formed on an uppermost layer (first layer) of the plurality of wiring layers of the wiring substrate MB1. More specifically, as illustrated in FIG. 4, the conductor patterns formed on the uppermost layer are covered by the insulation film SRB formed to cover the upper surface MBt of the wiring substrate MB1. Further, a plurality of openings SRk1 are formed in the insulation film SRB, and part of the conductor patterns formed on the uppermost layer are exposed through each of the plurality of openings SRk1.

Also, the plurality of conductor patterns constituting the terminals CN illustrated in FIG. 3 include individual conductor patterns which are electrically insulated from the other terminals CN and formed independently for each terminal CN. For example, the signal terminal SGCN electrically connected with the signal line SGW is electrically insulated from the neighboring terminals CN. By electrically insulating the neighboring signal terminals SGCN in this manner, it is possible to cause different signal currents to flow in respective signal transmission paths.

Further, the plurality of conductor patterns constituting the terminals CN illustrated in FIG. 3 include belt-like conductor films which form the wirings MW like the power line VHW and the power line VQW. When the belt-like conductor films are used as part of the terminals CN as described above, the plurality of openings SRk1 are formed on one belt-like conductor film. In the case of the power line VHW, for example, the plurality of openings SRk1 are formed at positions which overlap the one belt-like power line VHW in a thickness direction. Each of the plurality of openings SRk1 functions as the terminal VHCN which is a packaging terminal for connecting the power line VHW. By providing the plurality of terminals CN by the use of one power line VHW in this manner, it is possible to reduce resistance in the power potential supply paths. Further, as a result of the reduction of resistance in the power potential supply paths, it is possible to suppress a rise in the temperature of the electronic device EDV1 (see FIG. 1) during driving, and it is thus possible to stabilize the circuit operation.

Also, the plurality of openings SRk1 are formed in the insulation film SRB at positions which overlap the power supply device RGL1 in the thickness direction, and terminals RGCN for connecting the power supply device RGL1 are exposed through the plurality of openings SRk1. Conductor patterns constituting the terminals RGCN are part of the belt-like conductor patterns which form the power line VHW or the power line VQW like the conductor patterns constituting the terminals VHCN and VQCN. By using part of the power wirings MW as the conductor patterns constituting the power supply terminals CN and the terminal RGCN in this manner, it is possible to route the power line VHW and the power line VQW in the wiring layer of the uppermost layer of the wiring substrate MB1 as illustrated in FIG. 4. In other words, in the present embodiment, each of the power line VHW and the power line VQW is electrically connected with the semiconductor device PKG1 without passing through wiring layers formed in the lower layers below the uppermost layer. Note that, as a modified example of the present embodiment, the power lines may pass through wiring layers formed in the lower layers below the uppermost layer.

<Outline of Semiconductor Device>

Figure 5:
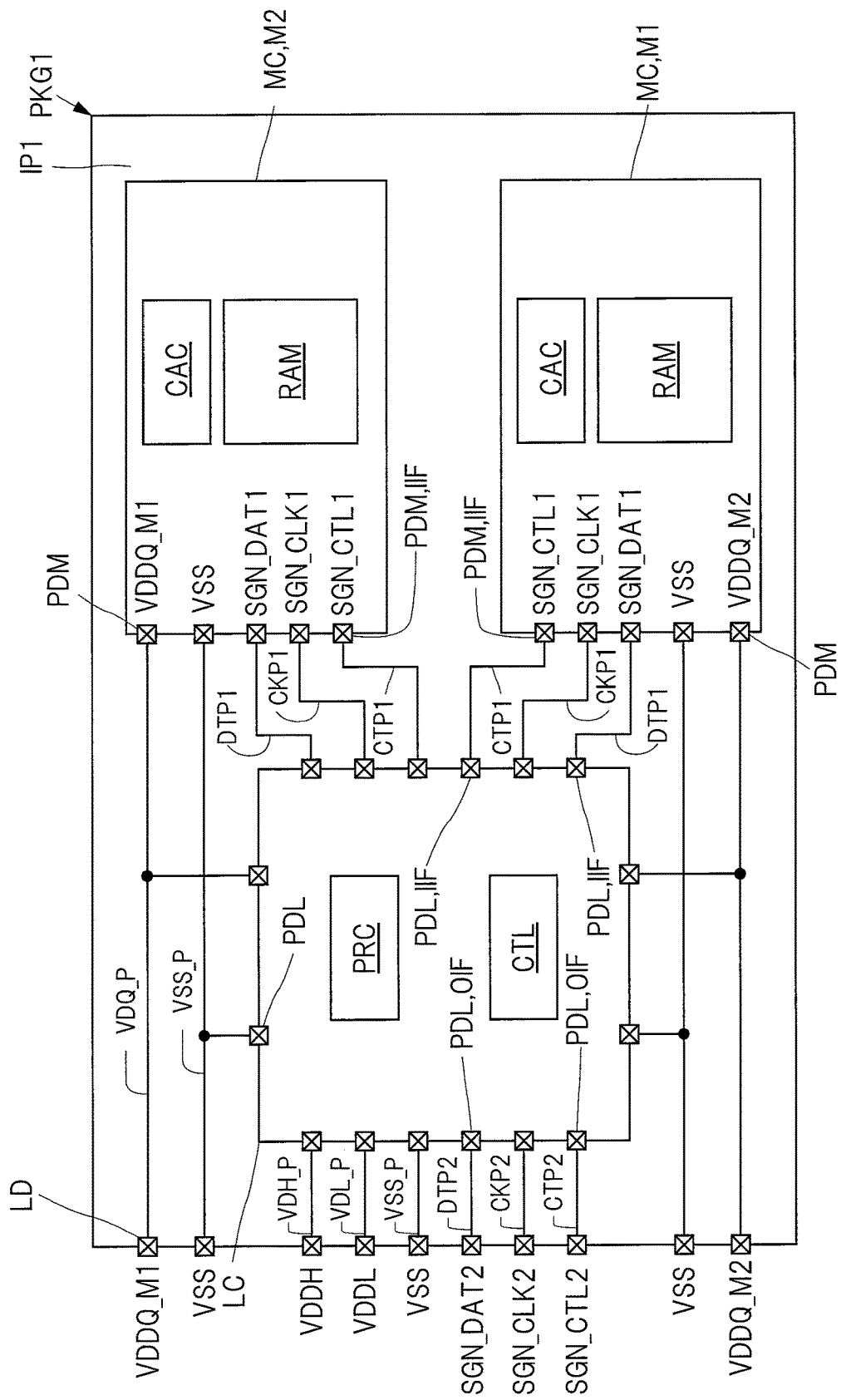
FIG. 5 is an explanatory view illustrating an outline of a configuration of a plurality of transmission paths electrically connected with a plurality of semiconductor chips of the semiconductor device illustrated in FIG. 1.

As illustrated in FIGS. 1 and 2, the electronic device EDV1 according to the present embodiment includes the semiconductor device PKG1 mounted on the upper surface MBt of the wiring substrate MB1. A detailed configuration of the semiconductor device PKG1 will be described below. In this section, a circuit configuration example of the semiconductor device PKG1 will be described first, and then a structure of the semiconductor device PKG1 will be described. FIG. 5 is an explanatory view illustrating an outline of a configuration of a plurality of transmission paths electrically connected with a plurality of semiconductor chips of the semiconductor device illustrated in FIG. 1.

Note that FIG. 5 illustrates a control circuit CTL which controls the memory chip MC and an arithmetic processing circuit PRC which performs arithmetic operation processing of an image display system as typical examples of the plurality of circuits of the logic chip LC. Further, FIG. 5 typically illustrates an input/output circuit CAC which performs an input/output operation of data signals and a memory circuit RAM which stores the data signals among the plurality of circuits of the memory chip MC.

As illustrated in FIGS. 1 and 5, the semiconductor device PKG1 according to the present embodiment includes the wiring substrate IP1 and a plurality of semiconductor chips mounted on the upper surface IPt of the wiring substrate IP1. In the example illustrated in FIGS. 1 and 5, the plurality of semiconductor chips are configured by the two memory chips MC (memory chips M1 and M2) in which storage circuits (memory circuits) are formed and the logic chip LC which includes the control circuit which controls respective operations of the two memory chips MC. Note that the number of the plurality of semiconductor chips is not limited to the above, and various modified examples are applicable. In particular, the number of memory chips MC differs depending on the storage capacity required in a system provided in the semiconductor device PKG1. The value of the storage capacity increases in proportion to the number of memory chips MC, and therefore, for example, the number of memory chips MC may be two or more or may be one. Further, a plurality of logic chips LC may be mounted on the upper surface IPt. Furthermore, semiconductor chips having functions other than those of the logic chip LC and the memory chip MC may be mounted.

Each of the plurality of memory chips MC illustrated in FIG. 5 includes a storage circuit referred to as a DRAM (Dynamic Random Access Memory) (described as a memory circuit RAM below) and the input/output circuit CAC which performs an input/output operation of data signals from and to the memory circuit RAM. Further, the logic chip LC electrically connected with each of the plurality of memory chips MC includes the control circuit CTL which controls operations of the memory circuits RAM of the memory chips MC and the arithmetic processing circuit PRC which performs arithmetic operation processing on data signals.

Furthermore, each of the plurality of memory chips MC includes a power potential supply path VDQ_P which supplies power potentials VDDQ_M1 and VDDQ_M2 for driving the input/output circuit CAC and a reference potential supply path VSS_P which supplies a reference potential VSS. In the illustration of FIG. 5, the power potential VDDQ_M1 for the memory chip M1 and the power potential VDDQ_M2 for the memory chip M2 are distinguished, but the power potential VDDQ_M1 and the power potential VDDQ_M2 are the same potential and cause a current of, for example, approximately 2 A to flow. Further, the reference potential VSS is, for example, a ground potential (GND potential) or a potential having a different value from the power potential.

Also, the power potential supply path VDQ_P and the reference potential supply path VSS_P are connected to terminals (lands) LD which are external terminals of the wiring substrate IP1. The terminals (lands) VQLD illustrated in FIG. 4 configure part of the power potential supply path VDQ_P illustrated in FIG. 5. Further, the power potential supply path VDQ_P and the reference potential supply path VSS_P are branched in the wiring substrate IP1 and are connected to electrodes PDL of the logic chip LC.

In addition, each of the plurality of memory chips MC includes a plurality of signal transmission paths for transmitting electrical signals. The plurality of signal transmission paths include a data signal transmission path DTP1 for transmitting data signals SGN_DAT1, a clock signal transmission path CKP1 for transmitting clock signals SGN_CLK for synchronizing operation timings, and a control signal transmission path CTP1 for transmitting control signals SGN_CTL1 for controlling the input/output operation. The data signal transmission path DTP1, the clock signal transmission path CKP1 and the control signal transmission path CTP1 connect the electrodes PDL of the logic chip LC and electrodes PDM of the memory chip MC.

Note that FIG. 5 illustrates the power potential supply path VDQ_P which supplies the power potentials VDDQ_M1 and VDDQ_M2 for driving the input/output circuit CAC and the reference potential supply path VSS_P which supplies the reference potential VSS as paths for supplying power potentials to the memory chip MC. However, a power potential supply path for a core circuit which drives main circuits (core circuits) such as a power control circuit and a clock oscillation circuit (not illustrated) or another reference potential supply path may be included in addition to the paths mentioned above.

Also, FIG. 5 illustrates an example where one data signal transmission path DTP1, one clock signal transmission path CKP1 and one control signal transmission path CTP1 are connected to each of the plurality of memory chips MC. However, a plurality of data signal transmission paths DTP1, a plurality of clock signal transmission paths CKP1 and a plurality of control signal transmission paths CTP1 are connected with the memory chip MC in practice.

For example, data signal transmission paths the number of which corresponds to the number of channels of the memory circuit RAM and the width of a data bus of each channel are connected with the memory chip MC. For example, when each of the memory chips MC includes four channels having bus widths of 64 bits, the data signal transmission path DTP1 of 256 bits is connected. Further, when a data strobe signal and a data mask signal (not illustrated) in addition to the data signal SGN_DAT1 are taken into account, the number of data signal transmission paths DTP1 further increases.

Furthermore, signal currents transmitted by the clock signal transmission path CKP1 illustrated in FIG. 5 include a clock enable signal for performing control to enable the clock signal SGN_CLK in addition to the clock signal SGN_CLK which is a timing signal.

Also, the control signal SGN_CTL1 illustrated in FIG. 5 includes command signals such as a chip select signal, a row address strobe signal, a column address strobe signal and a write enable signal and address specifying signals such as an address signal and a bank address signal. Hence, the control signal transmission paths CTP1 the number of which corresponds to the number of types of the control signal SGN_CTL1 are connected with each of the plurality of memory chips MC.

Further, the logic chip LC includes a power potential supply path VDH_P for supplying a power potential VDDH for driving the arithmetic processing circuit PRC, a power potential supply path VDL_P for supplying a power potential VDDL for driving the control circuit CTL, and the reference potential supply path VSS_P for supplying the reference potential VSS. When the arithmetic processing circuit PRC and the control circuit CTL are driven by the same drive voltage, the power potential VDDH and the power potential VDDL can be used as a common potential. However, when the arithmetic processing circuit PRC and the control circuit CTL are driven by different drive voltages, power potential supply paths corresponding to values of the drive voltages are necessary. Note that, in the example illustrated in FIG. 5, the same potential (e.g. ground potential) is supplied as the reference potential VSS to each of the arithmetic processing circuit PRC and the control circuit CTL.

When a plurality of systems are constructed inside one semiconductor device PKG1 like in the present embodiment, the power amount to be consumed differs in accordance with a system type. For example, relatively high power is consumed to drive the arithmetic processing circuit PRC which performs arithmetic operation processing to form graphics and moving images.

For example, in the example illustrated in FIG. 5, a current of approximately 10 A flows in the power potential supply path VDH_P for the arithmetic processing circuit PRC for supplying the power potential VDDH of 0.9 V (Volt). Meanwhile, the power consumption amount of the control circuit CTL which controls the input/output operation is lower than the power consumption amount of the arithmetic processing circuit PRC, and a value of the current flowing in the power potential supply path VDL_P for the control circuit CTL is relatively small. For example, in the example illustrated in FIG. 5, a current of approximately 3 A flows in the power potential supply path VDL_P for the control circuit CTL for supplying the power potential VDDL of 0.9 V (Volt).

Namely, the value of the current flowing in the power potential supply path VDL_P for the arithmetic processing circuit PRC is larger than the value of the current flowing in the power potential supply path VDL_P for the control circuit CTL. In the above example, the power potential VDDH supplied to drive the arithmetic processing circuit PRC and the power potential VDDL supplied to drive the control circuit CTL are the same. However, even when the power potential VDDH and the power potential VDDL are different from each other, the value of the current flowing in the power potential supply path VDL_P is larger than the value of the current flowing in the power potential supply path VDL_P.

Namely, the power potential VDDH supplied to drive the arithmetic processing circuit PRC is higher than the power potential VDDL supplied to drive the control circuit CTL. Further, the value of the current flowing in the power potential supply path VDL_P for the arithmetic processing circuit PRC is larger than the value of the current flowing in the power potential supply path VDL_P for the control circuit CTL.

Also, the power potential supply path VDH_P, the power potential supply path VDL_P and the reference potential supply path VSS_P are connected to the terminals LD which are external terminals of the wiring substrate IP1. A terminal VHLD illustrated in FIG. 4 configures part of the power potential supply path VDH_P which supplies the power potential VDDH illustrated in FIG. 5.

Further, the logic chip LC includes a plurality of signal transmission paths for transmitting electrical signals. The plurality of signal transmission paths include the data signal transmission path DTP1 for transmitting the data signal SGN_DAT1 between the logic chip LC and the memory chip MC, the clock signal transmission path CKP1 for transmitting the clock signal SGN_CLK1 for synchronizing operation timings, and the control signal transmission path CTP1 for transmitting the control signal SGN_CTL1 for controlling the input/output operation. Also, the plurality of signal transmission paths include the data signal transmission path DTP2 for transmitting the data signal SGN_DAT1 between the logic chip LC and the external device of the semiconductor device PKG1, the clock signal transmission path CKP2 for transmitting the clock signal SGN_CLK1 for synchronizing operation timings, and the control signal transmission path CTP2 for transmitting the control signal SGN_CTL1 for controlling the input/output operation.

Note that the electrodes PDL which are signal transmission paths among the plurality of electrodes PDL of the logic chip LC include internal interface electrodes (interface terminals) IIF which transmit the clock signal SGN_CLK1, the control signal SGN_CTL1 and the data signal SGN_DAT1 between the logic chip LC and the memory chip MC. Further, the electrodes PDL which are the signal transmission paths include external interface electrodes (interface terminals) OIF which transmit a clock signal SGN_CLK2, a control signal SGN_CTL2 and a data signal SGN_DAT2 between the logic chip LC and the external device of the semiconductor device PKG1.

Also, the data signal SGN_DAT2 transmitted between the terminal LD of the wiring substrate IP1 and the logic chip LC and the data signal SGN_DAT1 transmitted between the logic chip LC and the memory chip MC may be different data signals. The arithmetic processing circuit PRC of the logic chip LC performs arithmetic operation processing, so that an input signal and an output signal are different before and after the processing in some cases.

Further, the control signal SGN_CTL2 transmitted between the terminal LD of the wiring substrate IP1 and the logic chip LC includes signals for controlling the control circuit CTL and the arithmetic processing circuit PRC. Hence, the control signal SGN_CTL2 transmitted between the terminal LD of the wiring substrate IP1 and the logic chip LC and the control signal SGN_CTL1 transmitted between the logic chip LC and the memory chip MC are different from each other.

Also, the clock signal SGN_CLK2 transmitted between the terminal LD of the wiring substrate IP1 and the logic chip LC may include the timing signal for the arithmetic processing circuit PRC in addition to the timing signal for the control circuit CTL. Hence, the clock signal SGN_CLK2 transmitted between the terminal LD of the wiring substrate IP1 and the logic chip LC and the clock signal SGN_CLK1 transmitted between the logic chip LC and the memory chip MC may be different from each other.

As described above, an input of the data signal SGN_DAT1 to the memory circuit RAM and an output of the data signal SGN_DAT1 from the memory circuit RAM are performed through the logic chip LC. Hence, most of the signal transmission paths (see FIG. 2) connected to the memory chip MC are electrically connected with the terminals LD of the wiring substrate IP1 through the logic chip LC, and there are few signal transmission paths electrically connected with the terminals LD of the wiring substrate IP1 without passing through the logic chip LC.

In other words, the electrodes PDL constituting the signal transmission paths of the logic chip LC include the plurality of external interface electrodes OIF and the plurality of internal interface electrodes IIF. Meanwhile, most of the electrodes PDM constituting the signal transmission paths of the memory chip MC are the internal interface electrodes IIF which transmit signals between the memory chip MC and the logic chip LC, and there are few or no external interface electrodes OIF.

In the example illustrated in FIG. 5, all signal transmission paths connected to the memory chip MC are electrically connected with the logic chip LC. In other words, in the example illustrated in FIG. 5, there is no external interface electrode OIF of the memory chip MC. However, according to a modified example of FIG. 5, signal transmission paths other than the signal transmission paths illustrated in FIG. 5 may be electrically connected with the terminals LD of the wiring substrate IP1 without passing through the logic chip LC.

Although not illustrated, for example, a test signal transmission path for individually conducting a test on the memory chip MC after the semiconductor device PKG1 is assembled may be electrically connected with the terminal LD of the wiring substrate IP1 without passing through the logic chip LC. In other words, according to a modified example of FIG. 5, the plurality of terminals LD of the wiring substrate IP1 may include signal terminals electrically connected with the memory chip MC without passing through the logic chip LC and a plurality of signal terminals electrically connected with the memory chip MC through the logic chip LC.

In the above case, the input/output operation of the memory circuit RAM is controlled through the control circuit CTL. Therefore, even when there are signal transmission paths electrically connected with the terminals LD of the wiring substrate IP1 without passing through the logic chip LC, the number of such signal transmission paths is small. Namely, the number of signal terminals electrically connected with the memory chip MC through the logic chip LC is larger than the number of signal terminals electrically connected with the memory chip MC without passing through the logic chip LC.

Note that "the number of signal terminals electrically connected with the memory chip MC without passing through the logic chip LC" described above includes the case where the number of signal terminals electrically connected with the memory chip MC without passing through the logic chip LC is 0 like in the example illustrated in FIG. 5.

<Structure of Semiconductor Device>

Figure 6:
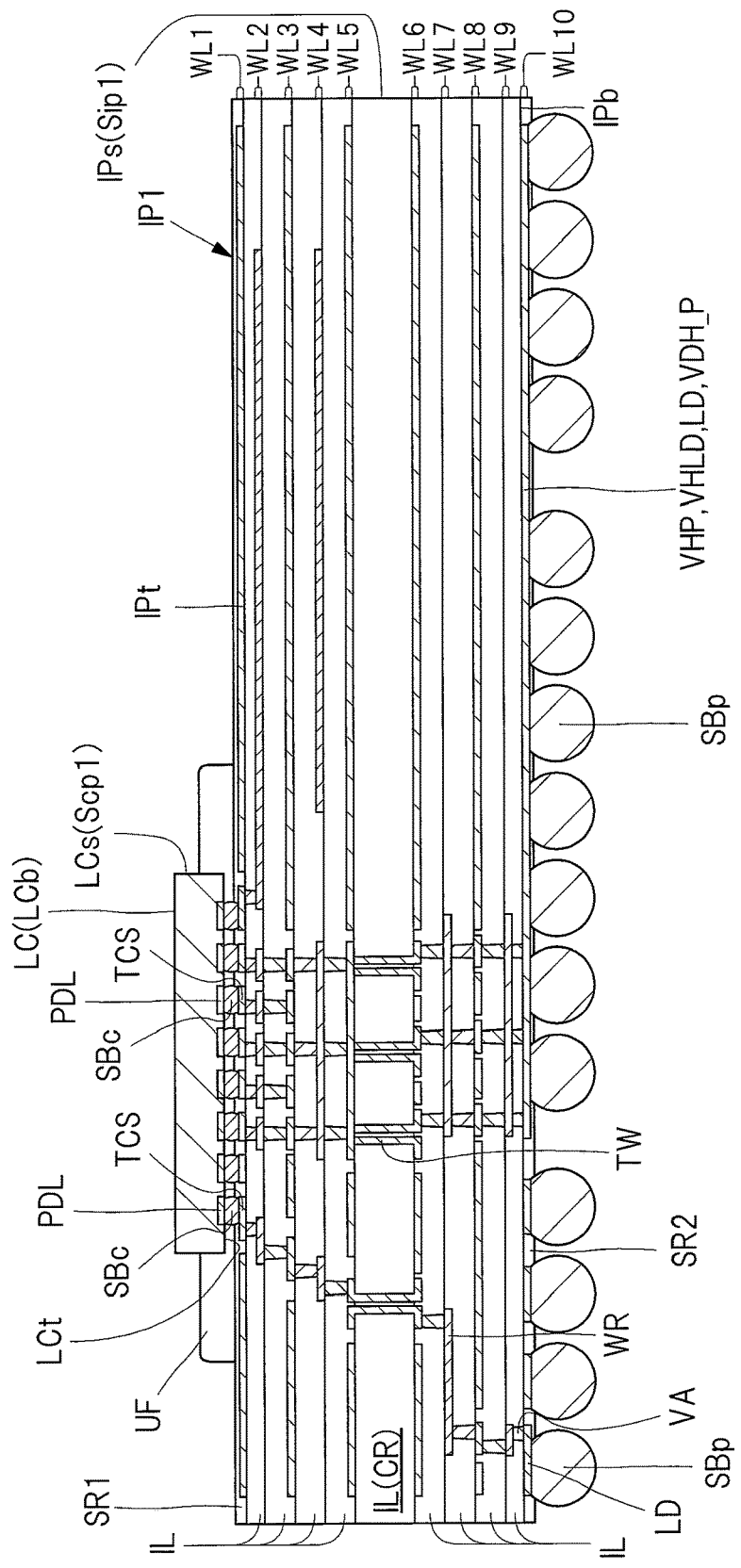
FIG. 6 is a sectional view of the semiconductor device along the line A-A illustrated in FIG. 1.
Figure 7:
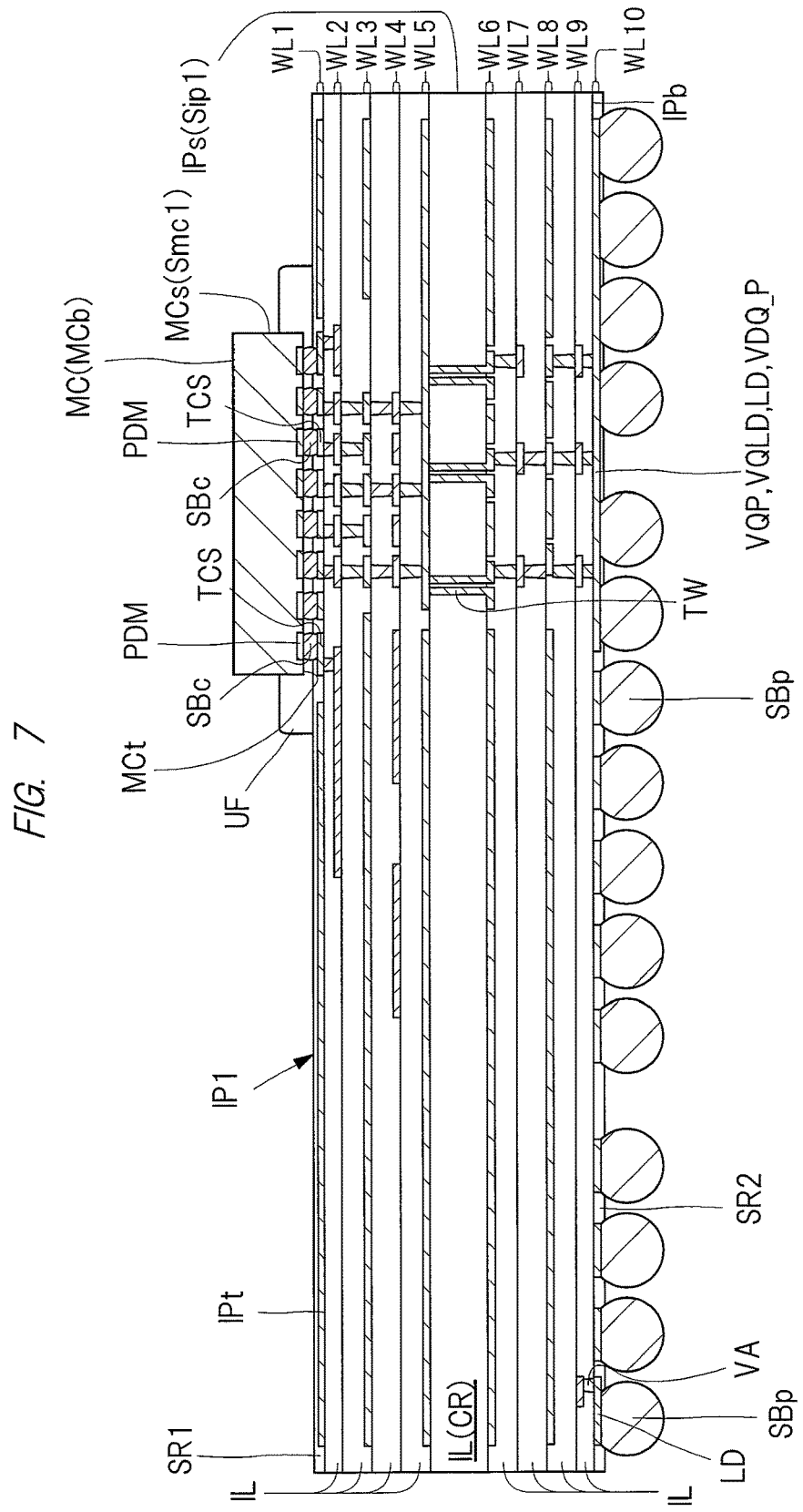
FIG. 7 is a sectional view of the semiconductor device along a line B-B illustrated in FIG. 1.
Figure 8:
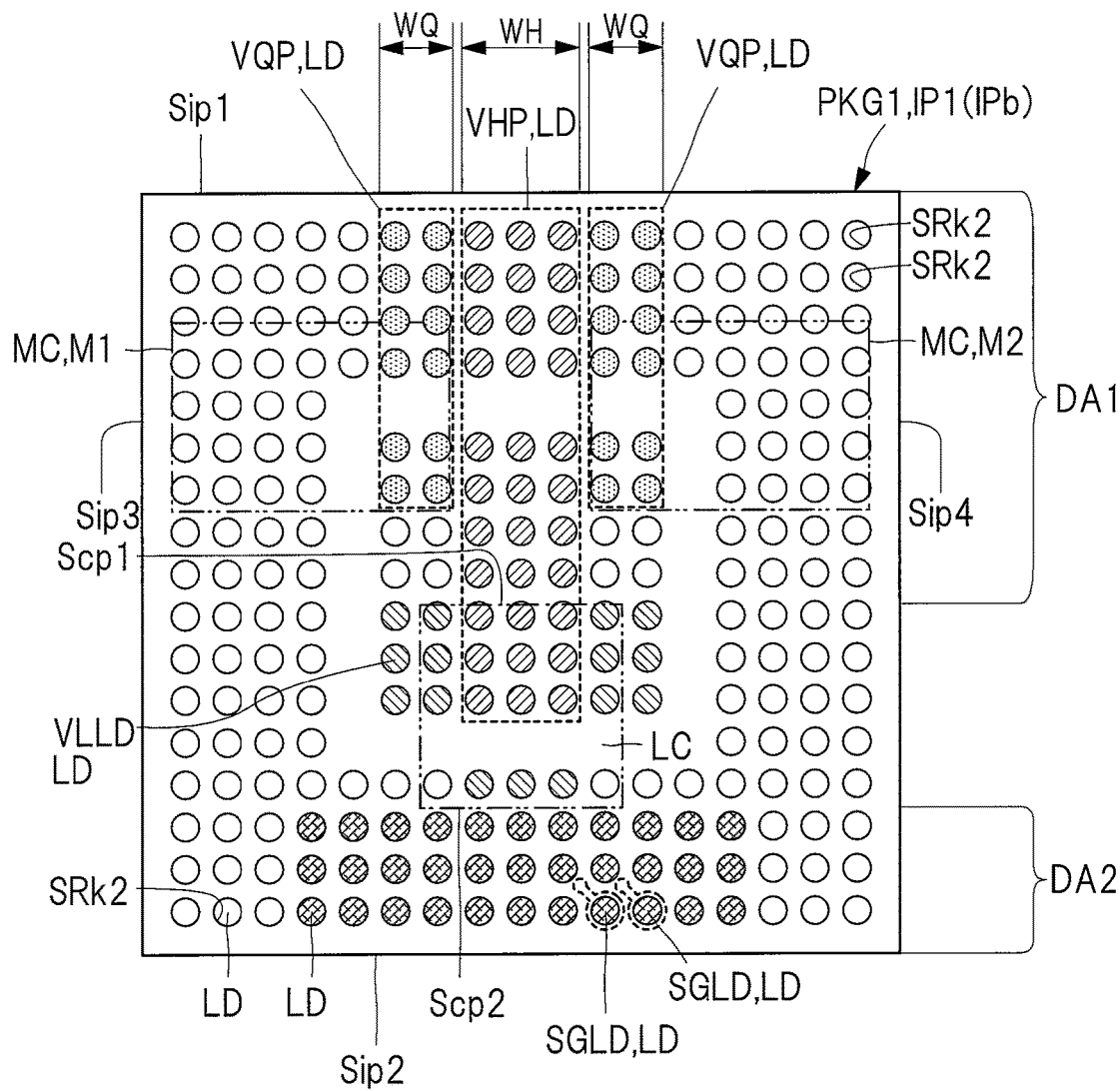
FIG. 8 is a plan view illustrating a structure on a side of a lower surface of the semiconductor device illustrated in FIG. 1.
Figure 9:
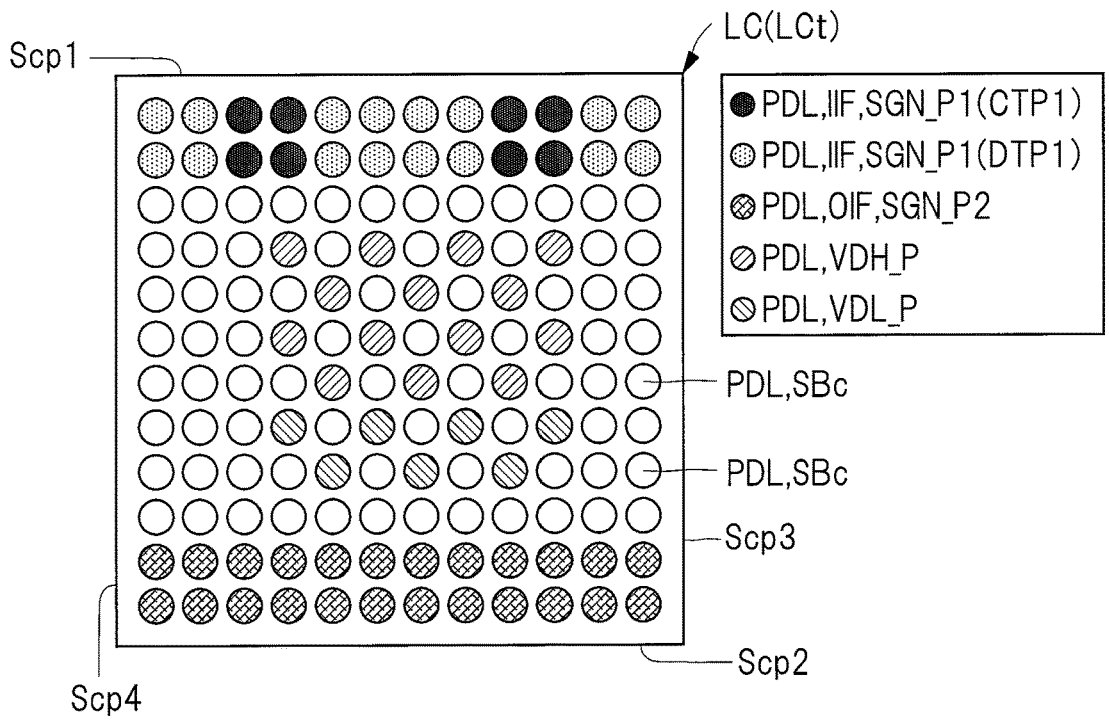
FIG. 9 is a plan view illustrating a top surface of a logic chip illustrated in FIG. 1.
Figure 10:
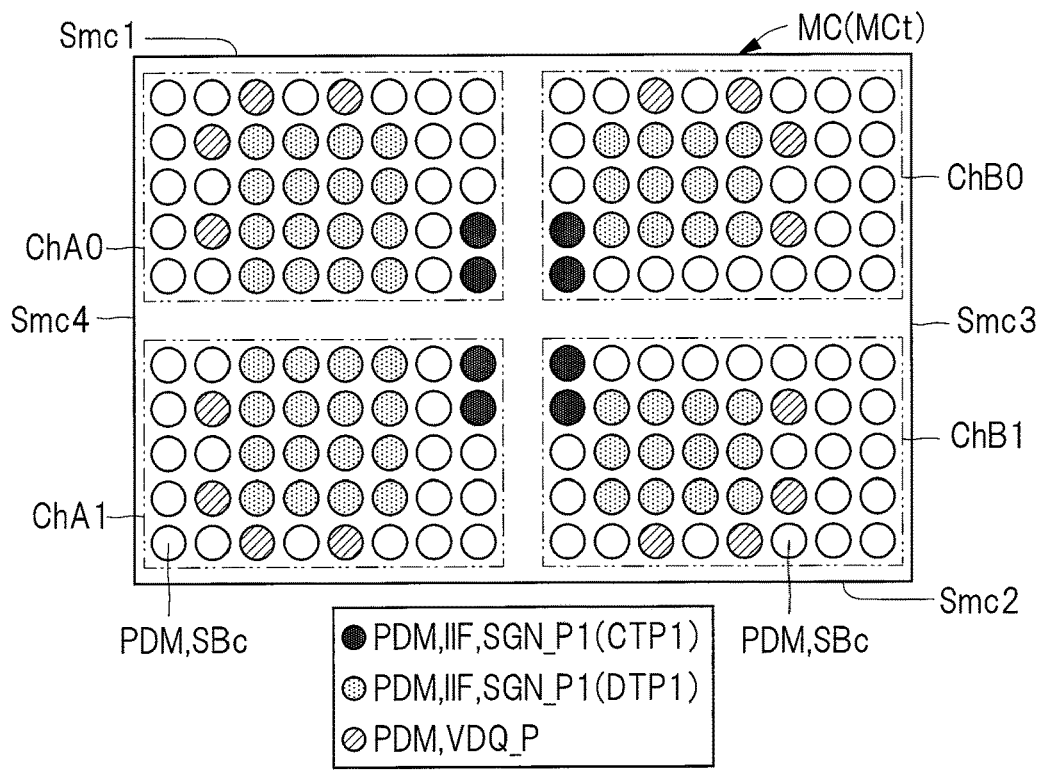
FIG. 10 is a plan view illustrating a top surface of a memory chip illustrated in FIG. 1.

Next, the structure of the semiconductor device PKG1 will be described. FIG. 6 is a sectional view of the semiconductor device along the line A-A illustrated in FIG. 1. Also, FIG. 7 is a sectional view of the semiconductor device along a line B-B illustrated in FIG. 1. Further, FIG. 8 is a plan view illustrating a structure on a side of a lower surface of the semiconductor device illustrated in FIG. 1. Furthermore, FIG. 9 is a plan view illustrating a top surface of the logic chip illustrated in FIG. 1. Moreover, FIG. 10 is a plan view illustrating a top surface of the memory chip illustrated in FIG. 1.

Note that FIGS. 6 and 7 are sectional views, but do not illustrate hatchings of insulation layers IL, SR1 and SR2 and underfill resins UF preferentially for ease of viewing of the drawings. Further, FIG. 8 is a plan view, but different patterns are applied to a plurality of terminals LD in accordance with types of flowing currents, and meaning of each pattern is indicated by a symbol next to an explanatory note. Furthermore, FIGS. 9 and 10 are plan views, but different patterns are applied to a plurality of electrodes PDL in accordance with types of flowing currents, and meaning of each pattern is indicated by a symbol next to an explanatory note.

As illustrated in FIG. 6, the wiring substrate IP1 includes the upper surface (a surface, a principal surface and a chip mounting surface) IPt on which the logic chip LC and the memory chip MC (see FIG. 7) are mounted, the lower surface (a surface, a principal surface and a packaging surface) IPb on an opposite side of the upper surface IPt, and a plurality of side surfaces IPs disposed between the upper surface IPt and the lower surface IPb, and has a quadrangular outer shape when seen in a plan view as illustrated in FIGS. 1 and 8. In the example illustrated in FIGS. 1 and 8, a planar size (dimensions in a plan view and dimensions and outer shape size of the upper surface IPt and the lower surface IPb) of the wiring substrate IP1 forms a quadrangular shape whose one side is, for example, approximately 30 mm to 100 mm.

As illustrated in FIG. 1, the peripheral portion of the wiring substrate IP1 includes a substrate side Sip1, a substrate side Sip2 which is positioned on an opposite side of the substrate side Sip1, a substrate side Sip3 which intersects the substrate side Sip1 and the substrate side Sip2, and a substrate side Sip4 which is positioned on an opposite side of the substrate side Sip3. In the example illustrated in FIG. 1, the semiconductor device PKG1 is mounted on the wiring substrate MB1 such that the substrate side Sip1 of the four sides of the wiring substrate IP1 and the power supply device RGL1 face each other.

The wiring substrate IP1 is the interposer (relay board) which electrically connects a plurality of semiconductor chips including the logic chip LC mounted on the side of the upper surface IPt and the wiring substrate MB1 which is the mother board (packaging substrate) illustrated in FIG. 1. Further, the wiring substrate IP1 is the interposer which electrically connects the logic chip LC and the plurality of memory chips MC mounted on the side of the upper surface IPt.

Furthermore, as illustrated in FIG. 6, the wiring substrate IP1 includes a plurality of wiring layers (ten layers in the example in FIG. 6) WL1, WL2, WL3, WL4, WL5, WL6, WL7, WL8, WL9 and WL10 which electrically connect the side of the upper surface IPt which is the chip mounting surface and the side of the lower surface IPb which is the packaging surface. Conductor patterns such as wirings serving as paths for supplying electrical signals and power are formed in each wiring layer, and are covered by the insulation layers IL.

Further, most of the wiring layer WL1 disposed on the side closest to upper surface IPt among the plurality of wiring layers is covered by the insulation film SR1 which is a solder resist film. Furthermore, most of the wiring layer WL10 disposed on the side closest to the lower surface IPb among the plurality of wiring layers is covered by the insulation film SR2 which is a solder resist film.

Also, the wiring substrate IP1 is formed by, for example, laminating a plurality of wiring layers by a buildup process on an upper surface and a lower surface of a core layer (a core material and a core insulation layer) CR made of a prepreg obtained by impregnating glass fiber with resin. Moreover, the wiring layer WL5 on the upper surface side of the core layer CR and the wiring layer WL6 on the lower surface side of the core layer CR are electrically connected through a plurality of through-hole wirings TW buried in a plurality of penetration holes (through holes) penetrating from one side to the other side of the upper surface and the lower surface of the core layer CR.

As illustrated in FIGS. 6 and 7, a plurality of bonding pads (bonding leads and semiconductor chip connection terminals) TCS electrically connected with the logic chip LC or the memory chip MC (see FIG. 7) are formed on the upper surface IPt of the wiring substrate IP1. Further, a plurality of terminals (lands and external connection terminals) LD which are external input/output terminals of the semiconductor device PKG1 are formed on the lower surface IPb of the wiring substrate IP1. The plurality of bonding pads TCS and the plurality of terminals LD are electrically connected through wirings WR, vias VA and the through-hole wirings TW formed in the wiring substrate IP1.

Note that, in the example in FIG. 6, the wiring substrate IP1 is a wiring substrate in which a plurality of wiring layers are laminated on the upper surface side and the lower surface side of the core layer CR which is a core material. However, according to a modified example of FIG. 6, a so-called coreless substrate which does not include the core layer CR made of a hard material such as a prepreg material and is formed by sequentially laminating the insulation layers IL and conductor patterns such as the wirings WR may be used. When the coreless substrate is used, respective wiring layers are electrically connected through the vias VA without forming the through-hole wirings TW. Further, FIG. 6 illustrates the wiring substrate IP1 including the ten wiring layers as an example, but according to a modified example, a wiring substrate including eleven or more wiring layers or nine or less wiring layers may be used.

Furthermore, the plurality of terminals LD illustrated in FIG. 8 are conductor patterns formed in the lowermost layer (the tenth wiring layer WL10 in the example illustrated in FIG. 6) of the plurality of wiring layers of the wiring substrate IP1. More specifically, the conductor patterns formed in the lowermost layer are covered by the insulation film SR2 formed to cover the lower surface IPb of the wiring substrate IP1 as illustrated in FIG. 4. Further, a plurality of openings SRk2 are formed in the insulation film SR2, and part of the conductor patterns formed in the lowermost wiring layer WL10 are exposed through each of the plurality of openings SRk2.

Furthermore, the plurality of conductor patterns constituting the terminals LD illustrated in FIG. 8 include individual conductor patterns electrically insulated from the other terminals LD and formed independently for each terminal LD. For example, the signal terminal SGLD electrically connected with the signal line SGW is electrically insulated from the neighboring terminals LD. By electrically insulating the neighboring signal terminals SGLD in this manner, it is possible to cause different signal currents to flow in respective signal transmission paths.

Further, the plurality of conductor patterns constituting the terminals LD illustrated in FIG. 8 include conductor films of relatively large areas such as a power plane VHP and a power plane VQP to which the plurality of terminals LD are connected. Hereinafter, the conductor films having areas to which a plurality of neighboring terminals LD are connected will be referred to as conductor planes. Further, a conductor plane constituting a power potential supply path among the conductor planes will be referred to as a power plane. Furthermore, a conductor plane constituting a reference potential supply path among the conductor planes will be referred to as a ground plane.

When the conductor planes are used as part of the terminals LD like in the present embodiment, the plurality of openings SRk2 are formed in one conductor plane. In the case of the power plane VHP, for example, the plurality of openings SRk2 are formed at positions which overlap the one power plane VHP in the thickness direction. Each of the plurality of openings SRk2 functions as the terminal VHLD which connects the power plane VHP with solder balls SBp (see FIG. 4). By providing the plurality of terminals LD by using one power plane VHP in this manner, it is possible to reduce resistance in the power potential supply paths. Further, as a result of the reduction of resistance in the power potential supply paths, it is possible to suppress a rise in the temperature of the semiconductor device PKG1 during driving, and it is thus possible to stabilize the circuit operation.

Furthermore, in the example illustrated in FIG. 6, the solder balls (a solder member, an external terminal, an electrode and an external electrode) SBp are connected with each of the plurality of terminals LD. The solder ball SBp is a conductive member which electrically connects the plurality of terminals CN (see FIG. 4) of the wiring substrate MB1 and the plurality of terminals LD when the semiconductor device PKG1 is packaged on the wiring substrate MB1 illustrated in FIG. 1. Each solder ball SBp is a Sn—Pb solder member containing lead (Pb) or a solder member made of a so-called lead-free solder which contains substantially no Pb. Examples of the lead-free solder include tin (Sn), tin-bismuth (Sn—Bi), tin-copper-silver (Sn—Cu—Ag), tin-copper (Sn—Cu) and the like. In this respect, the lead-free solder means a solder whose content of lead (Pb) is 0.1 wt % or less, and this content is defined based on the RoHS (Restriction of Hazardous Substances) directive.

Further, as illustrated in FIG. 8, the plurality of terminals LD are disposed in a grid pattern (an array pattern and a matrix pattern). Furthermore, the plurality of solder balls SBp (see FIG. 6) bonded to the plurality of terminals LD are also disposed in the grid pattern (matrix pattern). A semiconductor device in which a plurality of external terminals (the solder balls SBp and the terminals LD) are disposed in the grid pattern on the packaging surface side of the wiring substrate IP1 in this manner will be referred to as an area array type semiconductor device. The area array type semiconductor device can effectively utilize the packaging surface (lower surface IPb) of the wiring substrate IP1 as a space to dispose external terminals, and is thus preferable in the point that an increase in a packaging area of the semiconductor device can be suppressed even when the number of external terminals increases. Namely, the semiconductor device in which the number of external terminals increases due to higher functionality and higher integration can be packaged in a space-saving manner.

Further, as illustrated in FIG. 1, the semiconductor device PKG1 includes the logic chip LC and the plurality of memory chips MC mounted on the wiring substrate IP1. The logic chip LC and the plurality of memory chips MC are mounted side by side on the wiring substrate IP1. In other words, the logic chip LC and the plurality of memory chips MC are not laminated and do not overlap when seen in a plan view.

Further, the logic chip LC has a quadrangular outer shape whose planar area is smaller than that of the wiring substrate IP1 when seen in a plan view. More specifically, when seen in a plan view, the peripheral portion of the logic chip LC includes a chip side Scp1, a chip side Scp2 which is positioned on an opposite side of the chip side Scp1, a chip side Scp3 which intersects the chip side Scp1 and the chip side Scp2, and a chip side Scp4 which is positioned on an opposite side of the chip side Scp3. In the example illustrated in FIG. 1, the logic chip LC is mounted on the wiring substrate IP1 such that the chip side Scp1 and the substrate side Sip1 extend in parallel. More specifically, the logic chip LC is mounted on the wiring substrate IP1 such that the chip side Scp1 and the substrate side Sip1 are in parallel, the chip side Scp2 and the substrate side Sip2 are in parallel, the chip side Scp3 and the substrate side Sip3 are in parallel, and the chip side Scp4 and the substrate side Sip4 are in parallel.

Also, each of the plurality of memory chips MC has a quadrangular outer shape whose planar area is smaller than that of the wiring substrate IP1 when seen in a plan view. In the example illustrated in FIG. 1, each of the plurality of memory chips MC has a rectangular shape. More specifically, as illustrated in FIG. 10, the peripheral portion of each memory chip MC includes a chip side Smc1, a chip side Smc2 which is positioned on an opposite side of the chip side Smc1, a chip side Smc3 which intersects the chip side Smc1 and the chip side Smc2, and a chip side Smc4 which is positioned on an opposite side of the chip side Smc3 when seen in a plan view. Further, in the example illustrated in FIG. 10, the chip side Smc1 and the chip side Smc2 are long sides, and the chip side Smc3 and the chip side Smc4 are short sides.

In addition, in the example illustrated in FIG. 1, an area of each of the plurality of memory chips MC is larger than the area of the logic chip LC. A storage capacity of each memory chip MC increases in proportion to an area of a formation region of the memory circuit RAM (see FIG. 5). Consequently, by making the area of each of the plurality of memory chips MC larger than the area of the logic chip LC, it is possible to increase the storage capacity of the memory chips MC.

Also, as illustrated in FIG. 1, each of the plurality of memory chips MC is mounted between an extension line of the chip side Scp1 of the logic chip LC and the substrate side Sip1 of the wiring substrate IP1. An advantage provided by mounting the plurality of memory chips MC between the extension line of the chip side Scp1 and the substrate side Sip1 will be described below.

Further, as illustrated in FIG. 6, the logic chip LC includes a top surface (a principal surface and an upper surface) LCt, a back surface (a principal surface and a lower surface) LCb which is on an opposite side of the top surface LCt, and side surfaces LCs which are positioned between the top surface LCt and the back surface LCb.

A plurality of electrodes (chip terminals and bonding pads) PDL are formed on a side of the top surface LCt of the logic chip LC. On the top surface LCt of the logic chip LC, the plurality of electrodes PDL are exposed through a protection film which protects the top surface LCt of the logic chip LC. In the present embodiment, as illustrated in FIG. 9, the plurality of electrodes PDL are disposed in a grid pattern (a matrix pattern and an array pattern) on the top surface LCt of the logic chip LC. Disposing the plurality of electrodes PDL which are the electrodes of the logic chip LC in the grid pattern makes it possible to effectively utilize the top surface LCt of the logic chip LC as a space to dispose the electrodes, and is thus preferable in the point that an increase in a planar area can be suppressed even when the number of electrodes of the logic chip LC increases. Although not illustrated, according to a modified example of the present embodiment, a semiconductor chip in which the plurality of electrodes PDL are formed in a peripheral portion of the top surface LCt is also applicable.

Further, in the example illustrated in FIG. 6, the logic chip LC is mounted on the wiring substrate IP1 in a state where the top surface LCt is disposed facing the upper surface IPt of the wiring substrate IP1. Such a mounting method is referred to as a face-down mounting method or a flip chip connection method.

Also, although not illustrated, a plurality of semiconductor elements (circuit elements) are formed on the principal surface of the logic chip LC (more specifically, a semiconductor element formation region provided on an element formation surface of a semiconductor substrate which is a base material of the logic chip LC). The plurality of electrodes PDL are electrically connected with the plurality of semiconductor elements through wirings (not illustrated) formed in the wiring layers disposed inside the logic chip LC (more specifically, between the top surface LCt and the semiconductor element formation region (not illustrated)).

The logic chip LC (more specifically, the base material of the logic chip LC) is made of, for example, silicon (Si). Also, an insulation film which covers the base material and the wirings of the logic chip LC is formed on the top surface LCt, and part of each of the plurality of electrodes PDL is exposed from the insulation film through the openings formed in the insulation film. Further, each of the plurality of electrodes PDL is made of metal and is made of, for example, aluminum (Al) in the present embodiment. Note that the material for making the electrodes PDL is not limited to aluminum (Al) and may be copper (Cu).

In addition, as illustrated in FIG. 6, protruding electrodes SBc are connected with the plurality of electrodes PDL, and the plurality of electrodes PDL of the logic chip LC and a plurality of bonding pads TCS of the wiring substrate IP1 are electrically connected through the plurality of protruding electrodes SBc. Each protruding electrode (bump electrode) SBc is a metal member (conductive member) formed to protrude on the top surface LCt of the logic chip LC. In the present embodiment, the protruding electrode SBc is a so-called solder bump formed by laminating a solder member on the electrode PDL with an underlayer metal film (under bump metal) interposed therebetween. The underlayer metal film can be exemplified as, for example, a laminated film formed by laminating titanium (Ti), copper (Cu) and nickel (Ni) from a connection surface with the electrode PDL (a gold (Au) film may be further formed on the nickel film in some cases).

Further, as the solder member which makes each solder bump, a lead-containing solder member or a lead-free solder can be used similarly to the solder balls SBp described above. When the logic chip LC is mounted on the wiring substrate IP1, solder bumps formed on both of the plurality of electrodes PDL and the plurality of bonding pads TCS in advance are placed in contact with each other, and are subjected to heating processing (reflow processing), so that the solder bumps are integrated to form the protruding electrodes SBc. Further, according to a modified example of the present embodiment, pillar bumps (columnar electrodes) in which solder films are formed on distal end surfaces of conductive columns made of copper (Cu) or nickel (Ni) may be used as the protruding electrodes SBc.

Also, as illustrated in FIG. 7, each memory chip MC includes a top surface (a principal surface and an upper surface) MCt, a back surface (a principal surface and a lower surface) MCb which is on an opposite side of the top surface MCt, and side surfaces MCs which are positioned between the top surface MCt and the back surface MCb.

The plurality of electrodes (chip terminals and bonding pads) PDM are formed on a side of the top surface MCt of the memory chip MC. On the top surface MCt of the memory chip MC, the plurality of electrodes PDM are exposed through a protection film which protects the top surface MCt of the memory chip MC. In the present embodiment, as illustrated in FIG. 10, the plurality of electrodes PDM are disposed in a grid pattern (a matrix pattern and an array pattern) on the top surface MCt of the memory chip MC.

In the example illustrated in FIG. 10, the memory chip MC is divided into four channel regions ChA0, ChA1, ChB0 and ChB1, and the plurality of electrodes PDM are arranged in the gird pattern in each channel region. Each channel region of the memory chip MC includes a region in which the memory circuit RAM (see FIG. 5) is formed, and each memory circuit RAM of the channel region is electrically connected with the logic chip LC illustrated in FIG. 6 through the electrodes PDM.

By dividing one memory chip MC into a plurality of channel regions in this manner, it is possible to increase the number of data signals transmitted per unit time in the case of a fixed frequency.

Further, disposing the plurality of electrodes PDL which are the electrodes of the memory chip MC in the grid pattern makes it possible to effectively utilize the top surface MCt of the memory chip MC as a space to dispose the electrodes, and is thus preferable in the point that an increase in a planar area can be suppressed even when the number of electrodes of the memory chip MC increases.

Furthermore, in the example illustrated in FIG. 7, the memory chip MC is mounted on the wiring substrate IP1 in a state where the top surface MCt is disposed facing the upper surface IPt of the wiring substrate IP1. Namely, similarly to the logic chip LC illustrated in FIG. 6, the memory chip MC is mounted on the wiring substrate IP1 according to the face-down mounting method.

Also, a plurality of semiconductor elements (circuit elements) are formed on the principal surface of the memory chip MC (more specifically, a semiconductor element formation region provided on an element formation surface of a semiconductor substrate which is a base material of the memory chip MC). The plurality of electrodes PDM are electrically connected with the plurality of semiconductor elements through wirings (not illustrated) formed in the wiring layers disposed inside the memory chip MC (more specifically, between the top surface MCt and the semiconductor element formation region (not illustrated)).

The memory chip MC (more specifically, the base material of the memory chip MC) is made of, for example, silicon (Si). Also, an insulation film which covers the base material and the wirings of the memory chip MC is formed on the top surface MCt, and part of each of the plurality of electrodes PDM is exposed from the insulation film through the openings formed in the insulation film. Furthermore, each of the plurality of electrodes PDM is made of metal and is made of, for example, aluminum (Al) in the present embodiment.

In addition, as illustrated in FIG. 7, the protruding electrodes SBc are connected with the plurality of electrodes PDM, and the plurality of electrodes PDM of the memory chip MC and the plurality of bonding pads TCS of the wiring substrate IP1 are electrically connected through the plurality of protruding electrodes SBc. The protruding electrodes (bump electrodes) SBc and the underlayer metal film disposed between the protruding electrodes SBc and the electrodes PDM are as described above, and thus redundant descriptions will be omitted.

Further, the underfill resin (insulation resin) UF is disposed between the logic chip LC and the wiring substrate IP1 illustrated in FIG. 6 and between the memory chip MC and the wiring substrate IP1 illustrated in FIG. 7, respectively. The underfill resin UF is disposed to fill a space between the top surface LCt of the logic chip LC and the upper surface IPt of the wiring substrate IP1 and a space between the top surface MCt of the memory chip MC and the upper surface IPt of the wiring substrate IP1.

Also, the underfill resin UF is made of an insulation (non-conductive) material (e.g. resin material), and is disposed to seal electrical connection portions (bonding portions of the plurality of protruding electrodes SBc) between the semiconductor chips (the logic chip LC and the memory chip MC) and the wiring substrate IP1. By covering the bonding portions of the plurality of protruding electrodes SBc and the plurality of bonding pads TCS by the underfill resin UF in this manner, it is possible to alleviate stresses produced at the electrical connection portions of the semiconductor chips and the wiring substrate IP1. Further, it is also possible to alleviate stresses produced at the bonding portions of the plurality of electrodes PDL of the logic chip LC and the plurality of protruding electrodes SBc. Furthermore, it is possible to protect the principal surface of the logic chip LC on which semiconductor elements (circuit elements) are formed.

<Detail of Layout of Power Potential Supply Paths and Signal Transmission Paths>

Next, the layout of the power potential supply paths and the signal transmission paths of the semiconductor device PKG1 of the electronic device EDV1 (see FIG. 1) will be described in detail. First, when a plurality of systems are fabricated in one semiconductor package and electrical characteristics are improved like in the present embodiment, it is necessary to efficiently dispose paths for supplying power for driving the plurality of systems and signal transmission paths for receiving an input of signal currents and outputting signal currents from and to the semiconductor device PKG1.

Hence, the inventors of the present invention first have focused on types of the signal transmission paths as the approach to efficiently dispose the wiring paths. Namely, as illustrated in FIG. 2, the semiconductor device PKG1 according to the present embodiment includes internal interface paths (internal transmission paths) SGN_P1 for transmitting electrical signals inside the semiconductor device PKG1 (more specifically, between the logic chip LC and the memory chips MC). Further, the semiconductor device PKG1 according to the present embodiment includes external interface paths (external transmission paths) SGN_P2 for transmitting electrical signals between the semiconductor device PKG1 and an external device of the semiconductor device PKG1.

When the internal interface paths SGN_P1 and the external interface paths SGN_P2 are both disposed closely, wiring paths become complicated, and it is thus difficult to improve transmission quality of each signal transmission path. In particular, when an operating frequency of each wiring path is increased to improve a transmission rate, a margin of a separation distance between the transmission path and a return path (reference path) is small, and it is thus preferable to simplify the wiring paths as much as possible.

Hence, in the present embodiment, as illustrated in FIG. 1, each of the plurality of memory chips MC is mounted between the extension line of the chip side Scp1 of the logic chip LC and the substrate side Sip1 of the wiring substrate IP1. As described above, most of (or all of) the signal transmission paths of the plurality of memory chips MC are electrically connected with the logic chip LC. Namely, most of (or all of) the signal transmission paths of the plurality memory chips MC are the internal interface paths SGN_P1.

Accordingly, when each of the plurality of memory chips MC is mounted between the extension line of the chip side Scp1 of the logic chip LC and the substrate side Sip1 of the wiring substrate IP1 as illustrated in FIG. 1, wirings constituting the internal interface paths SGN_P1 illustrated in FIG. 2 can be collectively provided between the extension line of the chip side Scp1 and the substrate side Sip1 of the wiring substrate IP1.

Meanwhile, the external interface paths SGN_P2 illustrated in FIG. 2 are electrically connected with the logic chip LC. Accordingly, by collectively providing wirings constituting the external interface paths SGN_P2 between the extension line of the chip side Scp2 of the logic chip LC and the substrate side Sip1 of the wiring substrate IP1 illustrated in FIG. 1, it is possible to separate formation regions of the internal interface paths SGN_P1 and the external interface paths SGN_P2.

Next, the inventors of the present invention have studied a relationship between the power potential supply paths and the signal transmission paths. In particular, the inventors of the present invention have focused on and studied a transmission path in which a large current which often causes a decrease in characteristics of the semiconductor device PKG1 flows. The large current which often causes a decrease in the characteristics of the semiconductor device PKG1 is, for example, a current exceeding 5 A (ampere). In the present embodiment, a current of, for example, 10 A flows in the power potential supply path VDH_P illustrated in FIG. 2, and therefore the power potential supply path VDH_P corresponds to the path in which the large current flows.

One of causes of the decrease in the characteristics of the semiconductor device PKG1 due to the flow of the large current is a rise in the temperature of the semiconductor device PKG1 caused by heat generated when the large current flows in the transmission path.

The heat which causes the rise in the temperature of the semiconductor device PKG1 is Joule heat. Hence, it is possible to reduce the heat generation amount by reducing the resistance in the transmission path. Further, since it is possible to reduce the resistance in the transmission path by increasing a cross sectional area of the transmission path, it is possible to reduce the heat generation amount by increasing the cross sectional area of the power potential supply path VDH_P.

However, in order to increase the cross sectional area of the power potential supply path VDH_P, it is necessary to increase an area of the conductor pattern constituting the power potential supply path VDH_P. In particular, at a portion where the semiconductor device PKG1 and the wiring substrate MB1 illustrated in FIG. 2 are electrically connected, a large number of neighboring terminals LD need to be used as the power potential supply path VDH_P.

Hence, as illustrated in FIG. 8, the terminals LD which are paths for supplying other types of signals or potentials cannot be provided in the region in which the plurality of terminals VHLD constituting the power potential supply path VDH_P are provided. Therefore, the layout design of the terminals LD is restricted.

In this respect, the inventors of the present invention have focused on the point that most of (or all of) the signal transmission paths of the plurality of memory chips MC are the internal interface paths SGN_P1 electrically connected with the logic chip LC. Namely, the internal interface paths SGN_P1 connected to the memory chips MC are only required to be electrically connected with the logic chip LC. Hence, there are only a few transmission paths which directly connect the terminals LD which are the external terminals of the semiconductor device PKG1 and the memory chips MC. Accordingly, by providing the power potential supply paths VDH_P (see FIG. 2) in the region between the extension line of the chip side Scp2 of the logic chip LC and the substrate side Sip1 of the wiring substrate IP1 illustrated in FIG. 1, the layout design of the terminals LD (see FIG. 8) is less likely to be restricted even when the cross sectional area of the power potential supply path VDH_P is increased.

Therefore, as illustrated in FIG. 3, the wiring substrate MB1 of the electronic device EDV1 according to the present embodiment includes the power lines VQW which supply the power potentials VDDQ_M1 and VDDQ_M2 (see FIG. 5) to each of the plurality of memory chips and the power line VHW which supplies the power potential VDDH (see FIG. 5) larger than the power potentials VDDQ_M1 and VDDQ_M2 to the logic chip LC. Further, a width WH of the power line VHW is larger than widths WQ of the power lines VQW. Furthermore, the power line VHW intersects the substrate side Sip1 of the wiring substrate IP1 and extends from the side of the substrate side Sip1 of the wiring substrate IP1 toward a region which overlaps the logic chip LC when seen in a plan view.

In other words, in the electronic device EDV1 according to the present embodiment, the power line VHW which supplies the power potential VDDH (see FIG. 5) to the logic chip LC is routed from the side of the substrate side Sip1 to the region which overlaps the logic chip LC. Consequently, it is possible to increase the width WH of the power line VHW in which a large current flows, and thus possible to increase the cross sectional area of the power potential supply path VDH_P.

As a result, it is possible to reduce the heat generation amount produced by causing the current to flow in the power potential supply path VDH_P, and thus possible to suppress a rise in the temperature of the semiconductor device PKG1. Further, by suppressing the rise in the temperature of the semiconductor device PKG1, it is possible to suppress the decrease in the electrical characteristics of the semiconductor device PKG1 caused by the rise in the temperature. Namely, it is possible to improve reliability of the semiconductor device PKG1 and the electronic device EDV1 which includes the semiconductor device PKG1.

Further, as illustrated in FIG. 9, the logic chip LC of the semiconductor device PKG1 according to the present embodiment includes the plurality of internal interface electrodes IIF constituting the plurality of internal interface paths SGN_P1 for transmitting electrical signals between the logic chip LC and the plurality of memory chips MC (see FIG. 10). Furthermore, the plurality of internal interface electrodes IIF are disposed along the chip side Scp1 (the side closest to the substrate side Sip1 in FIG. 3) among the four sides of the logic chip LC. In other words, the plurality of internal interface electrodes IIF are close to the chip side Scp1 among the four sides of the logic chip LC.

Figure 11:
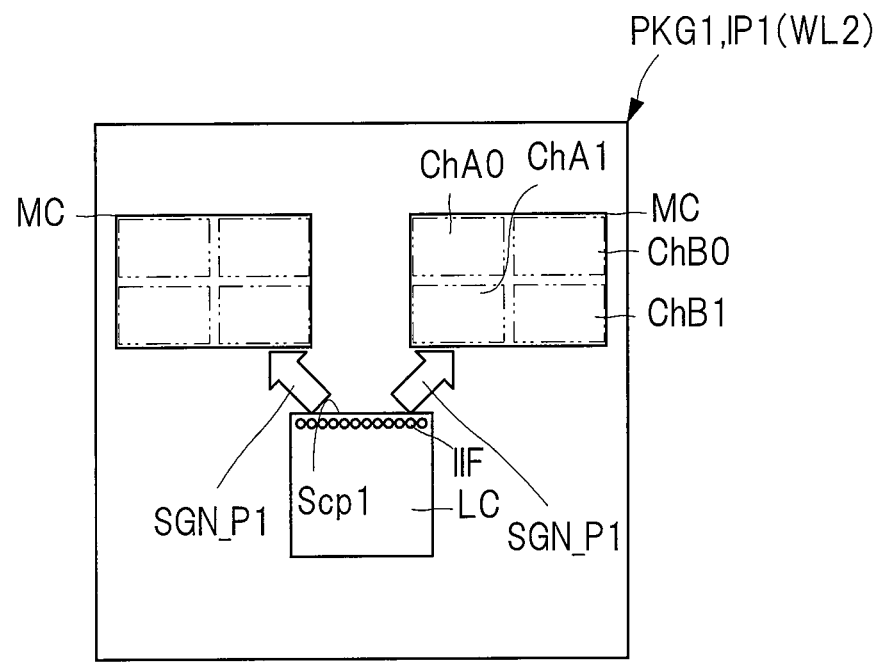
FIG. 11 is an explanatory view illustrating a wiring image of internal interface paths illustrated in FIG. 5.
Figure 12:
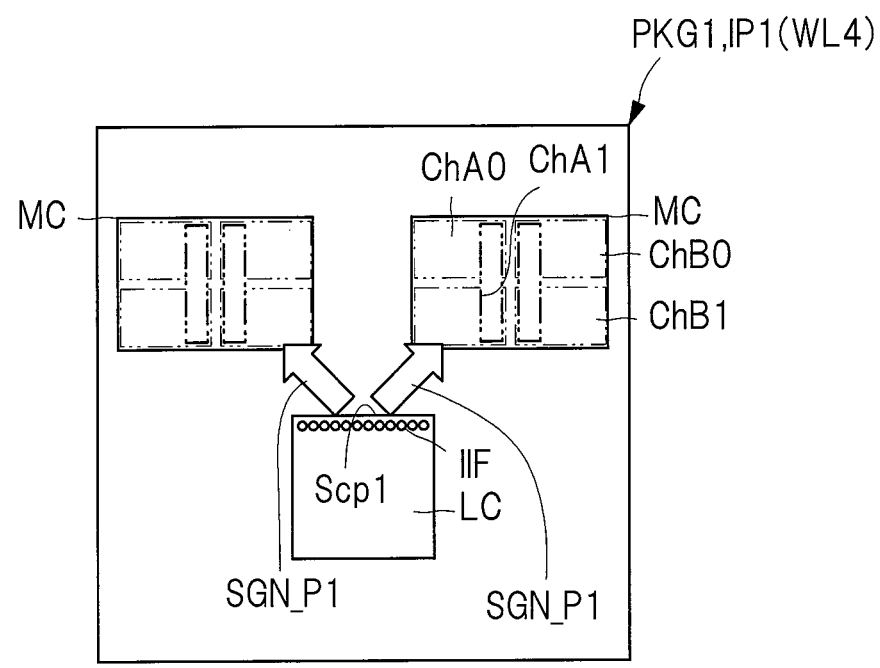
FIG. 12 is an explanatory view illustrating a wiring image of internal interface paths illustrated in FIG. 5.

By providing the plurality of internal interface electrodes IIF close to the chip side Scp1 of the logic chip LC in this manner, it is possible to shorten path distances of the internal interface paths SGN_P1. A wiring layout image according to the present embodiment will be described with reference to FIGS. 11 and 12. FIGS. 11 and 12 are explanatory views illustrating the wiring image of the internal interface paths illustrated in FIG. 5. Note that FIGS. 11 and 12 illustrate the example where a plurality of signal transmission paths are routed in the second wiring layer WL2 and the fourth wiring layer WL4 among the plurality of wiring layers of the wiring substrate IP1.

When the plurality of internal interface electrodes IIF are provided close to the chip side Scp1 of the logic chip LC as illustrated in FIGS. 11 and 12, the distance between the internal interface electrodes IIF and the memory chips MC is shortened, and it is thus possible to shorten the distance of the wiring paths. Further, since the wiring density can be reduced by shortening the distance of the wiring paths, it is possible to easily control the electrical characteristics of the internal interface paths.

For example, in the present embodiment, the internal interface path SGN_P1 adopts the wiring structure referred to as a stripline in which a wiring which transmits signals is surrounded by a conductor pattern. In the case of the stripline structure, a conductor pattern (referred to as a conductor plane below) whose width is larger than the wiring constituting the signal transmission path is formed in the wiring layers just above and below the wiring layer in which the wiring is formed. A reference potential or a power potential is supplied to the conductor plane, for example. Further, in the wiring layer in which the wiring constituting the signal transmission path is formed, the conductor pattern to which the reference potential or the power potential is supplied is separately formed around the wiring. By surrounding the wiring constituting the signal transmission path by the conductor pattern to which the reference potential or the power potential is supplied in this manner, it is possible to suppress electromagnetic waves from spreading.

In this respect, for acquiring the effect of the stripline, it is preferable to control separation distance between the wiring constituting the signal transmission path and the surrounding conductor pattern within a certain range. In the present embodiment, the wiring density can be reduced as described above, and thus the separation distance between the wiring constituting the signal transmission path and the surrounding conductor pattern can be easily controlled when the stripline wiring structure is used. Consequently, it is possible to suppress electromagnetic waves from spreading, and thus possible to improve the electrical characteristics of the internal interface paths SGN_P1.

Note that, when the decrease in the wiring density is not taken into account, the internal interface electrodes IIF can be provided at arbitrary positions of the plurality of electrodes PDL of the logic chip LC illustrated in FIG. 9. Also in this case, it is possible to increase the cross sectional area of the power potential supply path VDH_P as described above.

Further, from a viewpoint of reduction of the wiring density, it is preferable to route the signal transmission paths in different wiring layers as illustrated in FIGS. 11 and 12. For example, when the signal transmission paths are routed in the wiring layer WL2 and the wiring layer WL4 as illustrated in FIGS. 11 and 12, the conductor plane can be disposed between the wiring layers WL2 and WL4. Consequently, for example, even when the signal transmission path routed in the wiring layer WL2 and the signal transmission path routed in the wiring layer WL4 intersect each other in a plan view, it is possible to suppress the decrease in the electrical characteristics.

Note that a more preferable aspect for reducing the wiring density has been illustrated in FIGS. 11 and 12. However, according to a modified example of the present embodiment, a plurality of (a plurality of types of) signal transmission paths may be formed in the same wiring layer.

Further, as illustrated in FIG. 3, the power line VHW of the wiring substrate MB1 according to the present embodiment intersects a line which overlaps the chip side Scp1 of the logic chip LC and extends from the substrate side Sip1 of the wiring substrate IP1 toward the chip side Scp2 of the logic chip LC when seen in a plan view. Namely, in the electronic device EDV1 according to the present embodiment, the power line VHW which supplies the power potential VDDH (see FIG. 5) to the logic chip LC is routed to the region which overlaps the logic chip LC and is directly below the logic chip LC.

Consequently, it is possible to linearly form the power potential supply path VDH_P which supplies the power potential VDDH (see FIG. 5) to the logic chip LC in the thickness direction of the wiring substrate IP1 as illustrated in FIG. 2. By linearly forming the power potential supply path VDH_P from the region directly below the logic chip LC toward the logic chip LC in this manner, it is possible to shorten the distance of the power potential supply path VDH_P in the thickness direction. As a result, it is possible to reduce the heat generation amount generated by causing the current to flow in the power potential supply path VDH_P, and thus possible to suppress a rise in the temperature of the semiconductor device PKG1.

Further, when the plurality of internal interface electrodes IIF (see FIG. 9) are provided close to the chip side Scp1 of the logic chip LC as described above, it is preferable to increase a distance between the internal interface path SGN_P1 and the power potential supply path VDH_P. In the present embodiment, since the power line VHW is routed to the region which overlaps the logic chip LC and is directly below the logic chip LC, it is possible to easily increase the distance between the internal interface path SGN_P1 and the power potential supply path VDH_P.

Note that, according to a modified example of the present embodiment, the power line VHW illustrated in FIG. 3 may be routed to the region between the substrate side Sip1 and a line which overlaps the chip side Scp1 of the logic chip LC instead of being routed to the region which overlaps the logic chip LC.

Further, as illustrated in FIG. 8, the wiring substrate IP1 according to the present embodiment includes the power plane (power conductor pattern) VQP which is formed on the lower surface IPb and supplies the power potential VDDQ (see FIG. 5) to each of the plurality of memory chips MC. Furthermore, the wiring substrate IP1 includes the power plane (power conductor pattern) VHP which is formed on the lower surface IPb and supplies the power potential VDDH (see FIG. 5) larger than the power potential VDDQ to the logic chip LC. Also, the width WH of the power plane VHP is larger than the width WQ of the power plane VQP. Moreover, the power plane VHP extends from the side of the substrate side Sip1 of the wiring substrate IP1 toward the region which overlaps the logic chip LC when seen in a plan view.

According to a modified example of the present embodiment, the power plane VHP to which the plurality of terminals LD are connected may not be used as the terminals LD of the wiring substrate IP1 of the semiconductor device PKG1. Also in this case, it is possible to reduce the cross sectional area of the power potential supply path VDH_P illustrated in FIG. 2 by increasing the number of terminals LD connected to the power line VHW.

However, by providing the power plane VHP to the lowermost wiring layer WL10 (see FIG. 6) on which the terminals LD are formed among the plurality of wiring layers of the wiring substrate IP1 like in the present embodiment, it is possible to reduce the heat generation amount at portions where the wiring substrate IP1 and the wiring substrate MB1 are electrically connected.

Also, when there is the power plane VHP extending from the side of the substrate side Sip1 toward the region which overlaps the logic chip LC like in the present embodiment, it is possible to increase the cross sectional area of the power potential supply path VDH_P even if, for example, a routing distance of the power line VHW illustrated in FIG. 2 is short. For example, when the power line VHW illustrated in FIG. 3 is routed to the region between the substrate side Sip1 and the line which overlaps the chip side Scp1 of the logic chip LC instead of being routed to the region which overlaps the logic chip LC, the resistance of the power line VHW becomes high. However, by providing the power plane VHP extending from the side of the substrate side Sip1 toward the region which overlaps the logic chip LC, it is possible to increase the cross sectional area of the power potential supply path VDH_P.

Further, as illustrated in FIG. 8, the power plane VHP of the wiring substrate IP1 according to the present embodiment intersects the line which overlaps the chip side Scp1 of the logic chip LC and extends from the substrate side Sip1 of the wiring substrate IP1 toward the chip side Scp2 of the logic chip LC when seen in a plan view. Namely, in the electronic device EDV1 according to the present embodiment, the power plane VHP which supplies the power potential VDDH (see FIG. 5) to the logic chip LC is routed to the region which overlaps the logic chip LC and is directly below the logic chip LC.

Consequently, for example, even when the routing distance of the power line VHW is short, it is possible to linearly form the power potential supply path VDH_P illustrated in FIG. 2 in the thickness direction of the wiring substrate IP1. Further, by routing the power plane VHP to the region which overlaps the logic chip LC and is directly below the logic chip LC as described above, it is possible to easily increase the distance between the internal interface paths SGN_P1 and the power potential supply path VDH_P.

Furthermore, as described with reference to FIGS. 11 and 12, when the signal transmission paths are routed to the second wiring layer WL2 and the fourth wiring layer WL4 among the plurality of wiring layers of the wiring substrate IP1, the internal interface path SGN_P1 is not formed in the wiring layers WL6, WL7, WL8, WL9 and WL10 on the side closer to the lower surface IPb than the core layer CR illustrated in FIG. 6.

Meanwhile, as illustrated in FIG. 6, the power potential supply path VDH_P is routed to the region which is directly below the logic chip LC in the wiring layers WL6, WL7, WL8, WL9 and WL10 on the side closer to the lower surface IPb than the core layer CR. In the example illustrated in FIG. 6, the power potential supply path VDH_P is routed to the region directly below the logic chip LC by the power plane VHP formed in the wiring layer WL10.

In this case, the core layer CR made of the prepreg material is interposed between the conductor plane constituting the power potential supply path VDH_P and the internal interface path SGN_P1. Consequently, it is possible to reduce an influence of noise due to the large current flowing in the power potential supply path VDH_P.

The plurality of internal interface paths SGN_P1 illustrated in FIGS. 11 and 12 include signal transmission paths for high speed operation. Operating frequencies of the plurality of internal interface paths SGN_P1 take various values, but part of the plurality of internal interface paths SGN_P1 are operated at higher frequencies than those of the others of the plurality of internal interface paths SGN_P1. For example, the data signals SGN_DAT and the clock signals SGN_CLK illustrated in FIG. 5 are operated at particularly high frequencies. Further, part of the control signals SGN_CTL are also operated at high frequencies. When a data transfer rate is to be increased, a data bus width is increased, or the operating frequencies of the internal interface paths SGN_P1 for transmitting these electrical signals are increased. Meanwhile, command signals such as chip select signals and write enable signals of the control signals SGN_CTL1 illustrated in FIG. 5 can be operated at relatively low frequencies because the input frequency of command is low.

When the operating frequencies of the internal interface paths SGN_P1 are increased as described above, it is particularly preferable to reduce a noise influence by interposing the core layer CR between the conductor plane constituting the power potential supply path VDH_P and the internal interface path SGN_P1.

Further, as illustrated in FIG. 3, the wiring substrate MB1 according to the present embodiment includes the plurality of power lines VQW provided on both neighboring sides of the power line VHW. Furthermore, the plurality of power lines VQW intersect the substrate side Sip1 of the wiring substrate IP1 and extend from the substrate side Sip1 of the wiring substrate IP1 along the power line VHW.

Namely, in the electronic device EDV1 according to the present embodiment, the plurality of power lines VQW which supply the power potentials VDDQ (see FIG. 5) to the memory chips MC and the power line VHW which supplies the power potential VDDH (see FIG. 5) to the logic chip LC are collectively disposed on the side of the substrate side Sip1 of the wiring substrate IP1. By collectively disposing the power potential supply paths in this manner, it is possible to further reduce the restriction on the layout design of the signal transmission paths.

Further, in the example illustrated in FIG. 3, each of the plurality of power lines VQW extends from the side of the substrate side Sip1 of the wiring substrate IP1 to the regions which overlap the plurality of memory chips MC when seen in a plan view. Furthermore, the power line VHW is disposed between the regions which overlap the plurality of memory chips MC when seen in a plan view.

As described above, there are only a few transmission paths which directly connect the terminals LD which are the external terminals of the semiconductor device PKG1 and the memory chips MC. Consequently, according to a modified example of the present embodiment, the power line VHW and the regions directly below the memory chips MC may overlap. However, in the present embodiment, the power line VHW is disposed between the regions which overlap the plurality of memory chips MC when seen in a plan view, and is not formed in the regions which overlap the plurality of memory chips MC when seen in a plan view.

Consequently, it is possible to dispose the plurality of power lines VQW which supply the power potentials VDDQ (see FIG. 5) to the memory chips MC at arbitrary positions directly below the memory chips MC. Since values of current flowing in the power lines VQW are small compared to the power line VHW, the power lines VQW have a relatively small influence on the rise in the temperature of the semiconductor device PKG1. However, as illustrated in FIG. 7, by routing the power potential supply paths VDQ_P which supply the power potentials VDDQ (see FIG. 5) to the memory chips MC to the regions directly below the memory chips MC, it is possible to shorten the distances of the power potential supply paths VDQ_P in the thickness direction. As a result, it is possible to reduce power supply loss and suppress a fluctuation of a drive voltage for driving the input/output circuit CAC illustrated in FIG. 5.

Also, as illustrated in FIG. 8, the wiring substrate IP1 according to the present embodiment includes the plurality of power planes VQP provided on both neighboring sides of the power plane VHP. Further, the plurality of power planes VQP intersect the substrate side Sip1 of the wiring substrate IP1 and extend from the substrate side Sip1 of the wiring substrate IP1 along the power plane VHP when seen in a plan view.

Namely, in the semiconductor device PKG1 according to the present embodiment, the plurality of power planes VQP which supply the power potentials VDDQ (see FIG. 5) to the memory chips MC and the power line VHW which supplies the power potential VDDH (see FIG. 5) to the logic chip LC are collectively disposed on the side of the substrate side Sip1 of the wiring substrate IP1. By collectively disposing the power potential supply paths in this manner, it is possible to further reduce the restriction on the layout design of the signal transmission paths.

Also, in the example illustrated in FIG. 8, each of the plurality of power planes VQP extends from the side of the substrate side Sip1 of the wiring substrate IP1 to the regions which overlap the plurality of memory chips MC when seen in a plan view. Furthermore, the power line VHW is disposed between the regions which overlap the plurality of memory chips MC when seen in a plan view.

According to a modified example of the present embodiment, similarly to the power lines VHW and VQW described above, the power plane VHP and the regions directly below the memory chips MC may overlap. However, in the present embodiment, the power plane VHP is disposed between the regions which overlap the plurality of memory chips MC when seen in a plan view, and is not formed in the regions which overlap the plurality of memory chips MC in a plan view.

Consequently, it is possible to dispose the plurality of power planes VQP which supply the power potentials VDDQ (see FIG. 5) to the memory chips MC at arbitrary positions directly below the memory chips MC. Further, as illustrated in FIG. 7, by routing the power potential supply paths VDQ_P which supply the power potentials VDDQ (see FIG. 5) to the memory chips MC to the regions directly below the memory chips MC, it is possible to shorten the distances of the power potential supply paths VDQ_P in the thickness direction. As a result, it is possible to reduce power supply loss and suppress a fluctuation of a drive voltage for driving the input/output circuit CAC illustrated in FIG. 5.

Further, as illustrated in FIG. 3, the power supply device RGL1 which supplies the power potential VDDH (see FIG. 5) is mounted on the upper surface MBt of the wiring substrate MB1, and the power supply device RGL1 is mounted on an extension line of the power line VHW. By mounting the power supply device RGL1 on the extension line of the power line VHW in this manner, it is possible to linearly dispose the power line VHW. Consequently, it is possible to shorten a wiring routing distance of the power line VHW, and thus possible to reduce power supply loss in the wiring path of the power line VHW.

Further, as illustrated in FIG. 8, in the present embodiment, the region in which the internal interface paths SGN_P1 (see FIG. 11) are formed and the region in which the external interface paths SGN_P2 are formed are separated when seen in the plan view of the wiring substrate IP1. Furthermore, the power potential supply paths are collectively disposed in the region in which the internal interface paths SGN_P1 are formed. The above configuration can be expressed as follows from a viewpoint of the distribution in accordance with type of the plurality of terminals (lands) LD.

Namely, the lower surface IPb of the wiring substrate IP1 includes a region DA1 which is provided between the substrate side Sip1 and the line which overlaps the extension line of the chip side Scp1 and a region DA2 which is provided between the substrate side Sip2 and the line which overlaps the extension line of the chip side Scp2. Further, the plurality of terminals LD include a plurality of terminals (power lands) VQLD which supply the power potentials VDDQ (see FIG. 5) to each of the plurality of memory chips MC. Furthermore, the plurality of terminals LD include a plurality of terminals VHLD (power lands) which supply the power potentials VDDH (see FIG. 5) larger than the power potential VDDQ to the logic chip LC. Also, the plurality of terminals LD include a plurality of terminals (signal lands) SGLD which transmit and receive electrical signals to and from the logic chip LC. Moreover, the number of the plurality of terminals SGLD is larger than the total number of the plurality of terminals VQLD and the plurality of terminals VHLD in the region DA2.

By separating the region DA1 which is mainly provided with the terminals VQLD and VHLD which supply the power potentials and the region DA2 which is mainly provided with the terminals SGLD which transmit the electrical signals in the lower surface IPb of the wiring substrate IP1 as described above, it is possible to reduce a noise influence of power potential supply paths on the external interface paths SGN_P2.

The external interface paths SGN_P2 include, for example, a differential signal transmission path which transmits electrical signals by using a differential pair. The technique of transmitting electrical signals by using a differential pair is a technique of stabilizing a signal waveform, and is applied particularly to increase the transmission rate of an electrical signal. In the present embodiment, a differential signal is transmitted to the differential signal transmission path included in the external interface paths SGN_P2 at a transmission rate of 1.6 Gbps or more. Hence, when the external interface paths SGN_P2 include the differential signal transmission path, it is particularly preferable to reduce a noise influence by separating the region DA1 and the region DA2 described above.

Also, an effect of reducing a noise influence by separating the region DA1 and the region DA2 described above can be considered independently from the method for routing the power line VHW and the power lines VQW described with reference to FIG. 3 and the presence or absence of the power plane VHP and the power planes VQP illustrated in FIG. 8.

<Manufacturing Method of Semiconductor Device>

Figure 13:
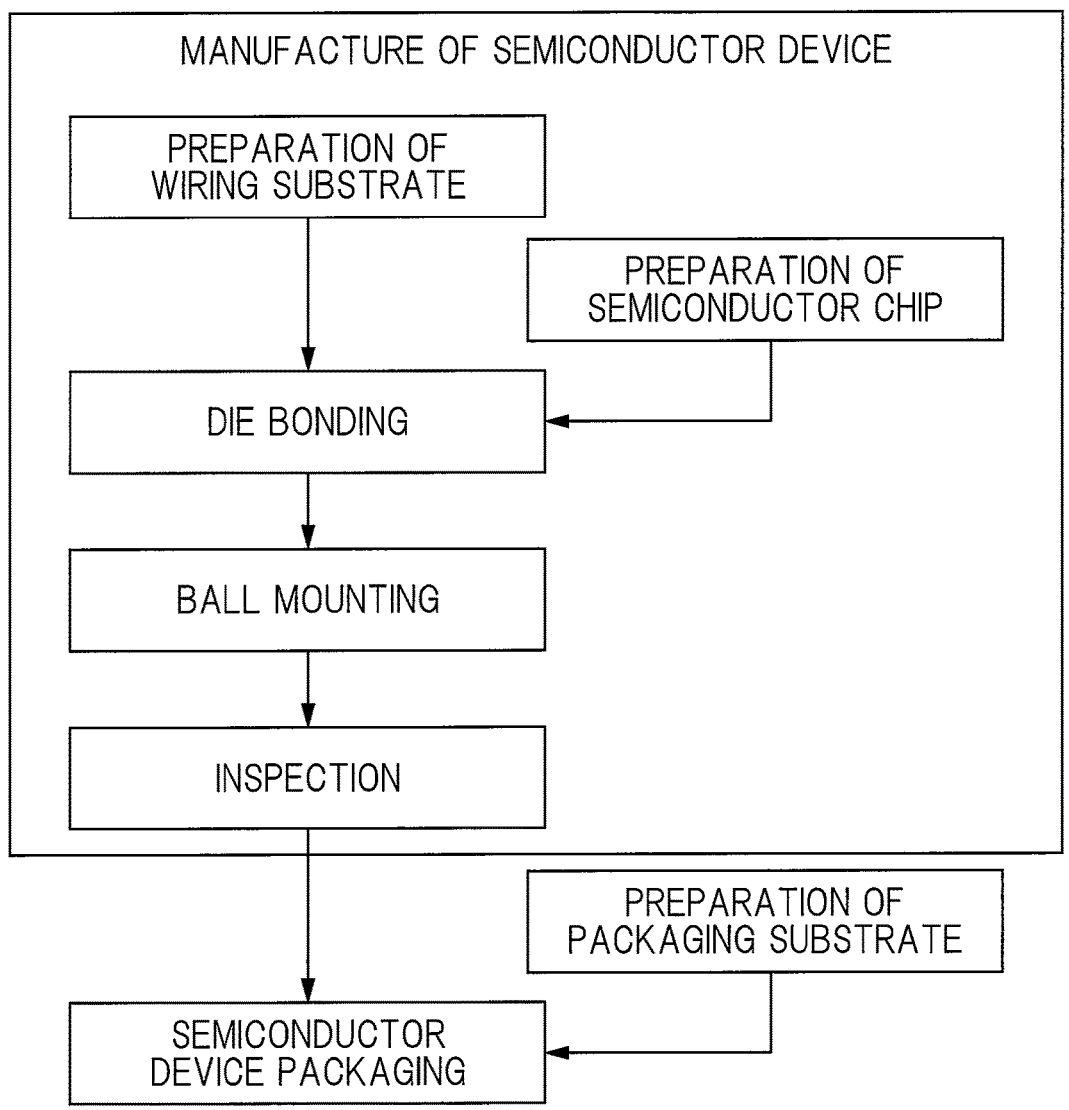
FIG. 13 is an explanatory view illustrating an outline of a manufacturing process of the semiconductor device described with reference to FIGS. 1 to 12.

Next, a manufacturing process of the semiconductor device PKG1 described with reference to FIGS. 1 to 12 will be described. The semiconductor device PKG1 is manufactured according to a flow illustrated in FIG. 13. FIG. 13 is an explanatory view illustrating an outline of the manufacturing process of the semiconductor device described with reference to FIGS. 1 to 12. Note that FIG. 13 illustrates the process of manufacturing the semiconductor device and then mounting the semiconductor device on the mother board, thereby manufacturing the electronic device illustrated in FIG. 1.

Note that a method for preparing the wiring substrate IP1 formed in a product size in advance and manufacturing the semiconductor device PKG1 corresponding to one layer will be described as the manufacturing method below. However, according to a modified example, a multipiece method in which a so-called multipiece substrate partitioned into a plurality of product formation regions is prepared, semiconductor devices are assembled in each of the plurality of product formation regions, and then the plurality of semiconductor devices are obtained by dividing the substrate for each product formation region is also applicable. In this case, a singulating process of cutting and dividing the multipiece substrate for each product formation region is added after a ball mounting process illustrated in FIG. 13 or an electrical testing process.

1. Wiring Substrate Preparing Process

Figure 14:
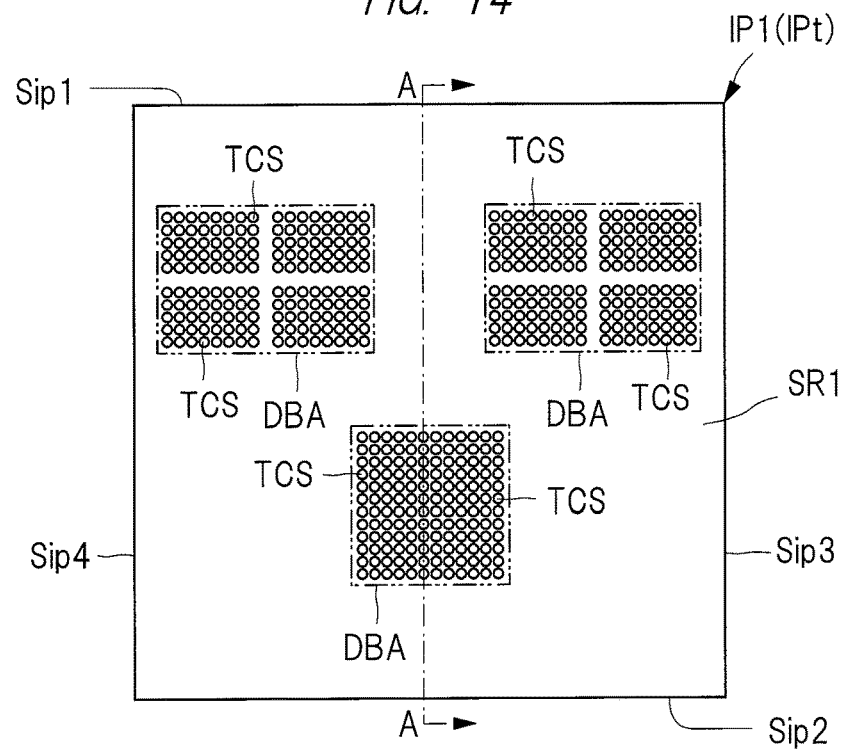
FIG. 14 is a plan view illustrating a chip mounting surface of a wiring substrate prepared in a wiring substrate preparing process illustrated in FIG. 13.

First, the wiring substrate IP1 illustrated in FIG. 14 is prepared in the wiring substrate preparing process in FIG. 13. FIG. 14 is a plan view illustrating a chip mounting surface of the wiring substrate prepared in the wiring substrate preparing process illustrated in FIG. 13. Note that a cross section along a line A-A in FIG. 14 is the same as the cross section from which the logic chip LC, the underfill resins UF and the plurality of solder balls SBp illustrated in FIG. 6 are removed, and therefore will be described with reference to FIGS. 6 and 7.

As illustrated in FIG. 14, the upper surface IPt of the wiring substrate IP1 includes a plurality of chip mounting regions DBA which are the regions on which the plurality of semiconductor chips are mounted in the semiconductor chip mounting process illustrated in FIG. 13. Note that the chip mounting regions DBA are scheduled regions on which the logic chip LC and the plurality of memory chips MC illustrated in FIG. 1 are to be mounted, and may not include visible boundaries. FIG. 14 illustrates two-dot chain lines indicating positions of the chip mounting regions DBA to indicate the boundaries of the chip mounting regions DBA.

Further, a plurality of bonding pads TCS are formed on each of the plurality of chip mounting regions DBA. The plurality of bonding pads TCS are electrode terminals which are electrically connected with the logic chip LC (see FIG. 6) and the memory chips MC (see FIG. 7) through the protruding electrodes SBc illustrated in FIGS. 6 and 7 in a die bond mounting process illustrated in FIG. 13.

Note that FIG. 14 illustrates an example where the bonding pads TCS are arranged in the grid pattern as an arrangement example of the bonding pads TCS. However, there are various modified examples of arrangement of the bonding pads TCS. As one example, the bonding pads TCS may be arranged along peripheral portions of the chip mounting regions DBA without forming the bonding pads TCS at centers of the chip mounting regions DBA.

The wiring structure of the wiring substrate IP1 illustrated in FIG. 14 has already been described with reference to FIGS. 1 to 12, and thus redundant descriptions will be omitted. However, the solder balls SBp illustrated in FIGS. 6 and 7 are not connected in this process. In the method for manufacturing the wiring substrate IP1 including the core layer CR which is a core material according to the present embodiment, the wiring substrate IP1 can be manufactured by laminating the wiring layers by a build-up process on the upper surface side and the lower surface of the core layer CR serving as a base material in which a plurality of through-hole wirings TW have been formed. Further, when the core material is not used, the wiring substrate can be manufactured by laminating a plurality of wiring layers on a base material (not illustrated) and then peeling the base material.

2. Die Bonding Process

Figure 15:
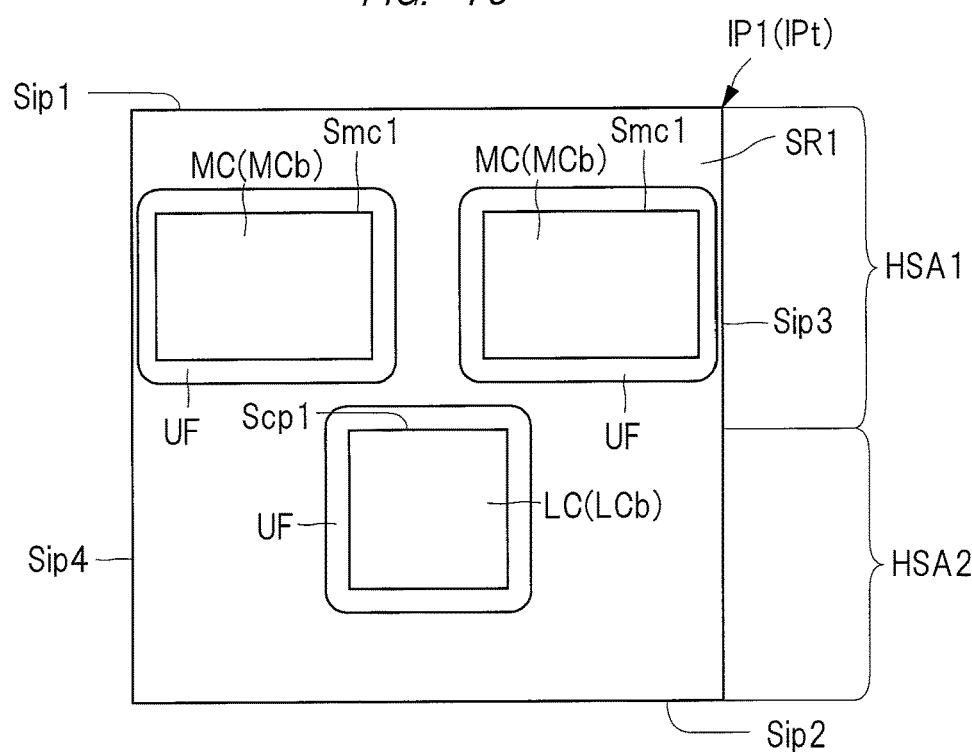
FIG. 15 is a plan view illustrating a state where a plurality of semiconductor chips are mounted on the wiring substrate illustrated in FIG. 14.

Next, in the die bonding process illustrated in FIG. 13, the logic chip LC and the plurality of memory chips MC are mounted on the upper surface IPt of the wiring substrate IP1 as illustrated in FIG. 15. FIG. 15 is a plan view illustrating a state where the plurality of semiconductor chips are mounted on the wiring substrate illustrated in FIG. 14. Note that the cross section along the line A-A in FIG. 14 is the same as the cross section from which the plurality of solder balls SBp illustrated in FIG. 6 are removed, and therefore will be described with reference to FIGS. 6 and 7.

In this process, the logic chip LC illustrated in FIG. 9 and the memory chips MC illustrated in FIG. 10 are prepared (semiconductor chip preparing process), and are mounted on the chip mounting regions DBA (see FIG. 14) of the wiring substrate IP1. In the example illustrated in FIGS. 15 and 6, the logic chip LC is mounted by the so-called face-down mounting method in a state where the top surface LCt of the logic chip LC (see FIG. 6) and the upper surface IPt of the wiring substrate IP1 face each other. Further, in the example illustrated in FIGS. 15 and 7, the memory chips MC are mounted by the so-called face-down mounting method in a state where the top surfaces MCt of the memory chips MC (see FIG. 7) and the upper surface IPt of the wiring substrate IP1 face each other.

Furthermore, in this process, as illustrated in FIG. 6, the plurality of electrodes PDL formed on the side of the top surface LCt of the logic chip LC and the plurality of bonding pads TCS of the wiring substrate IP1 are electrically connected through the plurality of protruding electrodes SBc. Also, as illustrated in FIG. 7, the plurality of electrodes PDM formed on the side of the top surfaces MCt of the memory chips MC and the plurality of bonding pads TCS of the wiring substrate IP1 are electrically connected through the plurality of protruding electrodes SBc.

When the plurality of bonding pads TCS are disposed in the grid pattern like in the present embodiment, solder bumps formed by molding a solder material into a spherical shape are used as the plurality of protruding electrodes SBc in many cases. However, the protruding electrodes SBc are not limited to the solder bumps, and pillar bumps formed by molding a metal material such as copper into a columnar shape may be used, for example.

Further, in this process, the underfill resins (insulation resins) UF are disposed between the logic chip LC and the wiring substrate IP1 and between the plurality of memory chips MC and the wiring substrate IP1, respectively. The underfill resins UF are disposed to seal the electrical connection portions (bonding portions of the plurality of protruding electrodes SBc) of the semiconductor chips and the wiring substrate IP1. By disposing the underfill resins UF to seal the connection portions of the plurality of protruding electrodes SBc in this manner, it is possible to alleviate stresses produced at the electrical connection portions of the logic chip LC and the wiring substrate IP1.

There are roughly two types of methods for forming the underfill resins UF. According to a pre-pasting method which is a first method, the underfill resins UF are disposed on the chip mounting regions DBA (see FIG. 14) before the semiconductor chips are mounted. Next, the logic chip LC is pressed from above the underfill resin UF to electrically connect the wiring substrate IP1 and the logic chip LC. Thereafter, the underfill resins UF are cured. Note that, in the case of this method in which resin materials are disposed before mounting the semiconductor chips, it is possible to use not only paste resin materials described above but also film resin materials.

Also, according to a post-injection method which is a second method, the logic chip LC and the wiring substrate IP1 are electrically connected before the underfill resins UF are disposed. Thereafter, a liquid resin is injected into a gap between the logic chip LC and the wiring substrate IP1, and is then cured. In this process, any one of the pre-pasting method and the post-injecting method may be used.

Further, as is clear from comparison between FIGS. 6 and 7, the thickness of the memory chip MC (separation distance between the top surface MCt and the back surface MCb) is larger than the thickness of the logic chip LC (separation distance between the top surface LCt and the back surface LCb). In this case, as an order of mounting the semiconductor chips, it is preferable to mount the relatively thin logic chip LC and then mount the memory chip MC. Consequently, it is possible to prevent mounting jigs (not illustrated) from contacting the already mounted semiconductor chips when mounting the semiconductor chip to be mounted later.

Hence, in the present embodiment, the logic chip LC is first mounted. The logic chip LC is mounted on the wiring substrate IP1 such that the chip side Scp1 is arranged along the substrate side Sip1 of the wiring substrate IP1. Next, the plurality of memory chips MC are mounted side by side between the substrate side Sip1 of the wiring substrate IP1 and an extension line of the chip side Scp1 of the logic chip LC. In the example illustrated in FIG. 15, each of the plurality of memory chips MC is mounted on the wiring substrate IP1 such that the chip side Smc1 which is the long side among the four sides constituting the peripheral portion of each memory chip whose planar shape is rectangular is arranged along the substrate side Sip1.

Further, when the thickness of the logic chip LC and the thickness of the memory chip MC are different like in the present embodiment, the height of the back surface LCb of the logic chip LC and the height of the back surface MCb of the memory chip MC are different. In this case, when a heat radiation member such as a heatsink (not illustrated) is closely attached to the back surface LCb of the logic chip LC, it is necessary to take into account the height of the back surface MCb of the memory chip MC.

Although not illustrated, when the memory chips MC are disposed so as to surround the logic chip LC, a planar area of the heat radiation member which is placed in contact with the logic chip LC is limited. However, as illustrated in FIG. 15, according to the present embodiment, the memory chips MC are not mounted between the chip side Scp1 of the logic chip LC and the substrate side Sip2. Consequently, when the heat radiation member is placed in contact with the back surface LCb of the logic chip LC, it is possible to increase a planar area of the heat radiation member by widening the heat radiation member to a region HSA2 on an opposite side of a region HSA1 on the side closer to the substrate side Sip1 relative to the chip side Scp1 of the logic chip LC. Note that the planar area of the heat radiation member can be determined in accordance with demanded heat radiation characteristics. Further, it is also possible to place the heat radiation member in contact with both of the logic chip LC and the memory chips MC. Namely, according to the present embodiment, a part higher than the back surface LCb of the logic chip LC is not disposed in the region HSA2 illustrated in FIG. 15, so that it is possible to improve the degree of freedom of a heat radiation design.

3. Ball Mounting Process

Next, in the ball mounting process illustrated in FIG. 13, a plurality of solder balls SBp are attached on the side of the lower surface IPb of the wiring substrate IP1 as illustrated in FIGS. 6 and 7. In this process, the solder balls SBp are disposed on the terminals LD exposed through the insulation film SR2 illustrated in FIGS. 6 and 7, and are subjected to reflow processing (processing of heating the solder balls, melting and bonding solder components and then cooling the solder components) to bond the solder balls SBp to the terminals LD. Note that, when the solder balls SBp are not used as conductive materials which electrically connect the wiring substrate MB1 and the semiconductor device PKG1 illustrated in FIG. 1, this process may be omitted. Alternatively, in this process, instead of the solder balls SBp, metal films such as thin solder films may be formed on exposed surfaces of the terminals LD.

4. Inspecting Process

Next, in the inspecting process illustrated in FIG. 13, inspection objects to which the plurality of solder balls SBp have been bonded in the ball mounting process illustrated in FIG. 13 are inspected. In this process, external appearance inspection and an electrical test of circuits formed in the inspection objects are conducted. Further, in this process, it is determined whether or not the inspection objects pass the inspection based on an evaluation criterion for each inspection item prepared in advance. Then, the inspection objects which have been determined to pass the inspection are obtained as the semiconductor devices PKG1 illustrated in FIGS. 6 and 7.

The semiconductor device PKG1 having passed the inspection is conveyed for a semiconductor device packaging process illustrated in FIG. 13. Note that, when the semiconductor device packaging process is carried out at a different facility from the facility where the inspecting process has been conducted, a wrapping process of wrapping the semiconductor devices PKG1 and a shipping process of shipping the semiconductor devices PKG1 to the different facility may be carried out after the inspecting process.

5. Semiconductor Device Packaging Process

Next, in the semiconductor device packaging process illustrated in FIG. 13, the semiconductor device PKG1 is mounted on the wiring substrate MB1 as illustrated in FIG. 1. In this process, the wiring substrate MB1 illustrated in FIG. 3 is prepared (packaging substrate preparing process), and the semiconductor device PKG1 illustrated in FIG. 1 is mounted on the upper surface MBt of the wiring substrate MB1.

As illustrated in FIG. 3, the plurality of terminals CN for connecting the semiconductor device PKG1 are formed on the upper surface (mounting surface) MBt of the wiring substrate MB1. The semiconductor device PKG1 includes the plurality of solder balls SBp which are external terminals. Note that the power supply device (regulator) RGL1 may be mounted on the wiring substrate MB1 in advance at a stage of the packaging substrate preparing process. Alternatively, the power supply device RGL1 may be mounted just before the semiconductor device PKG1 is mounted. Note that, although it is also possible to mount the power supply device RGL1 after the semiconductor device PKG1 is mounted, the power supply device RGL1 is preferably mounted prior to the semiconductor device PKG1 when the thickness of the power supply device RGL1 is smaller than the thickness of the semiconductor device PKG1 as illustrated in FIG. 2.

In the present embodiment, as illustrated in FIG. 1, the semiconductor device PKG1 is mounted such that the substrate side Sip1 of the wiring substrate IP1 of the semiconductor device PKG1 faces the power supply device RGL1 mounted on the wiring substrate MB1.

In this process, for example, by bonding the plurality of solder balls SBp of the semiconductor device PKG1 to the plurality of terminals CN of the wiring substrate MB1, respectively, as illustrated in FIG. 4, the semiconductor device PKG1 and the wiring substrate MB1 are electrically connected with each other. More specifically, a plurality of solder members (e.g. cream solders (not illustrated)) are applied to exposed surfaces of the plurality of terminals CN. Thereafter, the plurality of solder members and the plurality of solder balls SBp of the semiconductor device PKG1 are placed in contact with each other. Subsequently, the solder members and the solder balls SBp are subjected to heating processing (reflow processing) in a state where the solder members and the solder balls SBp are in contact, so that the solder members and the solder balls SBp are integrated. Thus, the plurality of terminals LD of the semiconductor device PKG1 and the plurality of terminals CN of the wiring substrate MB1 are electrically connected through the plurality of solder balls SBp.

Further, when electronic parts such as the capacitors CC1 illustrated in FIG. 2 other than the semiconductor device PKG1 are mounted, the electronic parts can be mounted before the semiconductor device PKG1 is mounted or after the semiconductor device PKG1 is mounted.

Note that, when electronic parts such as the capacitors CC1 which are electrically connected with terminals are mounted by using solders for mounting, the reflow processing needs to be performed. In this case, by performing the reflow processing all at once, it is possible to use a common material as the solder member for mounting each electronic part.

Modified Example

In the foregoing, the invention made by the inventors of the present invention has been concretely described based on the embodiments. However, it is needless to say that the present invention is not limited to the foregoing embodiments and various modifications and alterations can be made within the scope of the present invention.

Modified Example 1

Figure 16:
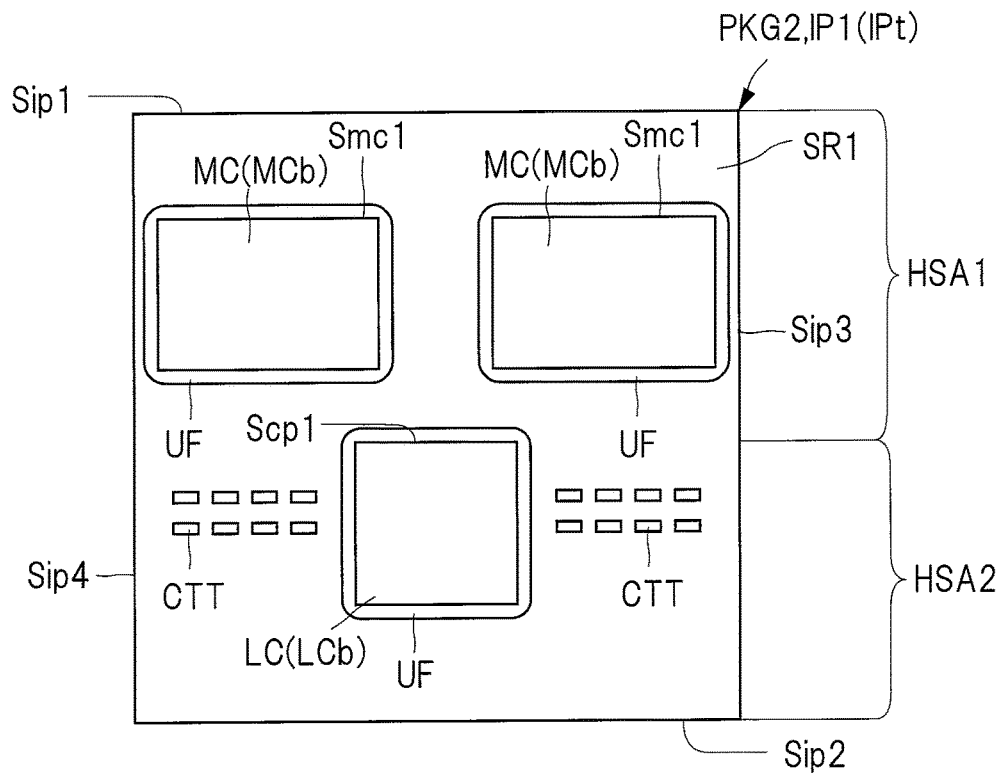
FIG. 16 is a plan view illustrating a modified example of a semiconductor device PKG1 illustrated in FIG. 1.

For example, an example where the logic chip LC and the two memory chips MC are mounted on the wiring substrate IP1 and electronic parts other than the semiconductor chips are not mounted has been described in the embodiment above. However, according to the modified example of the embodiment above, electronic parts (including other semiconductor chips) other than the logic chip LC and the memory chips MC may be mounted. FIG. 16 is a plan view illustrating the modified example of the semiconductor device PKG1 illustrated in FIG. 1. Further, FIG. 17 is an explanatory view illustrating a wiring image according to a modified example of the signal transmission paths illustrated in FIG. 12.

Figure 17:
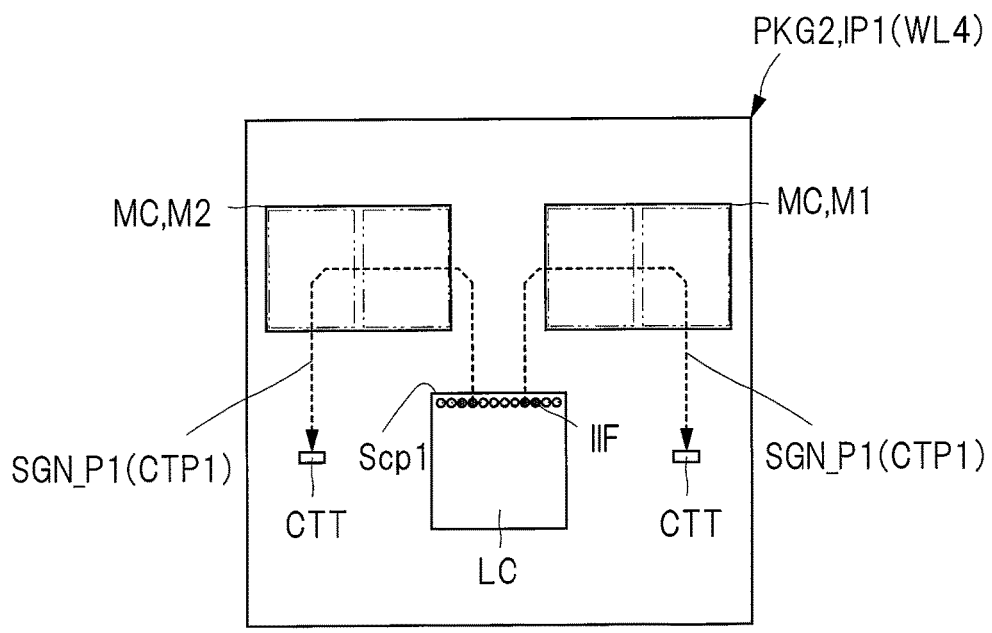
FIG. 17 is an explanatory view illustrating a wiring image according to a modified example of control signal transmission paths illustrated in FIG. 12.

A semiconductor device PKG2 illustrated in FIGS. 16 and 17 differs from the semiconductor device PKG1 illustrated in FIG. 1 in that a plurality of capacitors CTT are mounted on the wiring substrate IP1. As illustrated in FIG. 17, the plurality of capacitors CTT are termination power capacitors which are connected at terminal ends of the control signal transmission paths CTP1. The example illustrated in FIG. 17 includes the path output from the logic chip LC and connected to the capacitor CTT through the memory chip M1 and the path output from the logic chip LC and connected to the capacitor CTT through the memory chip M2.

When a memory circuit is driven to receive an input of data or output data, a method in which a timing to determine a data input/output is the rise of an external synchronization clock and the fall of an external synchronization clock is referred to as a DDR (Double Data Rate) method. According to the DDR method, a voltage which is half the voltage for driving the memory circuit is connected to a terminal end of the output from the memory circuit in order to stabilize a signal waveform.

There are a plurality of types of the DDR method, and in the case of a LPDDR (Low Power DDR) 4 method, functions of termination power supply for various signals in addition to those for data signals are provided in the memory chips MC. Therefore, termination power capacitors may not be mounted on the wiring substrate IP1 like in the embodiment illustrated in FIG. 1. However, capacitors may be mounted for a purpose of bypass capacitors in some cases. Meanwhile, in the case of the method in which functions of termination power supply are not incorporated, termination power supplies are connected to terminal end portions of outputs from the memory chips MC through termination resistors (not illustrated).

In this regard, as illustrated in FIG. 16, the plurality of memory chips MC are collectively mounted in the region HSA1 between the chip side Scp1 of the logic chip LC and the substrate side Sip1. Hence, the region HSA2 between the chip side Scp1 of the logic chip LC and the substrate side Sip2 has a wide space around the logic chip LC. Accordingly, in this modified example, the plurality of capacitors CTT are mounted in the region HSA2 so as to prevent the increase in size of the semiconductor device PKG2 caused by mounting the capacitors CTT.

More specifically, the plurality of capacitors CTT are mounted between the substrate side Sip3 and the chip side Scp3 of the logic chip LC and between the substrate side Sip4 and the chip side Scp4 of the logic chip LC when seen in a plan view.

Note that, in FIGS. 16 and 17, the example where the capacitors CTT which are termination power supplies are mounted has been described as the example where electronic parts other than semiconductor chips are mounted on the wiring substrate IP1. However, according to another modified example of the present embodiment, for example, the plurality of capacitors illustrated in FIG. 16 may include bypass capacitors or decoupling capacitors.

Modified Example 2

Further, an example where the logic chip LC and the two memory chips MC are mounted on the wiring substrate IP1 and electronic parts other than the semiconductor chips are not mounted has been described in the embodiment above. However, there are various modified examples regarding the number of semiconductor chips mounted on the wiring substrate IP1 in addition to that described in the embodiment above. In particular, the number of memory chips MC differs depending on the storage capacity required in the system provided in the semiconductor device PKG1. The value of the storage capacity increases in proportion to the number of memory chips MC, and therefore, for example, the number of memory chips MC may be two or more or may be one. Further, a plurality of logic chips LC may be mounted on the upper surface IPt. Furthermore, semiconductor chips having functions other than those of the logic chip LC and the memory chip MC may be mounted.

Figure 18:
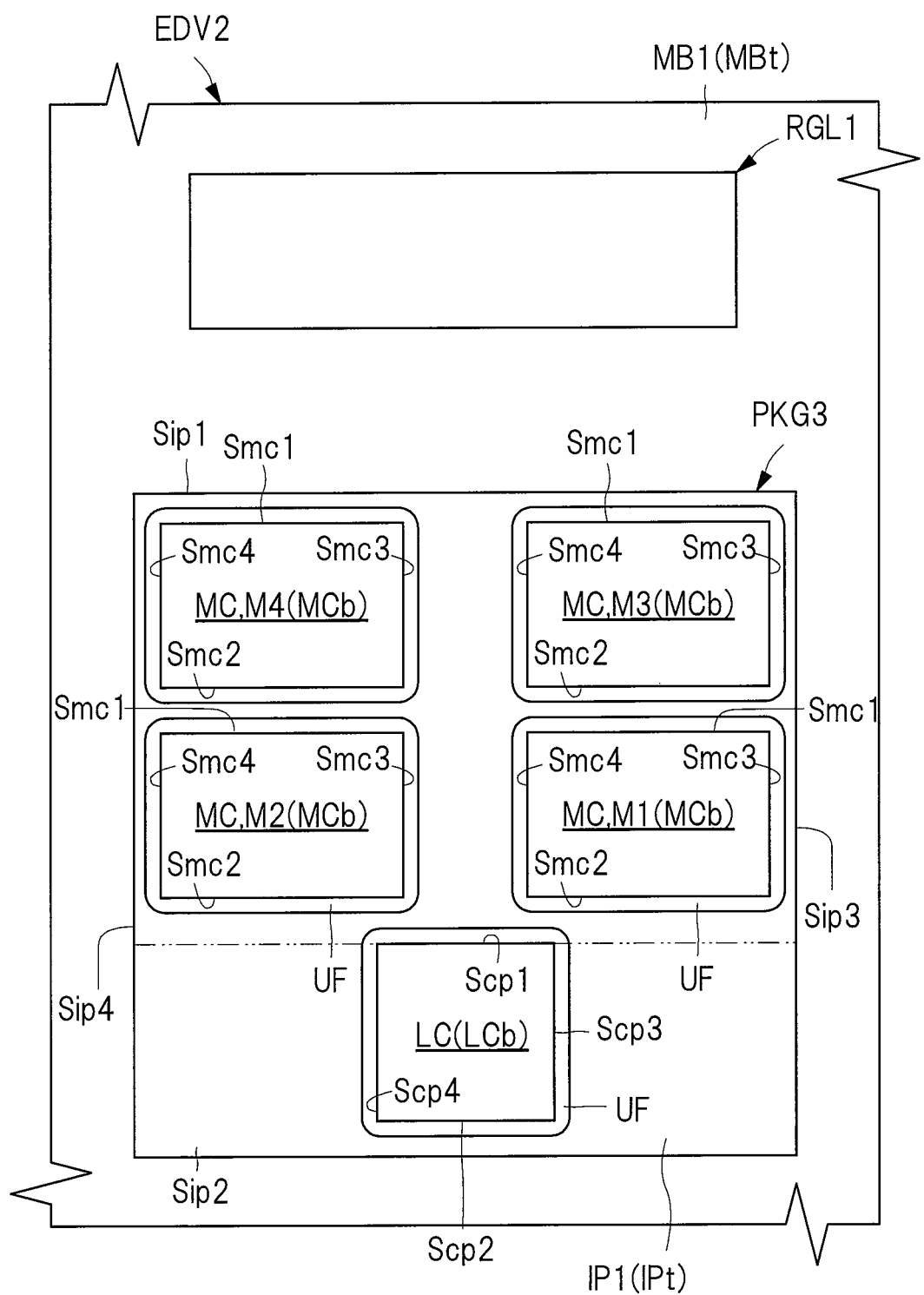
FIG. 18 is a plan view illustrating an electronic device in which a semiconductor device is mounted according to a modified example of FIG. 1.
Figure 19:
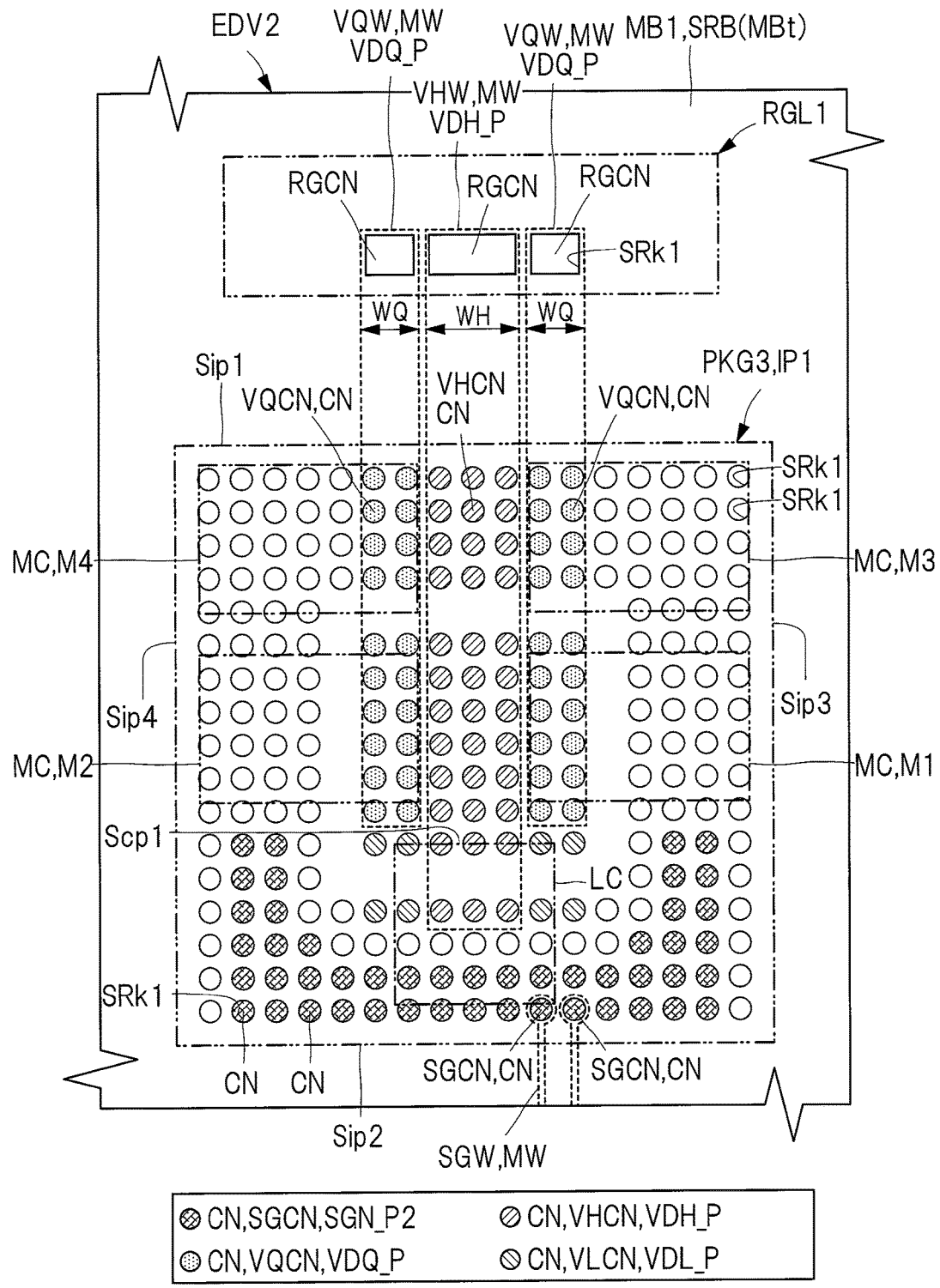
FIG. 19 is an enlarged plan view illustrating an upper surface of a mother board illustrated in FIG. 18.
Figure 20:
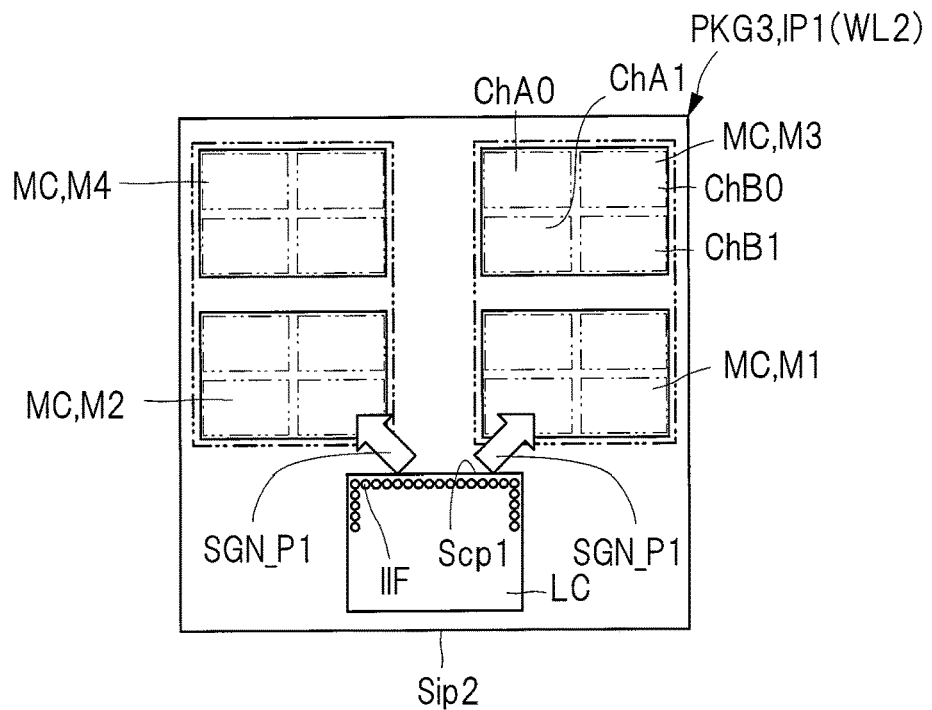
FIG. 20 is an explanatory view illustrating a wiring image of internal interface paths of the semiconductor device illustrated in FIG. 18.
Figure 21:
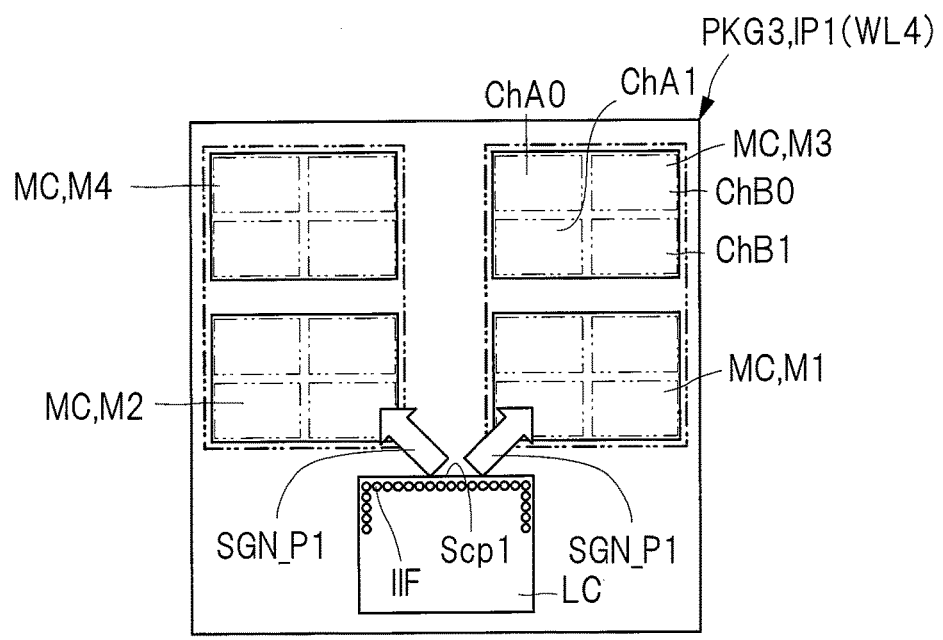
FIG. 21 is an explanatory view illustrating a wiring image of internal interface paths of the semiconductor device illustrated in FIG. 18.
Figure 22:
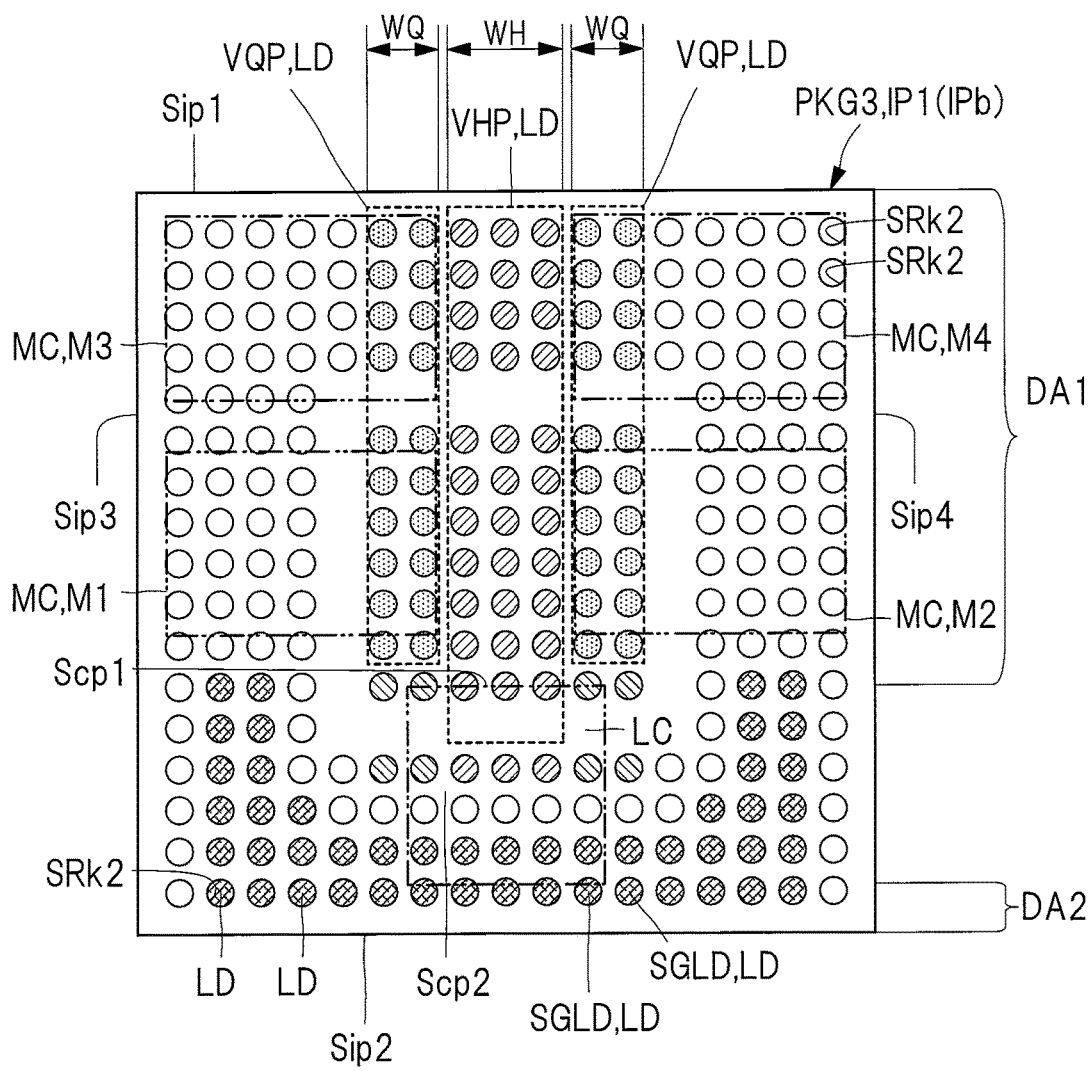
FIG. 22 is a plan view illustrating a structure on a side of a lower surface of the semiconductor device illustrated in FIG. 18.

Hereinafter, a semiconductor device PKG3 which includes four memory chips MC and an electronic device EDV2 will be described with reference to FIGS. 18 to 22. FIG. 18 is a plan view illustrating an electronic device in which the semiconductor device is mounted according to a modified example of FIG. 1. Further, FIG. 19 is an enlarged plan view illustrating an upper surface of the mother board illustrated in FIG. 18. Also, FIGS. 20 and 21 are explanatory views illustrating wiring images of internal interface paths of the semiconductor device illustrated in FIG. 18. In addition, FIG. 22 is a plan view illustrating a structure on a side of a lower surface of the semiconductor device illustrated in FIG. 18.

The semiconductor device PKG3 illustrated in FIG. 18 differs from the semiconductor device PKG1 illustrated in FIG. 1 in that the four memory chips MC are mounted on the wiring substrate IP1. A memory chip M3 and a memory chip M4 which are newly added in comparison with FIG. 1 are mounted between the memory chip M1 and the substrate side Sip1 and between the memory chip M2 and the substrate side Sip1, respectively. More specifically, the memory chip M3 is mounted between the chip side Smc1 of the memory chip M1 and the substrate side Sip1. Further, the memory chip M4 is mounted between the chip side Smc1 of the memory chip M2 and the substrate side Sip1.

Namely, the semiconductor device PKG3 includes the plurality of memory chips M1, M2, M3 and M4, and each of the plurality of memory chips M1, M2, M3 and M4 is mounted between the extension line of the chip side Scp1 of the logic chip LC and the substrate side Sip1 of the wiring substrate IP1 when seen in a plan view. When each of the plurality of memory chips MC is mounted between the extension line of the chip side Scp1 of the logic chip LC and the substrate side Sip1 of the wiring substrate IP1 as described above, the technique described in the embodiment above is applicable in the same manner even if the number of memory chips MC is three or more.

For example, as illustrated in FIG. 19, a power line VHW of the electronic device EDV2 intersects the substrate side Sip1 of the wiring substrate IP1 and extends from the side of the substrate side Sip1 of the wiring substrate IP1 toward a region which overlaps the logic chip LC when seen in a plan view. Consequently, it is possible to increase the width WH of the power line VHW in which a large current flows, and thus possible to increase a cross sectional area of the power potential supply path VDH_P.

Further, for example, by providing the plurality of internal interface electrodes IIF close to the chip side Scp1 of the logic chip LC as illustrated in FIGS. 20 and 21, it is possible to shorten path distances of the internal interface paths SGN_P1.

Incidentally, as is clear from comparison between FIGS. 11 and 20, when the number of memory chips MC increases, a wiring density of the internal interface paths SGN_P1 increases.

Hence, in the case of this modified example, it is preferable to decrease the wiring density of the internal interface paths SGN_P1 by routing the signal transmission paths in a plurality of different wiring layers as illustrated in FIGS. 20 and 21.

Also, as illustrated in FIG. 19, the power line VHW which supplies the power potential VDDH (see FIG. 5) to the logic chip LC is routed to the region which overlaps the logic chip LC and is directly below the logic chip LC in the electronic device EDV2. Consequently, it is possible to shorten the distance of the power potential supply path VDH_P in the thickness direction similarly to the electronic device EDV1 described in the embodiment above. As a result, it is possible to reduce the heat generation amount produced by causing the current to flow in the power potential supply path VDH_P, and thus possible to suppress a rise in the temperature of the semiconductor device PKG3.

Further, as illustrated in FIG. 19, each of the plurality of power lines VQW extends from the side of the substrate side Sip1 of the wiring substrate IP1 to regions which overlap the plurality of memory chips M1 and M2 when seen in a plan view. Furthermore, the power line VHW is disposed between regions which overlap the plurality of memory chips M1 and M2 and between regions which overlap the plurality of memory chips M3 and M4 when seen in a plan view.

Consequently, it is possible to dispose the plurality of power lines VQW, which supply the power potentials VDDQ (see FIG. 5) to the memory chips MC, at arbitrary positions directly below each of the plurality of memory chips MC. Therefore, it is possible to suppress a fluctuation of a drive voltage for driving the input/output circuits CAC of the memory chips MC.

Also, as illustrated in FIG. 22, the semiconductor device PKG3 includes power planes (power conductor patterns) VQP which are formed on the lower surface IPb and supply the power potentials VDDQ (see FIG. 5) to each of the plurality of memory chips MC and a power plane (power conductor pattern) VHP which is formed on the lower surface IPb and supplies the power potential VDDH (see FIG. 5) larger than the power potential VDDQ to the logic chip LC. Furthermore, the width WH of the power plane VHP is larger than widths WQ of the power planes VQP. Also, the power plane VHP extends from the side of the substrate side Sip1 of the wiring substrate IP1 toward the region which overlaps the logic chip LC when seen in a plan view. Consequently, it is possible to reduce the heat generation amount at portions where the wiring substrate IP1 and the wiring substrate MB1 are electrically connected.

Further, when the power plane VHP extending from the side of the substrate side Sip1 toward the region which overlaps the logic chip LC is provided as illustrated in FIG. 22, it is possible to increase the cross sectional area of the power potential supply path VDH_P even in the case where the routing distance of the power line VHW illustrated in FIG. 2 is short. For example, when the power line VHW illustrated in FIG. 19 is routed to the region between the substrate side Sip1 and the line which overlaps the chip side Scp1 of the logic chip LC instead of being routed to the region which overlaps the logic chip LC, the resistance of the power line VHW becomes high. However, by providing the power plane VHP extending from the side of the substrate side Sip1 toward the region which overlaps the logic chip LC, it is possible to increase the cross sectional area of the power potential supply path VDH_P.

Modified Example 3

Further, an aspect where all of the plurality of memory chips MC are mounted between the extension line of the chip side Scp1 and the substrate side Sip1 has been described in modified example 2. However, part of the plurality of memory chips MC may be mounted between the extension line of the chip side Scp1 and the substrate side Sip2.

Figure 23:
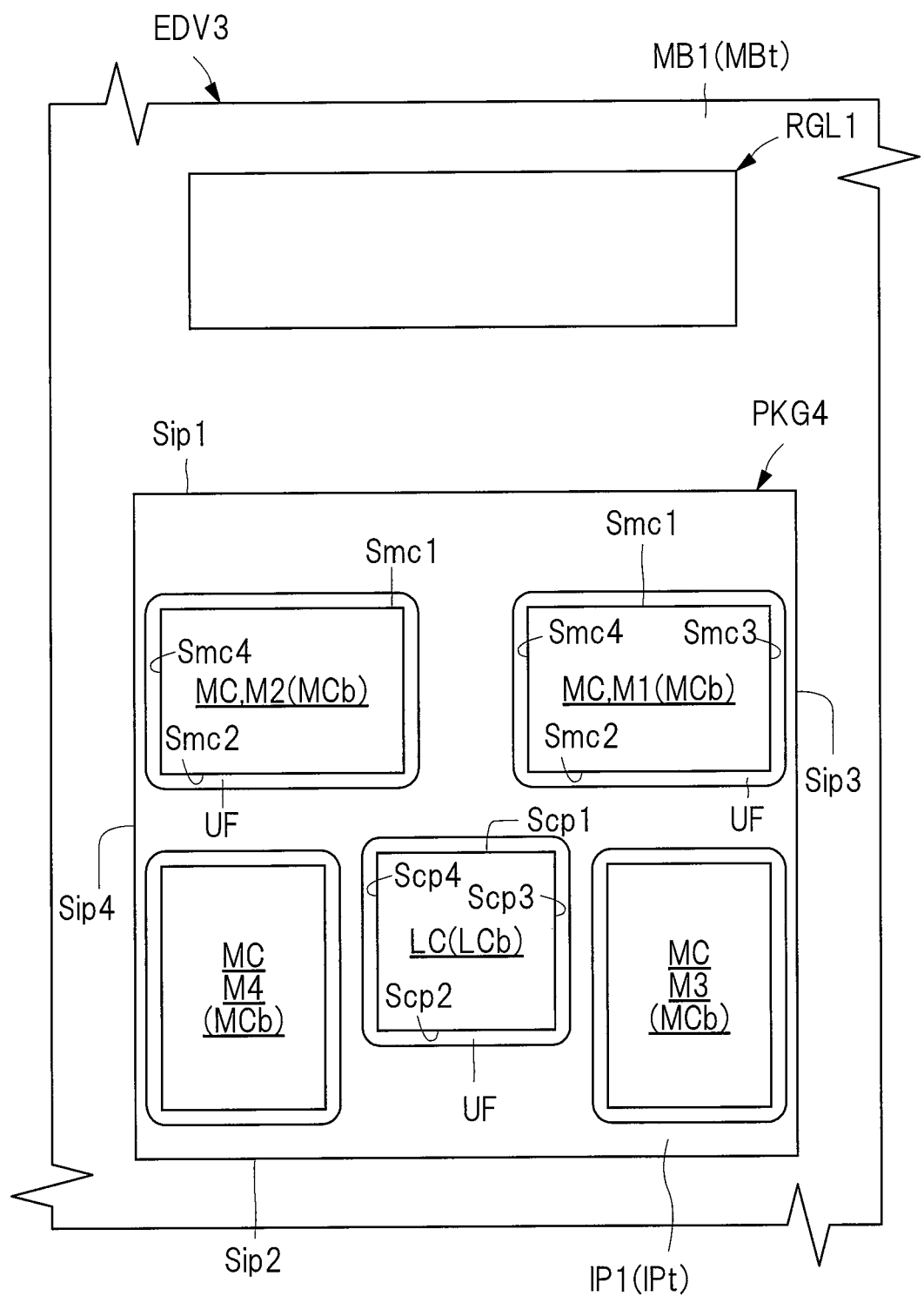
FIG. 23 is a plan view illustrating an electronic device in which a semiconductor device is mounted according to another modified example of FIG. 1.
Figure 24:
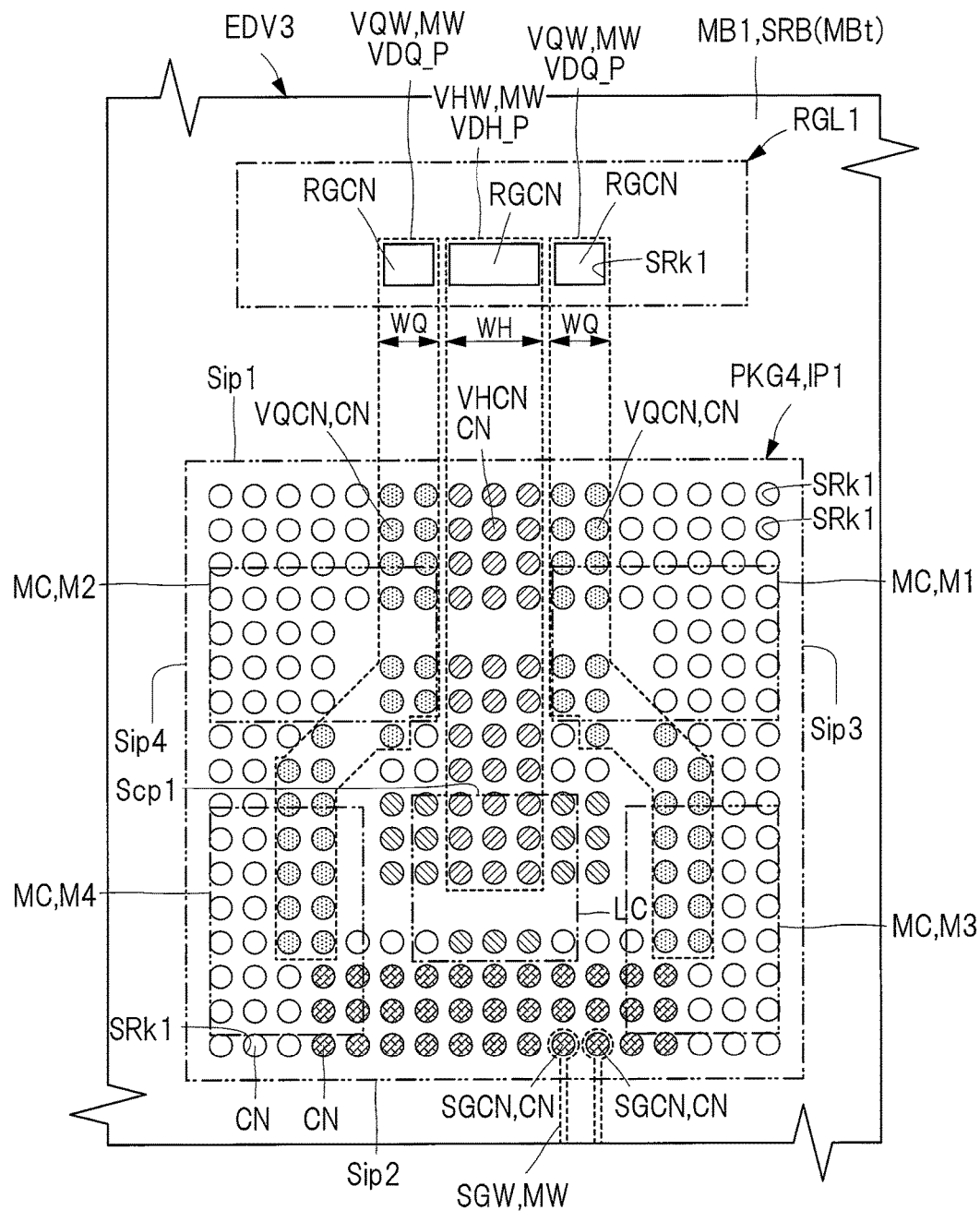
FIG. 24 is an enlarged plan view illustrating an upper surface of a mother board illustrated in FIG. 23.
Figure 25:
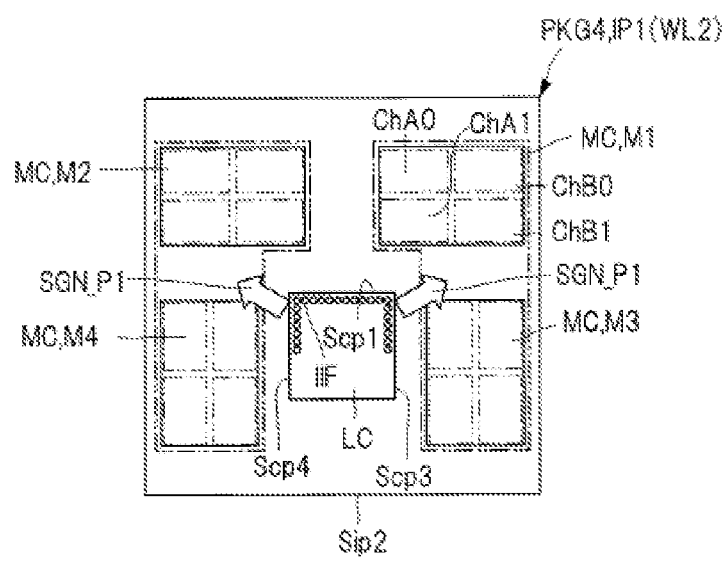
FIG. 25 is an explanatory view illustrating a wiring image of internal interface paths of the semiconductor device illustrated in FIG. 23.
Figure 26:
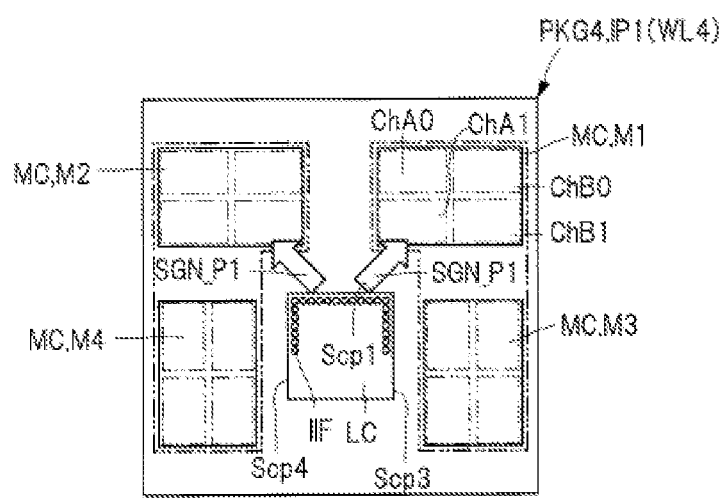
FIG. 26 is an explanatory view illustrating a wiring image of internal interface paths of the semiconductor device illustrated in FIG. 23.
Figure 27:
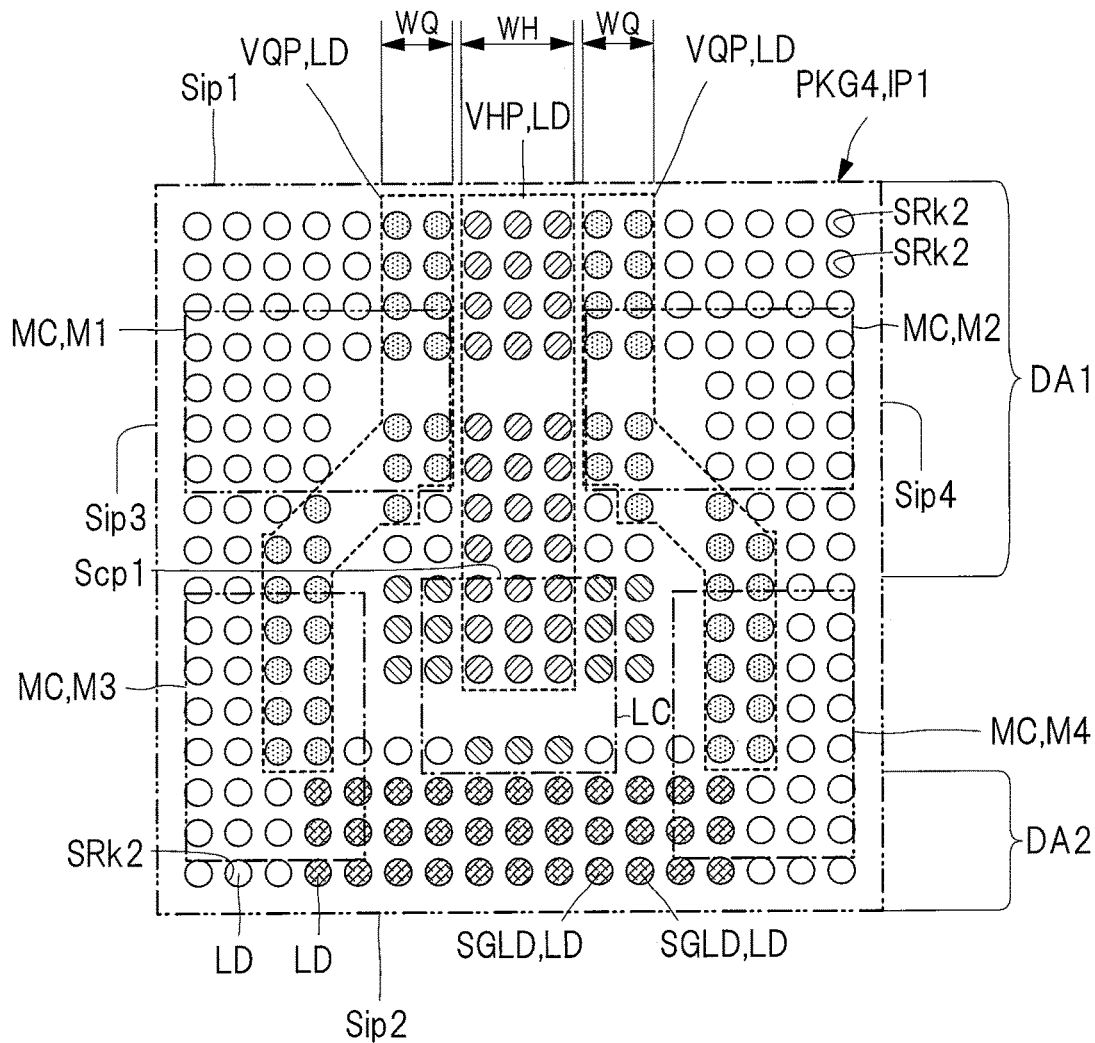
FIG. 27 is a plan view illustrating a structure on a side of a lower surface of the semiconductor device illustrated in FIG. 23.

Hereinafter, a semiconductor device PKG4 which includes the four memory chips MC and an electronic device EDV3 will be described with reference to FIGS. 23 to 28. FIG. 23 is a plan view illustrating the electronic device in which the semiconductor device is mounted according to another modified example of FIG. 1. Further, FIG. 24 is an enlarged plan view illustrating an upper surface of the mother board illustrated in FIG. 23. Also, FIGS. 25 and 26 are explanatory views illustrating wiring images of internal interface paths of the semiconductor device illustrated in FIG. 23. In addition, FIG. 27 is a plan view illustrating a structure on a side of a lower surface of the semiconductor device illustrated in FIG. 23.

The semiconductor device PKG4 illustrated in FIG. 23 differs from the semiconductor device PKG1 illustrated in FIG. 1 in that the four memory chips MC are mounted on the wiring substrate IP1. Further, the semiconductor device PKG4 differs from the semiconductor device PKG3 illustrated in FIG. 18 in that the memory chip M3 and the memory chip M4 among the plurality of memory chips MC are mounted between the extension line of the chip side Scp1 of the logic chip LC and the substrate side Sip2.

More specifically, the memory chip M3 is mounted between the substrate side Sip3 and the chip side Scp3 of the logic chip LC when seen in a plan view. Further, the memory chip M4 is mounted between the substrate side Sip4 and the chip side Scp4 of the logic chip LC when seen in a plan view.

Even when part of the plurality of memory chips MC are mounted between the extension line of the chip side Scp1 of the logic chip LC and the substrate side Sip2 of the wiring substrate IP1 as described above, the technique described in the embodiment above is applicable in the same manner if the memory chip M1 and the memory chip M2 are mounted between the extension line of the chip side Scp1 and the substrate side Sip1.

For example, as illustrated in FIG. 24, the power line VHW of the electronic device EDV3 intersects the substrate side Sip1 of the wiring substrate IP1 and extends from the side of the substrate side Sip1 of the wiring substrate IP1 toward the region which overlaps the logic chip LC when seen in a plan view. Consequently, it is possible to increase the width WH of the power line VHW in which a large current flows, and thus possible to increase the cross sectional area of the power potential supply path VDH_P.

Further, for example, by providing the plurality of internal interface electrodes IIF close to the chip side Scp1 of the logic chip LC as illustrated in FIGS. 25 and 26, it is possible to shorten path distances of the internal interface paths SGN_P1. Note that, in the example illustrated in FIGS. 25 and 26, the plurality of internal interface electrodes IIF are provided close to the chip side Scp1 as a whole. However, part of the plurality of internal interface electrodes IIF are formed along the chip side Sip3 and the chip side Sip4.

By forming part of the plurality of internal interface electrodes IIF along the chip side Sip3 and the chip side Sip4 in this manner, it is possible to shorten routing distances of the internal interface paths SGN_P1 to the memory chips M3 and M4.

As is clear from comparison between FIG. 20 described in modified example 2 and FIG. 25, the semiconductor device PKG4 can reduce the wiring density of the signal transmission paths compared to the semiconductor device PKG3 according to modified example 2. Consequently, this modified example is effective from a viewpoint of reduction of the wiring density of the internal interface paths SGN_P1.

Meanwhile, as illustrated in FIG. 20, the number of internal interface paths SGN_P1 formed between the extension line of the chip side Scp1 of the logic chip LC and the substrate side Sip2 of the wiring substrate IP1 is smaller in the semiconductor device PKG3 according to modified example 2 than in the semiconductor device PKG4 according to this modified example (see FIG. 25). Consequently, an aspect of modified example 2 is preferable from a viewpoint of separation of the external interface paths SGN_P2 (see FIGS. 19 and 24) and the internal interface paths SGN_P1 (see FIGS. 20 and 25).

Further, as described in the "die bonding process" in the embodiment above, a part higher than the back surface LCb of the logic chip LC is not disposed in the region HSA2 illustrated in FIG. 15, so that it is possible to improve the degree of freedom of the heat radiation design. Consequently, modified example 2 is more preferable from a viewpoint of improvement in the degree of freedom of the heat radiation design.

Further, as illustrated in FIG. 24, the power line VHW which supplies the power potential VDDH (see FIG. 5) to the logic chip LC is routed to the region which overlaps the logic chip LC and is directly below the logic chip LC in the electronic device EDV3. Consequently, it is possible to shorten the distance of the power potential supply path VDH_P in the thickness direction similarly to the electronic device EDV1 described in the embodiment above. As a result, it is possible to reduce the heat generation amount produced by causing the current to flow in the power potential supply path VDH_P, and thus possible to suppress a rise in the temperature of the semiconductor device PKG4.

Further, as illustrated in FIG. 24, each of the plurality of power lines VQW extends from the side of the substrate side Sip1 of the wiring substrate IP1 to the regions which overlap the plurality of memory chips M1 and M2 when seen in a plan view. Furthermore, the power line VHW is disposed between the regions which overlap the plurality of memory chips M1 and M2 and between the regions which overlap the plurality of memory chips M3 and M4 when seen in a plan view.

Consequently, it is possible to dispose the plurality of power lines VQW which supply the power potentials VDDQ (see FIG. 5) to the memory chips MC at arbitrary positions directly below each of the plurality of memory chips MC, so that it is possible to suppress a fluctuation of a drive voltage for driving the input/output circuits CAC of the memory chips MC.

Further, as illustrated in FIG. 27, the semiconductor device PKG4 includes power planes (power conductor patterns) VQP which are formed on the lower surface IPb and supply the power potentials VDDQ (see FIG. 5) to each of the plurality of memory chips MC and a power plane (power conductor pattern) VHP which is formed on the lower surface IPb and supplies the power potential VDDH (see FIG. 5) larger than the power potential VDDQ to the logic chip LC. Also, the width WH of the power plane VHP is larger than the widths WQ of the power planes VQP. In addition, the power plane VHP extends from the side of the substrate side Sip1 of the wiring substrate IP1 toward the region which overlaps the logic chip LC when seen in a plan view. Consequently, it is possible to reduce the heat generation amount at portions where the wiring substrate IP1 and the wiring substrate MB1 are electrically connected.

Further, when the power plane VHP extending from the side of the substrate side Sip1 toward the region which overlaps the logic chip LC is provided as illustrated in FIG. 27, it is possible to increase the cross sectional area of the power potential supply path VDH_P even in the case where the routing distance of the power line VHW illustrated in FIG. 2 is short. For example, when the power line VHW illustrated in FIG. 24 is routed to the region between the substrate side Sip1 and the line which overlaps the chip side Scp1 of the logic chip LC instead of being routed to the region which overlaps the logic chip LC, the resistance of the power line VHW becomes high. However, by providing the power plane VHP extending from the side of the substrate side Sip1 toward the region which overlaps the logic chip LC, it is possible to increase the cross sectional area of the power potential supply path VDH_P.

Figure 28:
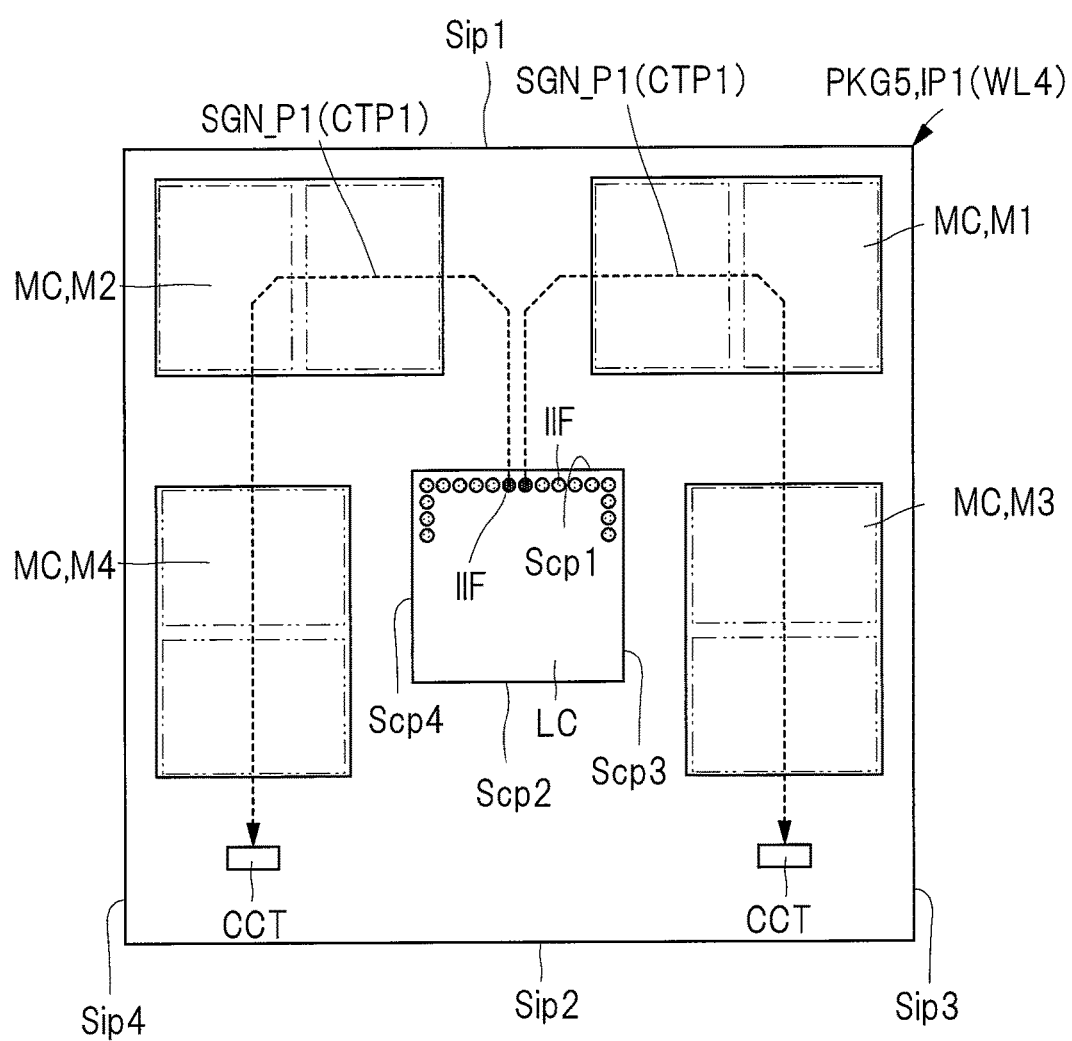
FIG. 28 is an explanatory view illustrating a wiring image of internal interface paths of a semiconductor device according to a modified example of FIG. 26.

Further, a combination of the technique described in this modified example and the technique described in modified example 1 makes it easy to connect the control signal transmission paths CTP1 by the fly-by connection as illustrated in FIG. 28. FIG. 28 is an explanatory view illustrating the wiring image of the internal interface paths of the semiconductor device according to the modified example of FIG. 26.

A semiconductor device PKG5 illustrated in FIG. 28 differs from the semiconductor device PKG4 illustrated in FIG. 26 in that a plurality of capacitors CTT are mounted on the wiring substrate IP1. As described in modified example 1, the plurality of capacitors CTT are termination power capacitors which are connected at terminal ends of the signal transmission paths. The example illustrated in FIG. 28 includes the path output from the logic chip LC and connected to the capacitor CTT through the memory chip M1 and the memory chip M3 in order and the path output from the logic chip LC and connected to the capacitor CTT through the memory chip M2 and the memory chip M4 in order. Namely, the control signal transmission paths CTP1 illustrated in FIG. 28 are connected by the so-called fly-by method.

In this regard, as illustrated in FIG. 28, the memory chip M3 is mounted between the substrate side Sip3 and the chip side Scp3 of the logic chip LC when seen in a plan view. Further, the memory chip M4 is mounted between the substrate side Sip4 and the chip side Scp4 of the logic chip LC when seen in a plan view. The plurality of capacitors CTT are disposed between the substrate side Sip2 of the wiring substrate IP1 and the memory chip M3 and between the substrate side Sip2 of the wiring substrate IP1 and the memory chip M4, respectively, when seen in a plan view.

As illustrated in FIG. 28, by arranging the plurality of memory chips MC and the capacitors CTT, it is possible to shorten routing distances of the control signal transmission paths CTP1 connected by the fly-by method.

Modified Example 4

An aspect where the power line VHW and the power lines VQW do not overlap as illustrated in FIG. 3 and the power line VHW and the power lines VQW are formed and routed in an uppermost layer of the wiring substrate MB1 has been described in the embodiment above. When the power line VHW and the power lines VQW are routed in the single layer like in the embodiment above, the wiring structure is simplified, so that it is possible to reduce loss in power potential supply paths. Meanwhile, a further increase in the width of the power line VHW is restricted due to the relationship with the power lines VQW.

Figure 29:
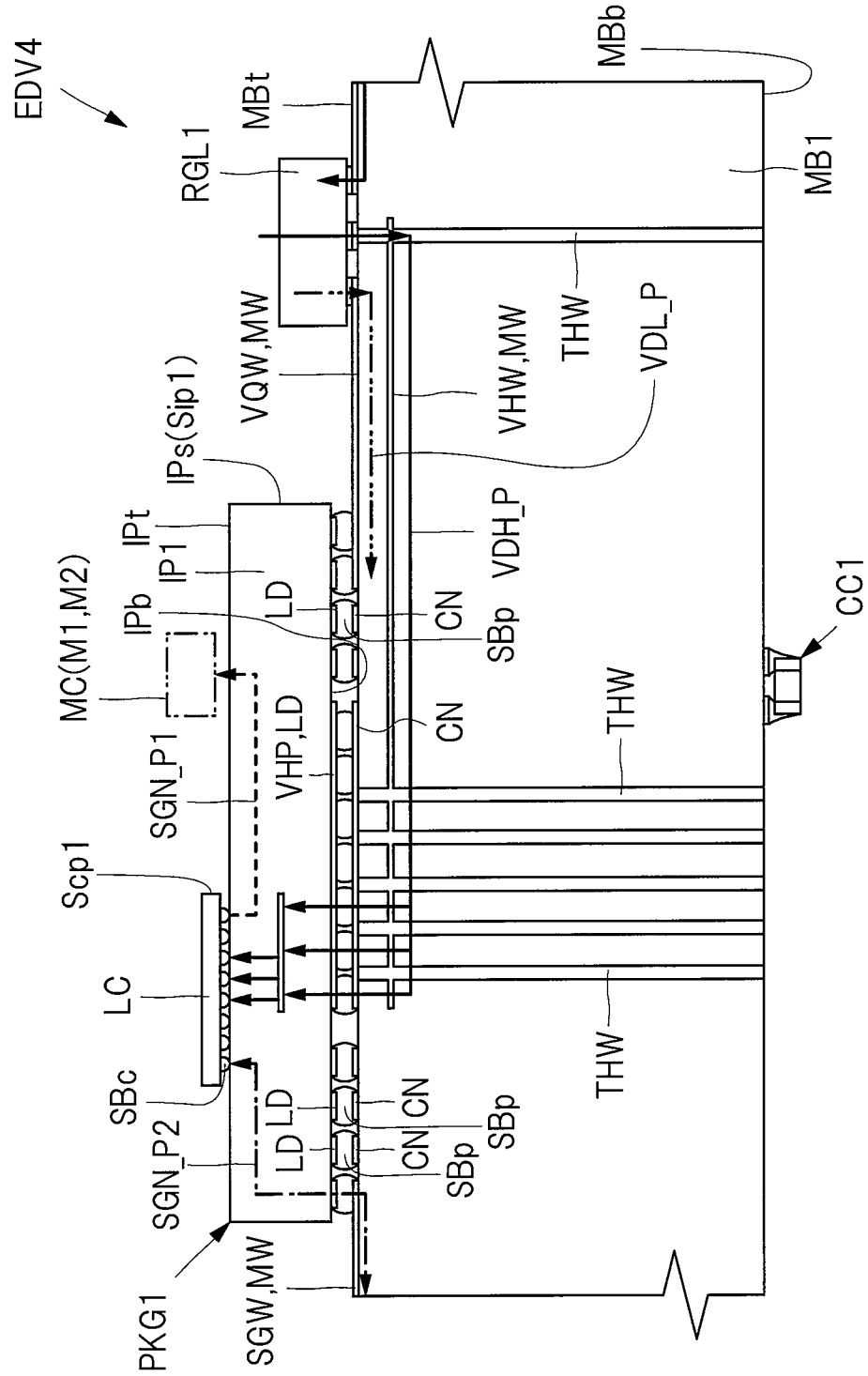
FIG. 29 is a sectional view illustrating a modified example of FIG. 2.

Hence, according to a modified example of the embodiment above, the power line VHW may be formed in a lower wiring layer below the uppermost layer as illustrated in FIG. 29. FIG. 29 is a sectional view illustrating the modified example of FIG. 2. Note that FIG. 29 is the sectional view, but do not illustrate hatchings so as to make an example of electrical connection relationship between components of the electronic device EDV4 easy to see.

The electronic device EDV4 illustrated in FIG. 29 differs from the electronic device EDV1 illustrated in FIG. 2 in that the power line VHW is formed in a lower wiring layer below the uppermost layer. Further, the electronic device EDV4 illustrated in FIG. 29 differs from the electronic device EDV1 illustrated in FIG. 2 in that part of the power line VHW overlaps the power lines VQW.

In the example illustrated in FIG. 29, the power potential supply path VDH_P output from the power supply device RGL1 is connected to a lower wiring layer (e.g. second wiring layer) below the uppermost layer through the through-hole wirings THW of the wiring substrate MB1. The through-hole wirings THW are conductor patterns formed by adhering conductors to inner walls of through-holes which penetrate the wiring substrate MB1 in the thickness direction.

Further, the power potential supply path VDH_P is routed to the region which overlaps the semiconductor device PKG1 through the power line VHW formed in the lower layer below the uppermost layer. The power line VHW is the same as that of the embodiment described above in that it intersects the substrate side Sip1 of the wiring substrate IP1 and extends toward the region which overlaps the logic chip LC when seen in a plan view. Further, in the example illustrated in FIG. 29, the power line VHW extends to the region which overlaps the logic chip LC.

Furthermore, the power potential supply path VDH_P routed to the region which overlaps the logic chip LC by the power line VHW reaches the terminals CN formed in the uppermost layer through the through-hole wirings THW of the wiring substrate MB1. Then, the power potential VDDH (see FIG. 5) is subsequently supplied to the logic chip LC in the same path as that of the embodiment described above.

According to this modified example, since the power line VHW may overlap other wirings (the power line VQW in the example illustrated in FIG. 29), it is possible to set the width of the power line VHW to an arbitrary value.

Further, according to this modified example, terminals LD which supply other signals or potentials can be formed at positions which overlap the path for routing the power line VHW in the thickness direction as illustrated in FIG. 29.

Note that, in the example illustrated in FIG. 29, part of the power line VHW overlaps the power lines VQW, but wirings which overlap the power line VHW may be a wiring which supplies a reference potential or wirings which supply other power potentials.

Modified Example 5

Figure 30:
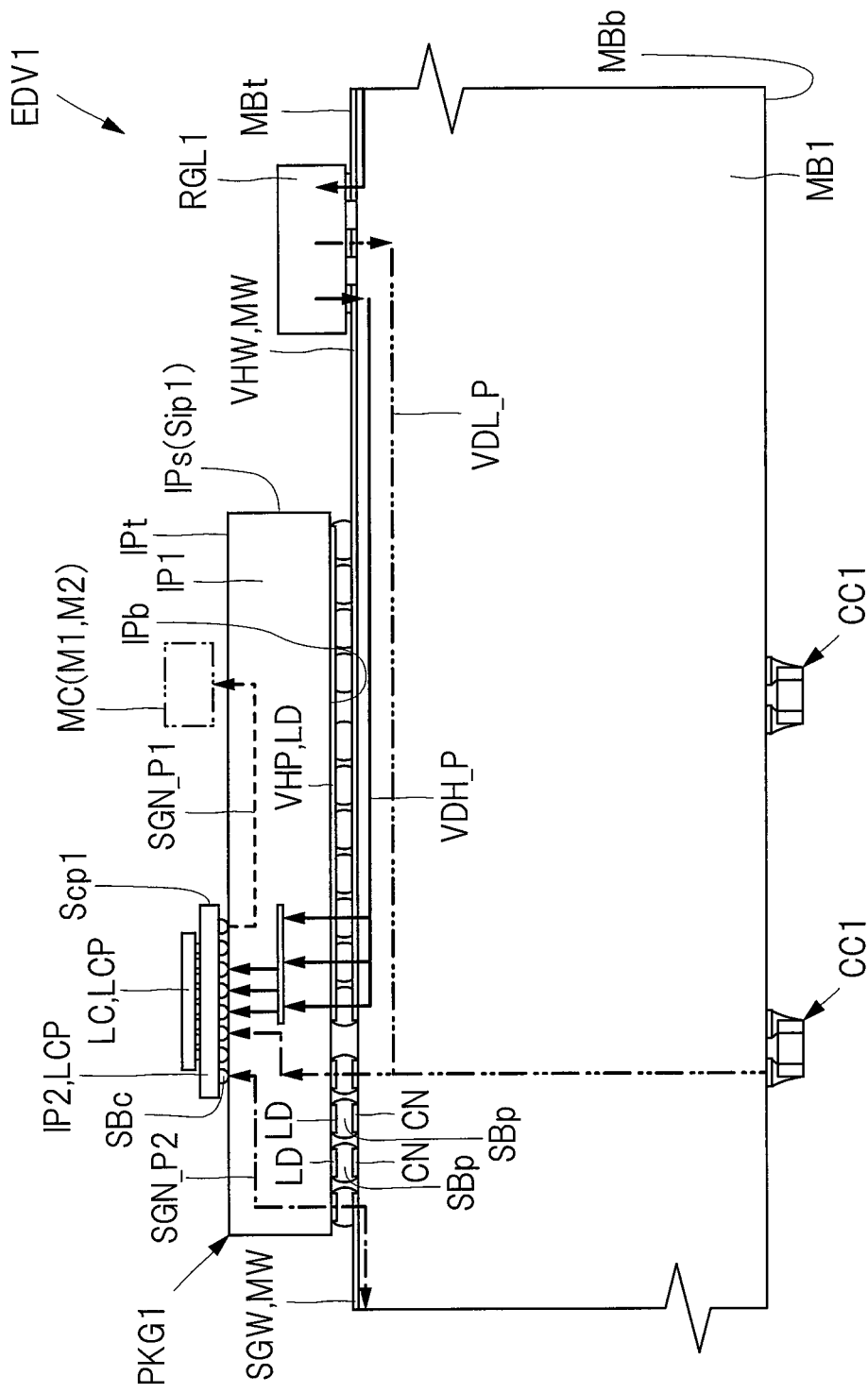
FIG. 30 is an enlarged sectional view illustrating a configuration example of an electronic device according to the modified example of FIG. 2.

An aspect where semiconductor chips are packaged on the wiring substrate IP1 by the face-down mounting method has been described as an example of the semiconductor device PKG1 in the embodiment above. However, the logic chip LC illustrated in FIG. 6 and the memory chips MC illustrated in FIG. 7 may be directly mounted on the wiring substrate IP1 which is a package substrate, or may be mounted on the wiring substrate IP1 with an interposer interposed therebetween. For example, an aspect where the logic chip LC illustrated in FIG. 2 is mounted on the wiring substrate IP1 with an interposer wiring substrate different from the wiring substrate IP1 interposed therebetween will be described as a modified example of FIG. 2. FIG. 30 is an enlarged sectional view illustrating a configuration example of an electronic device according to the modified example of FIG. 2.

The logic chip LC illustrated in FIG. 30 is mounted on the upper surface IPt of the wiring substrate IP1 with a wiring substrate IP2 which is an interposer different from the wiring substrate IP1 interposed therebetween. In other words, a logic package LCP in which the logic chip LC is mounted on the wiring substrate IP2 is mounted on the upper surface IPt of the wiring substrate IP1.

The logic chip LC described in the embodiment above may be replaced with the logic package LCP in which the logic chip LC is incorporated as illustrated in FIG. 30. Note that, when the logic chip LC described in the embodiment above is replaced with the logic package LCP, the plurality of electrodes PDL illustrated in FIG. 6 are made of a material whose main component is copper (Cu).

Further, the logic package LCP typically incorporating the logic chip LC has been described as an example of the semiconductor package mounted on the wiring substrate IP1 with reference to FIG. 30. However, according to a modified example of FIG. 30, a memory package (semiconductor package) incorporating the memory chips MC illustrated in FIG. 7 may be mounted. Namely, the memory chips MC illustrated in FIG. 7 may be replaced with the memory package. In this case, the plurality of electrodes PDM illustrated in FIG. 7 are made of a material whose main component is copper (Cu).

Further, in the case of this modified example, one or both of the logic package LCP and the memory package may be mounted.

Furthermore, an outline of the manufacturing process of the semiconductor device and the process of manufacturing the electronic device illustrated in FIG. 1 by mounting the manufactured semiconductor device on a mother board have been described as an example in the embodiment above with reference to FIG. 13. However, there are various modified examples of the manufacturing process of the semiconductor device and the manufacturing process of the electronic device.

Figure 31:
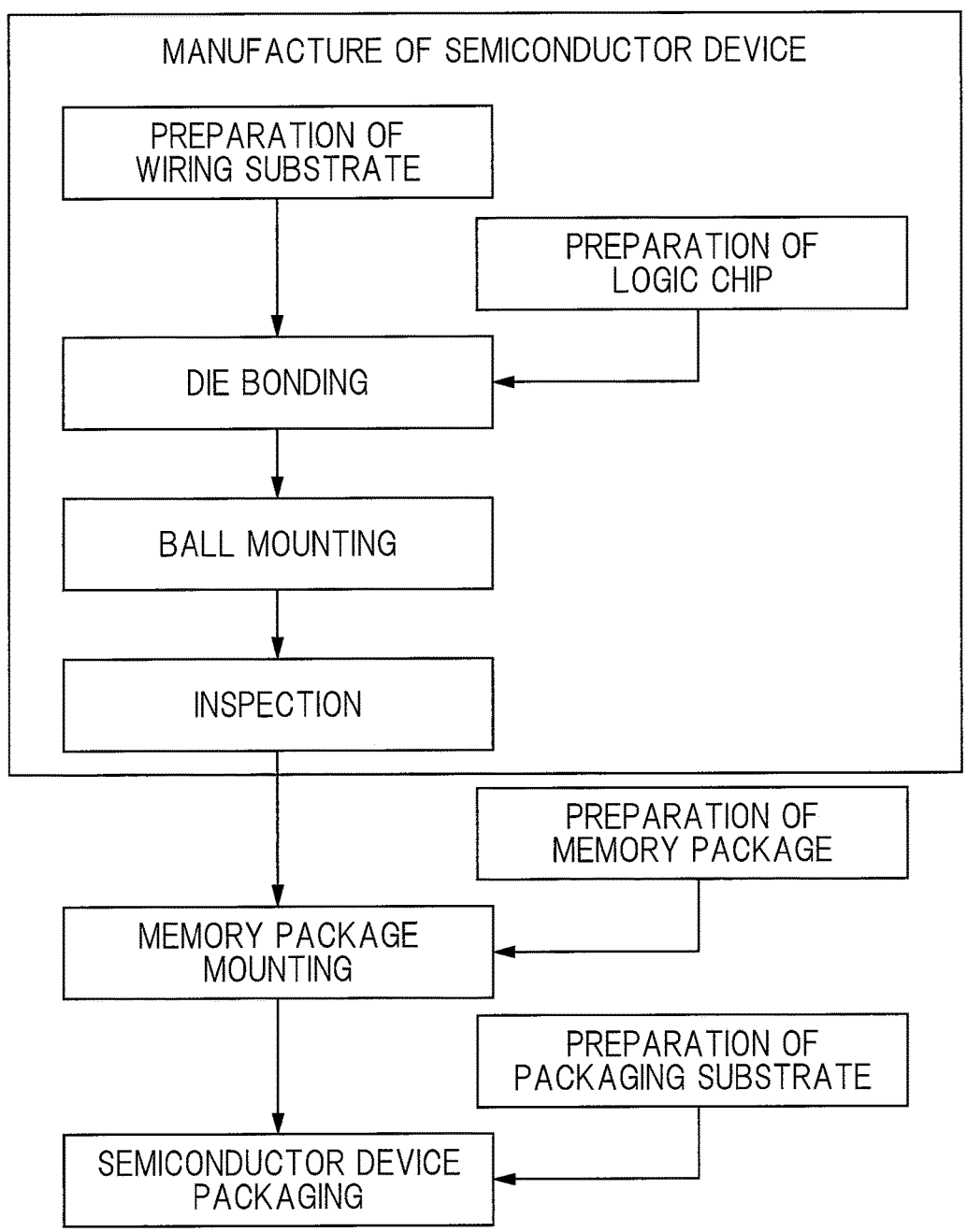
FIG. 31 is an explanatory view illustrating a modified example of the manufacturing process illustrated in FIG. 13.

For example, when the memory package is mounted on the wiring substrate IP1 like in this modified example, the manufacturing process illustrated in FIG. 31 may be applied. FIG. 31 is an explanatory view illustrating the modified example of the manufacturing process illustrated in FIG. 13.

A so-called PoP (Package on Package) method has been known as an aspect where another semiconductor package is mounted on a semiconductor package like in the modified example described with reference to FIG. 30. According to the PoP method, for example, different manufacturers manufacture a semiconductor device for a lower stage and a semiconductor device for an upper stage, and a company which purchases these semiconductor devices from each manufacturer carries out final assembly.

In this case, an assembly flow is as illustrated in FIG. 31. Namely, in the manufacturing process of a semiconductor device, the logic chip LC is mounted on the wiring substrate IP1 illustrated in FIG. 2, and the semiconductor device is inspected without mounting the memory chips MC thereon and is then shipped. Further, for example, another manufacturer manufactures a memory package in which the memory chips MC are mounted on a wiring substrate (memory chip preparing process). Next, a company which has purchased the semiconductor device in which the logic chip LC has been mounted and the memory package mounts the memory package on the wiring substrate IP1. Thereafter, the semiconductor device in which the memory package has been mounted is mounted on the wiring substrate MB illustrated in FIG. 2. Through the above process, the semiconductor device manufactured according to the PoP method and the electronic device in which the semiconductor device has been mounted are obtained.

Modified Example 6

Further, various modified examples have been described above, and the above-described modified examples can be applied in combination.

In addition, part of contents disclosed in the embodiment will be described below.

(1)

A semiconductor device includes:

a wiring substrate which includes a first surface, a second surface positioned on an opposite side of the first surface, and a plurality of lands formed on the second surface;

a plurality of first semiconductor chips each mounted on the first surface of the wiring substrate; and a second semiconductor chip which is mounted side by side with the plurality of first semiconductor chips on the first surface of the wiring substrate and controls each of the plurality of first semiconductor chips, a peripheral portion of the wiring substrate includes a first substrate side and a second substrate side which is positioned on an opposite side of the first substrate side when seen in a plan view, a peripheral portion of the second semiconductor chip includes a first chip side and a second chip side which is positioned on an opposite side of the first chip side when seen in a plan view, the second semiconductor chip is mounted such that the first chip side of the second semiconductor chip is parallel to the first substrate side of the wiring substrate, each of the plurality of first semiconductor chips is mounted between an extension line of the first chip side of the second semiconductor chip and the first substrate side, the wiring substrate includes a first power conductor pattern which is formed on the second surface and supplies a first power potential to each of the plurality of first semiconductor chips and a second power conductor pattern which is formed on the second surface and supplies a second power potential larger than the first power potential to the second semiconductor chip, a width of the second power conductor pattern is larger than a width of the first power conductor pattern, and the second power conductor pattern extends from a side of the first substrate side of the wiring substrate to a region which overlaps the second semiconductor chip when seen in a plan view.

(2)

In the semiconductor device of (1), the second semiconductor chip includes a plurality of first interface electrodes which are paths for transmitting an electrical signal between the second semiconductor chip and the plurality of first semiconductor chips, and the plurality of first interface electrodes are disposed along the first chip side.

(3)

In the semiconductor device of (1), the second power conductor pattern intersects a line which overlaps the first chip side of the second semiconductor chip and extends from the side of the first substrate side of the wiring substrate toward a line which overlaps the second chip side of the second semiconductor chip when seen in a plan view.

(4)

In the semiconductor device of (1), the wiring substrate includes a plurality of the first power conductor patterns which are provided on both neighboring sides of the second power conductor pattern, and the plurality of first power conductor patterns intersect the first substrate side of the wiring substrate and extend from the side of the first substrate side of the wiring substrate along the second power conductor pattern when seen in a plan view.

(5)

In the semiconductor device of (4), each of the plurality of first power conductor patterns extends from the side of the first substrate side of the wiring substrate to a region which overlaps each of the plurality of first semiconductor chips when seen in a plan view, and the second power conductor pattern is disposed between the regions which overlap each of the plurality of first semiconductor chips when seen in a plan view.

(6)

In the semiconductor device of (1), the plurality of lands include:

a first signal terminal which is electrically connected with the plurality of first semiconductor chips without passing through the second semiconductor chip; and a plurality of second signal terminals which are electrically connected with the plurality of first semiconductor chips through the second semiconductor chip, and the number of the first signal terminals is smaller than the number of the second signal terminals.

(7)

In the semiconductor device of (1), the peripheral portion of the wiring substrate includes a third substrate side which intersects the first substrate side and the second substrate side and a fourth substrate side which is positioned on an opposite of the third substrate side when seen in a plan view, a plurality of capacitors which are electrically connected with the plurality of first semiconductor chips are mounted on the first surface of the wiring substrate, the peripheral portion of the second semiconductor chip includes a third chip side which intersects the first chip side and the second chip side and a fourth chip side which is positioned on an opposite side of the third chip side when seen in a plan view, and the plurality of capacitors are mounted between the third substrate side and the third chip side of the second semiconductor chip and between the fourth substrate side and the fourth chip side of the second semiconductor chip when seen in a plan view.

(8)

The semiconductor device of (1) includes a plurality of third semiconductor chips each mounted on the first surface of the wiring substrate and controlled by the second semiconductor chip, and the plurality of third semiconductor chips are mounted between the plurality of first semiconductor chips and the first substrate side when seen in a plan view.

(9)

The semiconductor device of (1) includes a plurality of third semiconductor chips each mounted on the first surface of the wiring substrate and controlled by the second semiconductor chip, the peripheral portion of the wiring substrate includes a third substrate side which intersects the first substrate side and the second substrate side and a fourth substrate side which is positioned on an opposite side of the third substrate side when seen in a plan view, the peripheral portion of the second semiconductor chip includes a third chip side which intersects the first chip side and the second chip side and a fourth chip side which is positioned on an opposite side of the third chip side when seen in a plan view, and the plurality of third semiconductor chips are mounted between the third substrate side and the third chip side of the second semiconductor chip and between the fourth substrate side and the fourth chip side of the second semiconductor chip when seen in a plan view.

(10)

In the semiconductor device of (9), a plurality of capacitors which are electrically connected with the plurality of first semiconductor chips are mounted on the first surface of the wiring substrate, and the plurality of capacitors are mounted between the second substrate side and the plurality of third semiconductor chips when seen in a plan view.

(11)

An electronic device includes:

a first wiring substrate which includes a first surface and a second surface positioned on an opposite side of the first surface; and a semiconductor device which includes a second wiring substrate which includes a third surface, a fourth surface positioned on an opposite side of the third surface and a plurality of lands formed on the fourth surface, a plurality of first semiconductor chips each mounted on the third surface of the second wiring substrate, and a second semiconductor chip which is mounted side by side with the plurality of first semiconductor chips on the third surface of the second wiring substrate and controls each of the plurality of first semiconductor chips, the semiconductor device being mounted on the first surface of the first wiring substrate, a peripheral portion of the second wiring substrate includes a first substrate side and a second substrate side which is positioned on an opposite side of the first substrate side when seen in a plan view, a peripheral portion of the second semiconductor chip includes a first chip side and a second chip side which is positioned on an opposite side of the first chip side when seen in a plan view, the second semiconductor chip is mounted such that the first chip side of the second semiconductor chip is parallel to the first substrate side of the second wiring substrate, each of the plurality of first semiconductor chips is mounted between an extension line of the first chip side of the second semiconductor chip and the first substrate side, the first wiring substrate includes a plurality of first power lines which supply a first power potential to each of the plurality of first semiconductor chips and a second power line which supplies a second power potential to the second semiconductor chip and is provided between the plurality of first power lines, the second power line intersects the first substrate side of the second wiring substrate and extends from a side of the first substrate side of the second wiring substrate toward a region which overlaps the second semiconductor chip when seen in a plan view, each of the plurality of first power lines extends from the side of the first substrate side of the second wiring substrate to a region which overlaps each of the plurality of first semiconductor chips when seen in a plan view, and the second power line is disposed between the regions which overlap each of the plurality of first semiconductor chips.

REFERENCE SIGNS LIST

CAC input/output circuit
CC1 capacitor
ChA0, ChA1, ChB0, ChB1 channel
CKP1, CKP2 clock signal transmission path
CN terminal (packaging substrate terminal)
CR core layer (core material, core insulation layer)
CTL control circuit
CTP1, CTP2 control signal transmission path
CTT capacitor
DA1, DA2 region
DBA chip mounting region
DTP1, DTP2 data signal transmission path
EDV1, EDV2, EDV3, EDV4 electronic device (electronic equipment)
HSA1, HSA2 region
IIF internal interface electrode (interface terminal)
IL, SR1, SR2 insulation layer
IP1, IP2 wiring substrate (interposer)
IPb lower surface (surface, principal surface, packaging surface)
IPs side surface
IPt upper surface (surface, principal surface, chip mounting surface)
LC logic chip (semiconductor chip)
LCb, MCb back surface (principal surface, lower surface)
LCP logic package
LCs, MCs side surface
LCt, MCt surface (principal surface, upper surface)
LD terminal (land, external connection terminal)
M1, M2, M3, M4, MC memory chip (semiconductor chip)
MB1 wiring substrate (mother board, packaging substrate)
MBb lower surface (surface, back surface)
MBt upper surface (surface, semiconductor device mounting surface)
MW wiring (packaging substrate wiring, mother board wiring)

OIF external interface electrode (interface terminal)
PDL, PDM electrode (chip terminal, bonding pad)
PKG1, PKG2, PKG3, PKG4, PKG5 semiconductor device
PRC arithmetic processing circuit
RAM memory circuit (storage circuit)
RGCN terminal
RGL1 power supply device (regulator)
SBc protruding electrode
SBp solder ball (solder member, external terminal, electrode, external electrode)
Scp1, Scp2, Scp3, Scp4, Smc1, Smc2, Smc3, Smc4 chip side
SGCN, SGLD terminal
SGN_DAT1, SGN_DAT2 data signal
SGN_CLK1, SGN_CLK2 clock signal
SGN_CTL1, SGN_CTL1 control signal
SGN_P1 internal interface path (internal transmission path)
SGN_P2 external interface path (external transmission path)
SGW signal line
Sip1, Sip2, Sip3, Sip4 substrate side
SR1, SR2, insulation film
SRk1, SRk2 opening
TCS bonding pad (bonding lead, semiconductor chip connection terminal)
THW, TW through-hole wiring
TM2 plurality of terminals
UF underfill resin (insulation resin)
VA via
VDDH, VDDL, VDDQ power potential
VDH_P, VDL_P, VDQ_P power potential supply path
VHCN, VLCN, VQCN terminal (power potential supply terminal)
VHLD, VLLD, VQLD terminal (land, power potential supply land)
VHP, VQP power plane (power conductor pattern)
VHW, VQW power line (wiring)
VQP power plane (power conductor pattern)
VSS reference potential
VSS_P reference potential supply path
WH width
WL1 wiring layer
WL1, WL2, WL3, WL4, WL5, WL6, WL7, WL8, WL9, WL10 wiring layer
WH, WQ width
WR wiring

The invention claimed is:

1. An electronic device comprising:
a first wiring substrate which includes a first surface and a second surface positioned on an opposite side of the first surface; and
a semiconductor device which includes a second wiring substrate which includes a third surface, a fourth surface positioned on an opposite side of the third surface and a plurality of lands formed on the fourth surface, a plurality of first semiconductor chips each mounted on the third surface of the second wiring substrate, and a second semiconductor chip which is mounted side by side with the plurality of first semiconductor chips on the third surface of the second wiring substrate and controls each of the plurality of first semiconductor chips, the semiconductor device being mounted on the first surface of the first wiring substrate,
wherein a peripheral portion of the second wiring substrate includes a first substrate side and a second substrate side which is positioned on an opposite side of the first substrate side when seen in a plan view,
a peripheral portion of the second semiconductor chip includes a first chip side and a second chip side which is positioned on an opposite side of the first chip side when seen in plan view,
the second semiconductor chip is mounted such that the first chip side of the second semiconductor chip is parallel to the first substrate side of the second wiring substrate,
each of the plurality of first semiconductor chips is mounted between an extension line of the first chip side of the second semiconductor chip and the first substrate side,
the first wiring substrate includes a first power line which supplies a first power potential to each of the plurality of first semiconductor chips and a second power line which supplies a second power potential larger than the first power potential to the second semiconductor chip,
a width of the second power line is larger than a width of the first power line,
the second power line intersects the first substrate side of the second wiring substrate and extends from beside the first substrate side of the second wiring substrate toward a region which overlaps the second semiconductor chip when seen in plan view, and
the second power line is extended straight from the first chip side of the second semiconductor chip to the first substrate side of the second wiring substrate.

2. The electronic device according to claim 1,
wherein the second semiconductor chip includes a plurality of first interface electrodes which are paths for transmitting an electrical signal between the second semiconductor chip and the plurality of first semiconductor chips, and
the plurality of first interface electrodes is disposed along the first chip side.

3. The electronic device according to claim 1,
wherein the second power line intersects a line which overlaps the first chip side of the second semiconductor chip and extends from beside the first substrate side of the second wiring substrate toward a line which overlaps the second chip side of the second semiconductor chip when seen in plan view.

4. The electronic device according to claim 1,
wherein the first wiring substrate includes a plurality of the first power lines which are provided both neighboring sides of the second power line, and
the plurality of first power lines intersects the first substrate side of the second wiring substrate and extend from beside the first substrate side of the second wiring substrate along the second power line when seen in plan view.

5. The electronic device according to claim 4,
wherein each of the plurality of first power lines extends from beside the first substrate side of the second wiring substrate to a region which overlaps each of the plurality of first semiconductor chips when seen in plan view, and
the second power line is disposed between the regions which overlap each of the plurality of first semiconductor chips when seen in plan view.

6. The electronic device according to claim 1,
wherein the plurality of lands includes:
a first signal terminal which is electrically connected with the plurality of first semiconductor chips without passing through the second semiconductor chip, and a plurality of second signal terminals which are electrically connected with the plurality of first semiconductor chips through the second semiconductor chip, and the number of the first signal terminals is smaller than the number of the second signal terminals.

7. The electronic device according to claim 1, wherein the peripheral portion of the second wiring substrate includes a third substrate side which intersects the first substrate side and the second substrate side and a fourth substrate side which is positioned on an opposite side of the third substrate side when seen in plan view, a plurality of capacitors which are electrically connected with the plurality of first semiconductor chips are mounted on the third surface of the second wiring substrate, the peripheral portion of the second semiconductor chip includes a third chip side which intersects the first chip side and the second chip side and a fourth chip side which is positioned on an opposite side of the third chip side when seen in plan view, and the plurality of capacitors is mounted between the third substrate side and the third chip side of the second semiconductor chip and between the fourth substrate side and the fourth chip side of the second semiconductor chip when seen in plan view.

8. The electronic device according to claim 1, wherein the semiconductor device includes a plurality of third semiconductor chips each mounted on the third surface of the second wiring substrate and controlled by the second semiconductor chip, and the plurality of third semiconductor chips is are mounted between the plurality of first semiconductor chips and the first substrate side when seen in plan view.

9. The electronic device according to claim 1, wherein the semiconductor device includes a plurality of third semiconductor chips each mounted on the third surface of the second wiring substrate and controlled by the second semiconductor chip, the peripheral portion of the second wiring substrate includes a third substrate side which intersects the first substrate side and the second substrate side and a fourth substrate side which is positioned on an opposite side of the third substrate side when seen in plan view, the peripheral portion of the second semiconductor chip includes a third chip side which intersects the first chip side and the second chip side and a fourth chip side which is positioned on an opposite side of the third chip side when seen in plan view, and the plurality of third semiconductor chips is mounted between the third substrate side and the third chip side of the second semiconductor chip and between the fourth substrate side and the fourth chip side of the second semiconductor chip when seen in plan view.

10. The electronic device according to claim 9, wherein a plurality of capacitors which is electrically connected with the plurality of first semiconductor chips is mounted on the third surface of the second wiring substrate, and the plurality of capacitors is mounted between the second substrate side and the plurality of third semiconductor chips when seen in plan view.

11. The electronic device according to claim 1, wherein a power supply device which supplies the second power potential is mounted on the first surface of the first wiring substrate, and the power supply device is mounted on an extension line of the second power line.

12. The electronic device according to claim 1, wherein the second wiring substrate includes a first power conductor pattern which is formed on the fourth surface and supplies the first power potential to each of the plurality of first semiconductor chips and a second power conductor pattern which is formed on the fourth surface and supplies the second power potential to the second semiconductor chip, a width of the second power conductor pattern is larger than a width of the first power conductor pattern, and the second power conductor pattern extends from beside the first substrate side of the second wiring substrate toward the region which overlaps the second semiconductor chip when seen in plan view.

13. The electronic device according to claim 1, wherein the fourth surface of the second wiring substrate includes a first region which is provided between the first substrate side and a line which overlaps the extension line of the first chip side and a second region which is provided between the second substrate side and the line which overlaps the extension line of the first chip side, the plurality of lands includes a plurality of first power lands which supply the first power potential to each of the plurality of first semiconductor chips, a plurality of second power lands which supply the second power potential larger than the first power potential to the second semiconductor chip, and a plurality of signal lands which transmit and receive an electrical signal to and from the second semiconductor chip, and in the second region, the number of the plurality of signal lands is larger than the total number of the plurality of first power lands and the plurality of second power lands.

14. The electronic device according to claim 1, wherein one or more of the plurality of semiconductor chips are mounted on the third surface of the second wiring substrate with a third wiring substrate interposed therebetween.

15. The electronic device according to claim 1, wherein, in the plan view, the second power line is extended between the first semiconductor chips and is parallel to the first power supply line.

16. The electronic device according to claim 1, wherein, in a direction in which the second power line is extended from the first chip side to the first substrate side, the second semiconductor chip is overlapped with a part of one of the first semiconductor chips, and wherein, the part of the one of the first semiconductor chips comprises a direct connection to the first power supply line.

17. A semiconductor device comprising:

a wiring substrate which includes a first surface, a second surface positioned on an opposite side of the first surface, and a plurality of lands formed on the second surface;

a plurality of first semiconductor chips each mounted on the first surface of the wiring substrate; and a second semiconductor chip which is mounted side by side with the plurality of first semiconductor chips on the first surface of the wiring substrate and controls each of the plurality of first semiconductor chips, wherein a peripheral portion of the wiring substrate includes a first substrate side and a second substrate side which is positioned on an opposite side of the first substrate side when seen in a plan view,
a peripheral portion of the second semiconductor chip includes a first chip side and a second chip side which is positioned on an opposite side of the first chip side when seen in plan view,
the second semiconductor chip is mounted such that the first chip side of the second semiconductor chip is parallel to the first substrate side of the wiring substrate,
each of the plurality of first semiconductor chips is mounted between an extension line of the first chip side of the second semiconductor chip and the first substrate side,
the wiring substrate includes a first power conductor pattern which is formed on the second surface and supplies a first power potential to each of the plurality of first semiconductor chips and a second power conductor pattern which is formed on the second surface and supplies a second power potential larger than the first power potential to the second semiconductor chip,
a width of the second power conductor pattern is larger than a width of the first power conductor pattern,
the second power conductor pattern extends from include the first substrate side of the wiring substrate toward a region which overlaps the second semiconductor chip when seen in plan view, and
the second power conductor pattern is extended straight from the first chip side of the second semiconductor chip to the first substrate side of the wiring substrate.

18. A semiconductor device comprising:
a wiring substrate which includes a first surface, a second surface positioned on an opposite side of the first surface, and a plurality of lands formed on the second surface;
a plurality of first semiconductor chips each mounted on the first surface of the wiring substrate; and
a second semiconductor chip which is mounted side by side with the plurality of first semiconductor chips on the first surface of the wiring substrate and controls each of the plurality of first semiconductor chips,
wherein a peripheral portion of the wiring substrate includes a first substrate side and a second substrate side which is positioned on an opposite side of the first substrate side when seen in a plan view,
a peripheral portion of the second semiconductor chip includes a first chip side and a second chip side which is positioned on an opposite side of the first chip side when seen in plan view,
the second semiconductor chip is mounted such that the first chip side of the second semiconductor chip is parallel to the first substrate side of the wiring substrate,
each of the plurality of first semiconductor chips is mounted between an extension line of the first chip side of the second semiconductor chip and the first substrate side,
the second surface of the wiring substrate includes a first region which is provided between the first substrate side and a line which overlaps the extension line of the first chip side and a second region which is provided between the second substrate side and the line which overlaps the extension line of the first chip side,
the plurality of lands includes a plurality of first power lands which supply a first power potential to each of the plurality of first semiconductor chips, a plurality of second power lands which supply a second power potential larger than the first power potential to the second semiconductor chip, and a plurality of signal lands which transmit and receive an electrical signal to and from the second semiconductor chip, and
in the second region, the number of the plurality of signal lands is larger than the total number of the plurality of first power lands and the plurality of second power lands, and
the plurality of first power lands is extended in a line straight from the first chip side of the second semiconductor chip to the first substrate side of the wiring substrate.

* * * * *